United States Patent [19]

Kasagi

[11] Patent Number: 5,351,082
[45] Date of Patent: Sep. 27, 1994

[54] SIGNAL-CONVERTING DEVICE

[75] Inventor: Yoshitaka Kasagi, Yokohama, Japan

[73] Assignee: Kabushiki Kaisha Toshiba, Kawasaki, Japan

[21] Appl. No.: 58,036

[22] Filed: May 7, 1993

Related U.S. Application Data

[63] Continuation of Ser. No. 676,352, Mar. 28, 1991, abandoned.

[30] Foreign Application Priority Data

Mar. 30, 1990 [JP] Japan ................... 2-81345

[51] Int. Cl.⁵ .................... H04N 3/14; H04N 5/335
[52] U.S. Cl. .................... 348/294; 348/297; 348/298; 348/302; 348/319
[58] Field of Search ............... 358/213.11, 213.13, 358/213.25, 213.26, 213.23; 257/231, 232, 236, 241, 249; 348/294-311

[56] References Cited

U.S. PATENT DOCUMENTS

| | | | |
|---|---|---|---|
| 4,002,824 | 1/1977 | Petrocelli et al. | 358/213.13 |
| 4,085,456 | 4/1978 | Tompsett | 365/114 |
| 4,117,347 | 9/1978 | Hornak et al. | 357/24 |
| 4,555,770 | 11/1985 | Sage | 364/819 |
| 4,737,841 | 4/1988 | Kinoshita et al. | 358/44 |
| 4,791,308 | 12/1988 | Nagashima | 358/213.26 |
| 4,866,496 | 9/1989 | Audier | 357/24 |
| 4,963,981 | 10/1990 | Todaka et al. | 358/213.13 |

FOREIGN PATENT DOCUMENTS

| | | | |
|---|---|---|---|
| 0264726 | 4/1988 | European Pat. Off. | H04N 5/262 |
| 0286122 | 10/1988 | European Pat. Off. | H04N 5/335 |
| 0337424 | 10/1989 | European Pat. Off. | H04N 3/14 |
| 3220667 | 12/1983 | Fed. Rep. of Germany | H04N 1/028 |
| 62-108378 | 5/1987 | Japan | G06F 15/66 |
| 1319375 | 12/1989 | Japan | H04N 5/335 |

*Primary Examiner*—Michael T. Razavi
*Assistant Examiner*—Bipin Shalwala
*Attorney, Agent, or Firm*—Cushman, Darby & Cushman

[57] ABSTRACT

A signal converting device receives input data obtained by continuously scanning data for a predetermined period along one of i axes X1, X2 ... Xi of an imaginary i-dimensional spatial coordinate system, where the data exists in given space-time regions a1, a2 ... ai extending along these axes. The device processes the data in a given sub time-space region Nj included in any time-space region aj (where j=1, 2 ... i) at a magnification specific to a given sub time-space region Mj ($1 \leq j \leq i$). As a result, the device outputs new data existing in the sub time-space region Mj. The region Mj is identical to the sub time-space region Nj, or exists outside the time-space region aj. The device has an input data item converter that converts the input data items so that the product of output data items existing in small regions Lm of ordinates representing spatial positions in the sub time-space region Mj extending along at least one axis Xj is nearly equal to the product of the corresponding input data items existing in small regions Ln or ordinates representing spatial positions or is nearly equal to K times a given constant other than zero, and for converting data items existing in one axis while data items on any other axis remain in a fixed state.

4 Claims, 42 Drawing Sheets

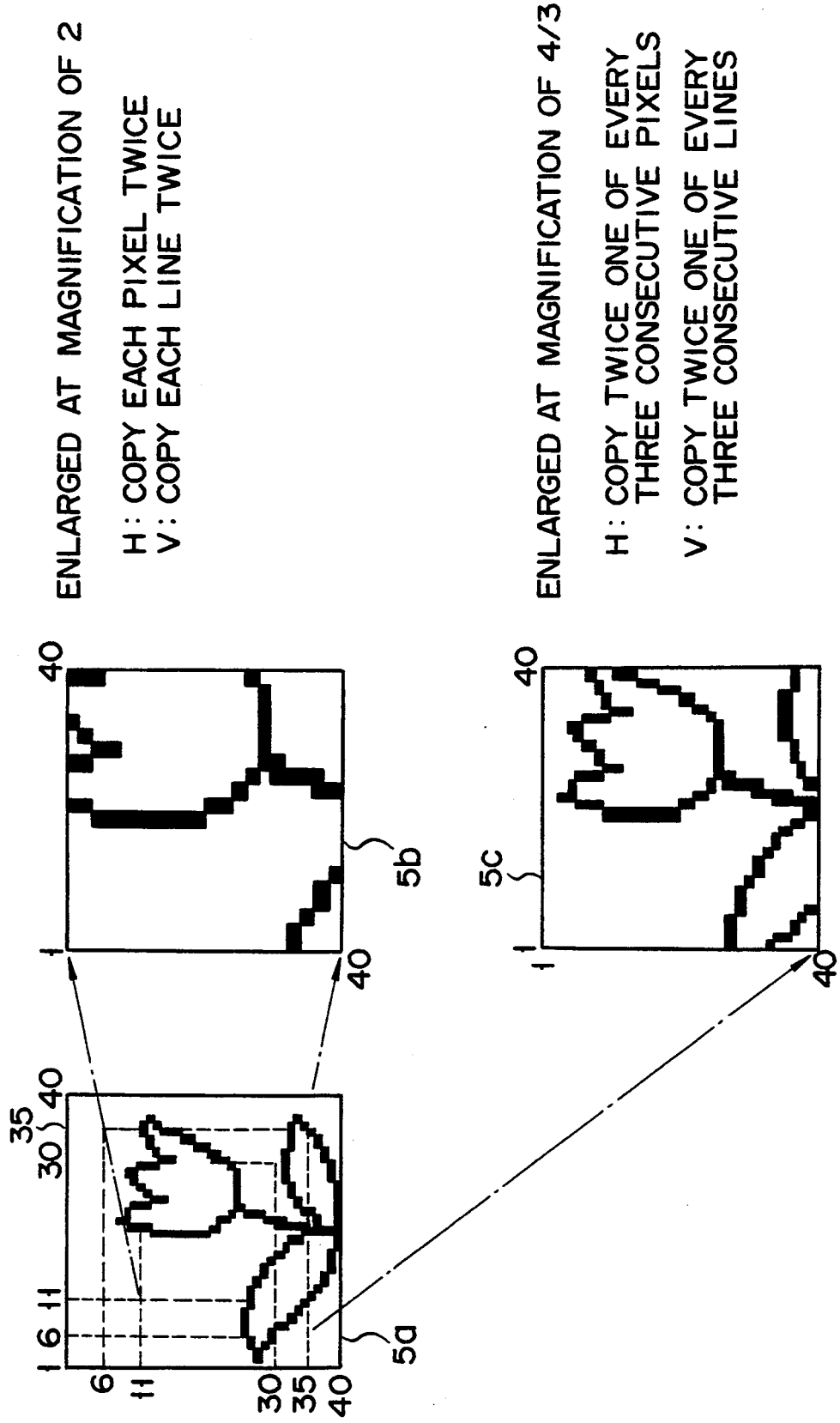
F I G. 5

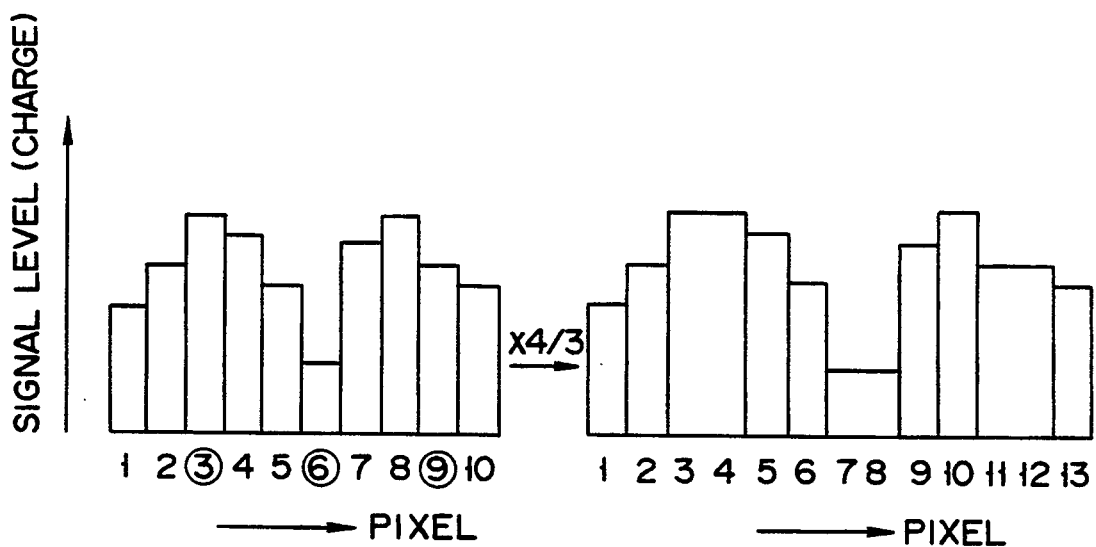
F I G. 6A     F I G. 6B
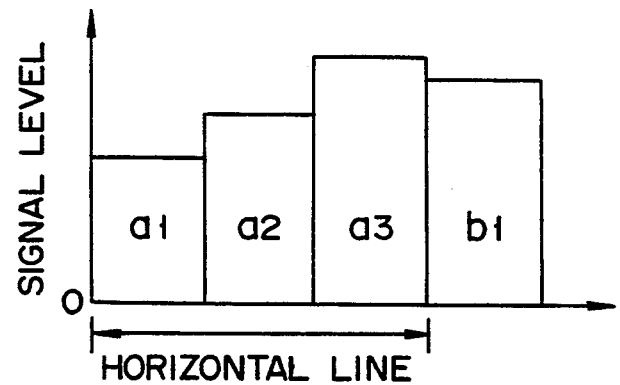
F I G. 7A
F I G. 7B

F I G. 7C
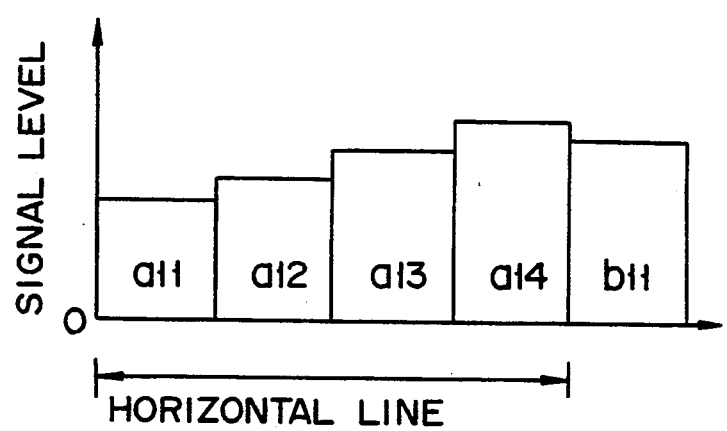
F I G. 7D
F I G. 7E
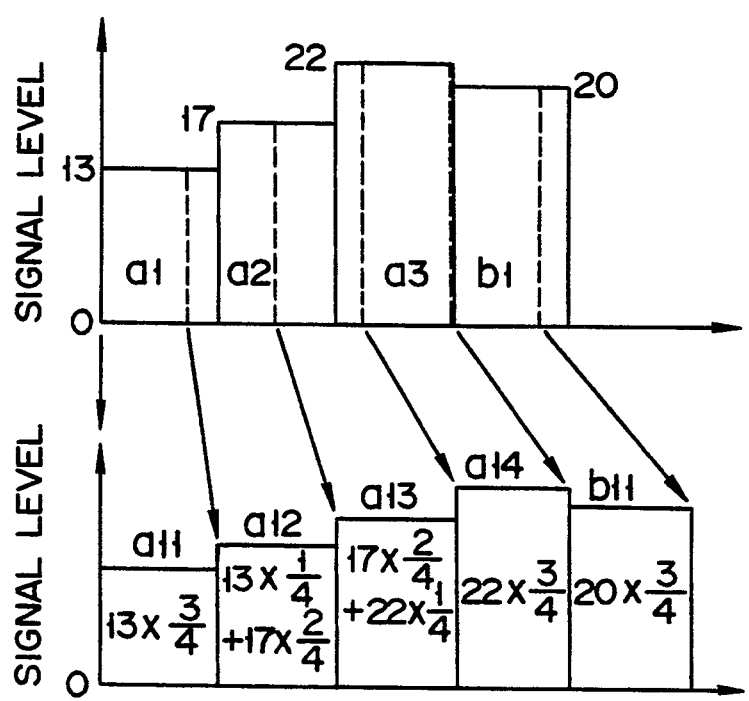

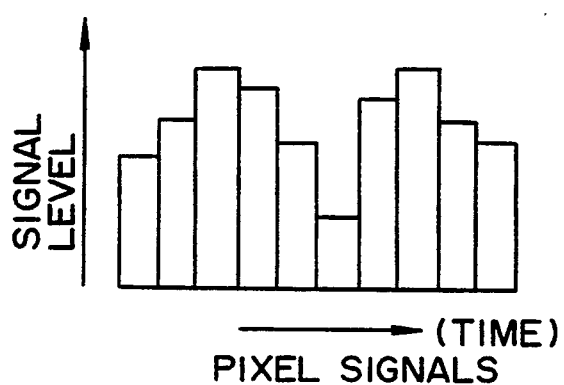
F I G. 8A
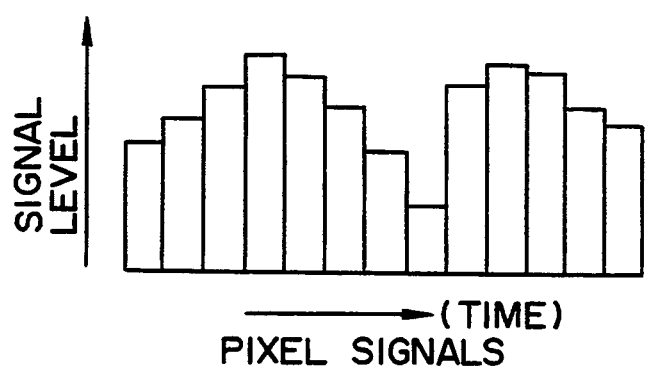
F I G. 8B
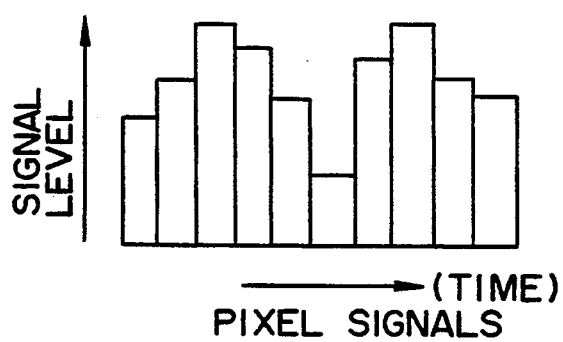
F I G. 8C
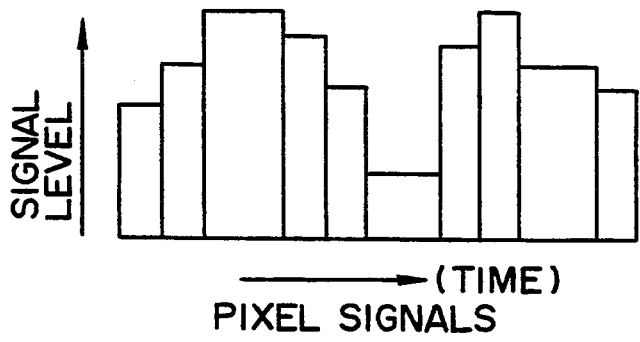
F I G. 8D

FIG. 11

| | |
|---|---|
| RD.X | X-COORDINATE OF ORIGINAL PIXEL BEING PROCESSED |
| RD.Y | Y-COORDINATE OF ORIGINAL PIXEL BEING PROCESSED |
| WT.X | X-COORDINATE OF ENLARGED PIXEL BEING PROCESSED |
| WT.Y | Y-COORDINATE OF ENLARGED PIXEL BEING PROCESSED |
| RXS | X-COORDINATE OF ZOOMING-START POSITION |
| RYS | Y-COORDINATE OF ZOOMING-START POSITION |
| RXE | X-COORDINATE OF ZOOMING-END POSITION |
| RYE | Y-COORDINATE OF ZOOMING-END POSITION |
| WXS | X-COORDINATE OF START POSITION OF ZOOMED IMAGE |
| WYS | Y-COORDINATE OF START POSITION OF ZOOMED IMAGE |
| WXE | X-COORDINATE OF END POSITION OF ZOOMED IMAGE |
| WYE | Y-COORDINATE OF END POSITION OF ZOOMED IMAGE |
| NX | TIMES THE X-DIRECTION PROCESSING IS REPEATED |
| NY | TIMES THE Y-DIRECTION PROCESSING IS REPEATED |
| a(1)=3/4 | COEFFICIENT DEPENDING ON THE TIMES THE ZOOMING IS REPEATED (MAGNIFICATION OF 4/3) |
| a(2)=2/4 | COEFFICIENT DEPENDING ON THE TIMES THE ZOOMING IS REPEATED (MAGNIFICATION OF 4/3) |
| a(3)=1/4 | COEFFICIENT DEPENDING ON THE TIMES THE ZOOMING IS REPEATED (MAGNIFICATION OF 4/3) |
| b(1)=1/4 | COEFFICIENT DEPENDING ON THE TIMES THE ZOOMING IS REPEATED (MAGNIFICATION OF 4/3) |
| b(2)=2/4 | COEFFICIENT DEPENDING ON THE TIMES THE ZOOMING IS REPEATED (MAGNIFICATION OF 4/3) |
| b(2)=3/4 | COEFFICIENT DEPENDING ON THE TIMES THE ZOOMING IS REPEATED (MAGNIFICATION OF 4/3) |

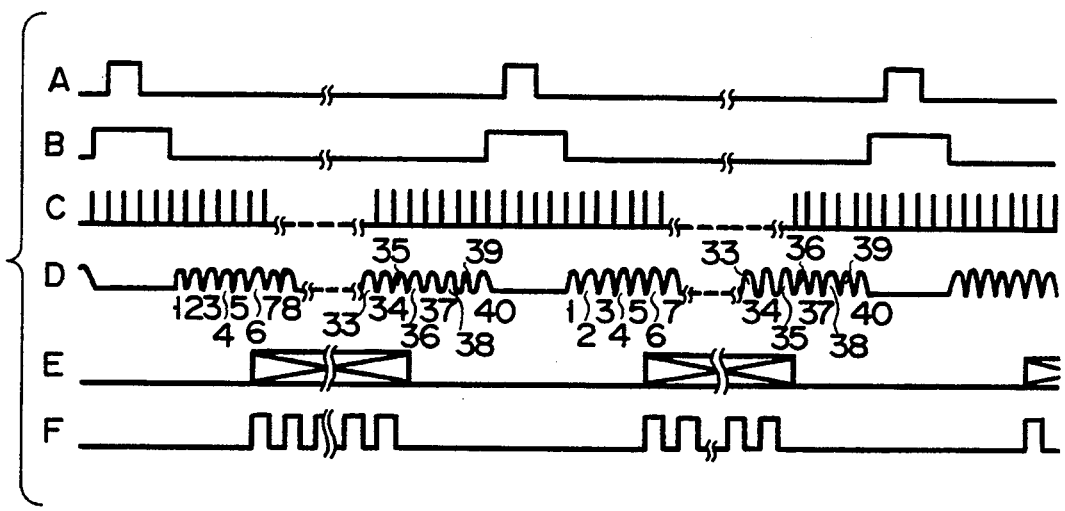
F I G. 20
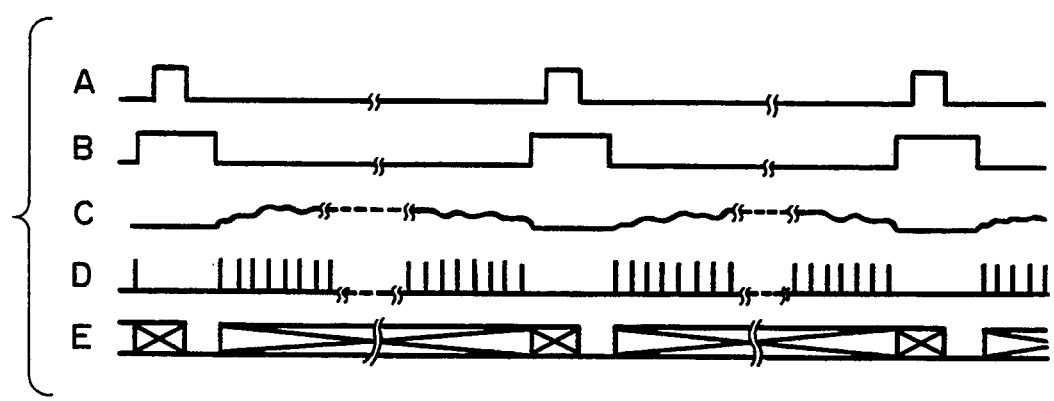
F I G. 21

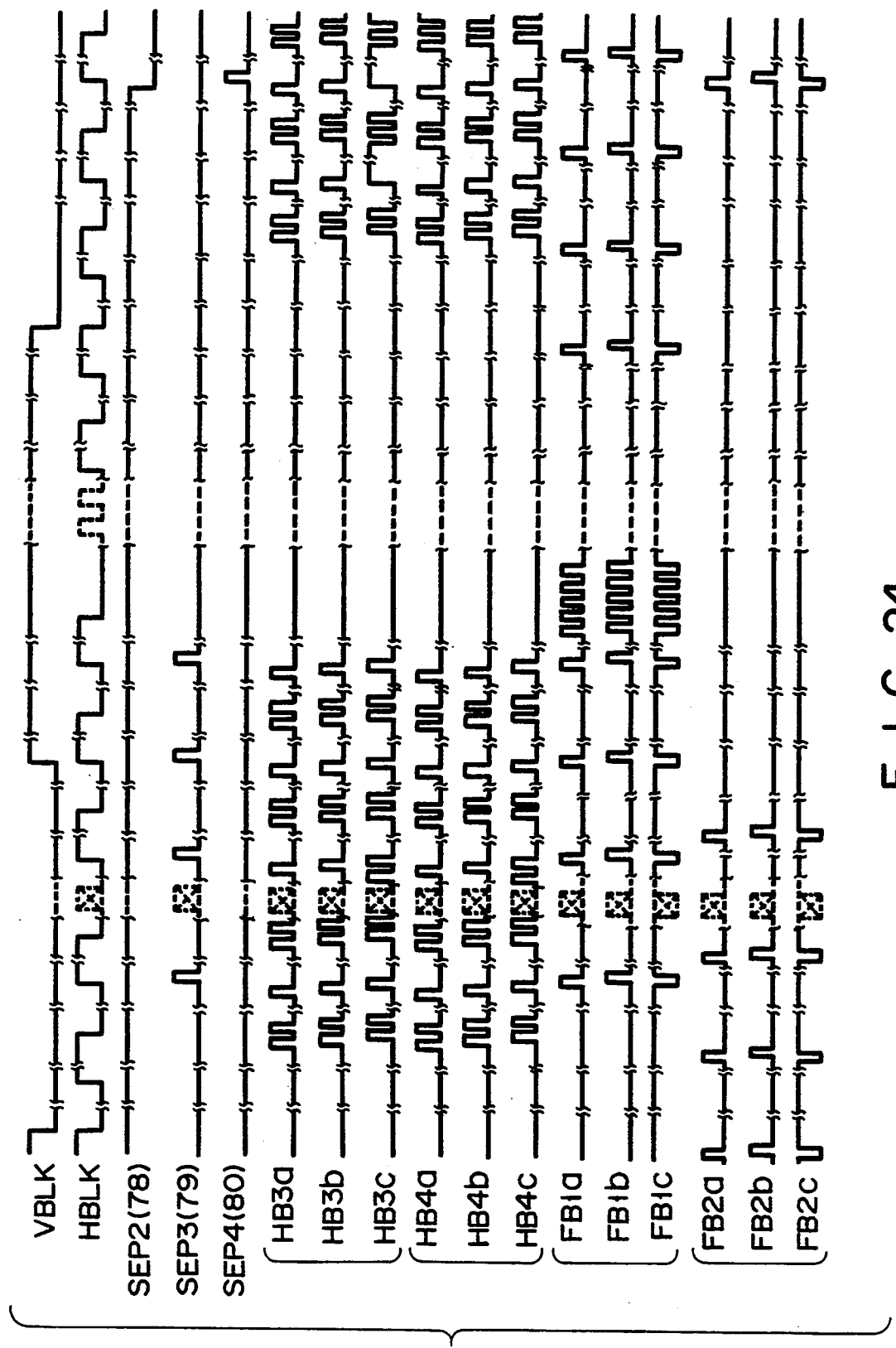
F I G. 24

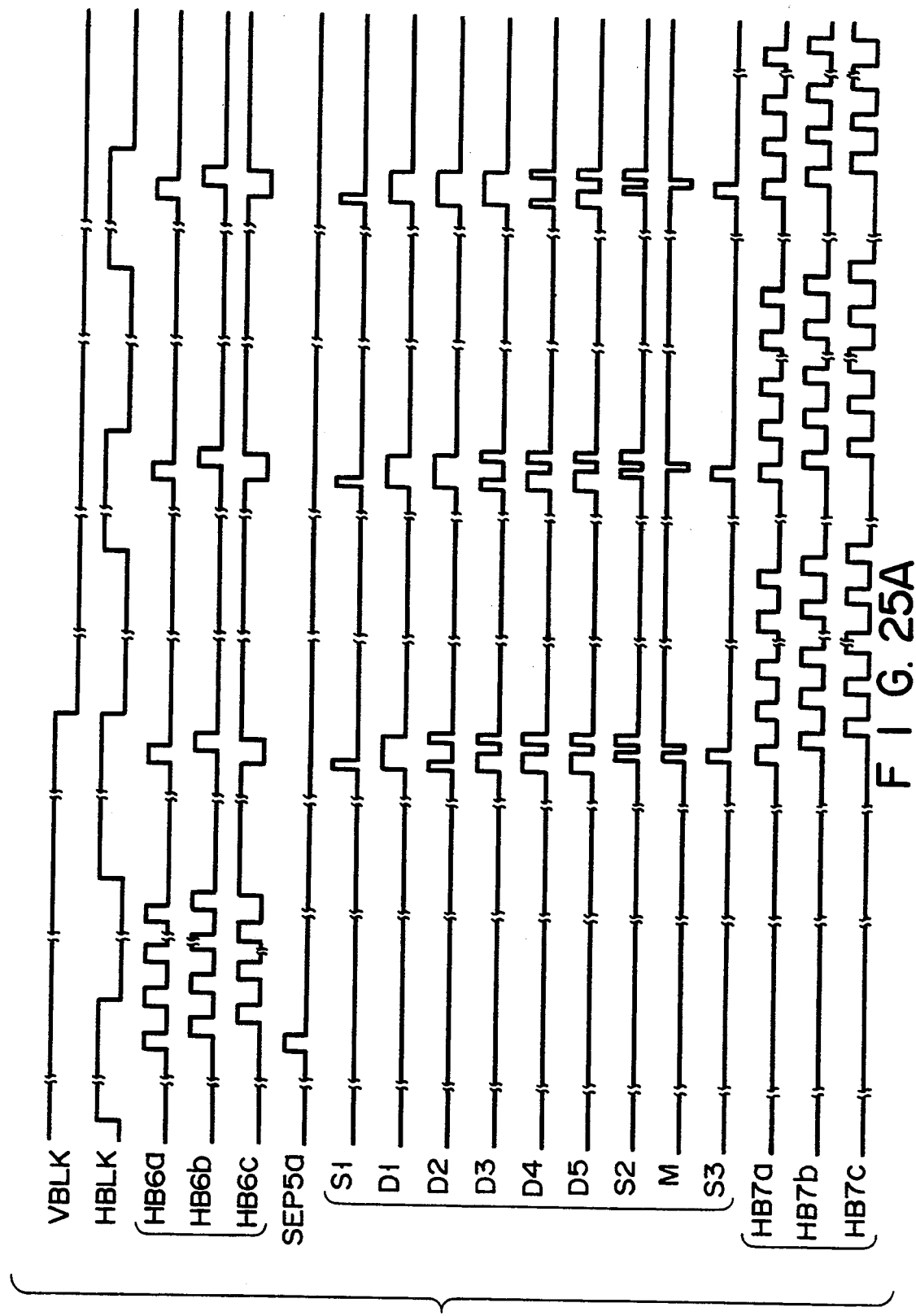

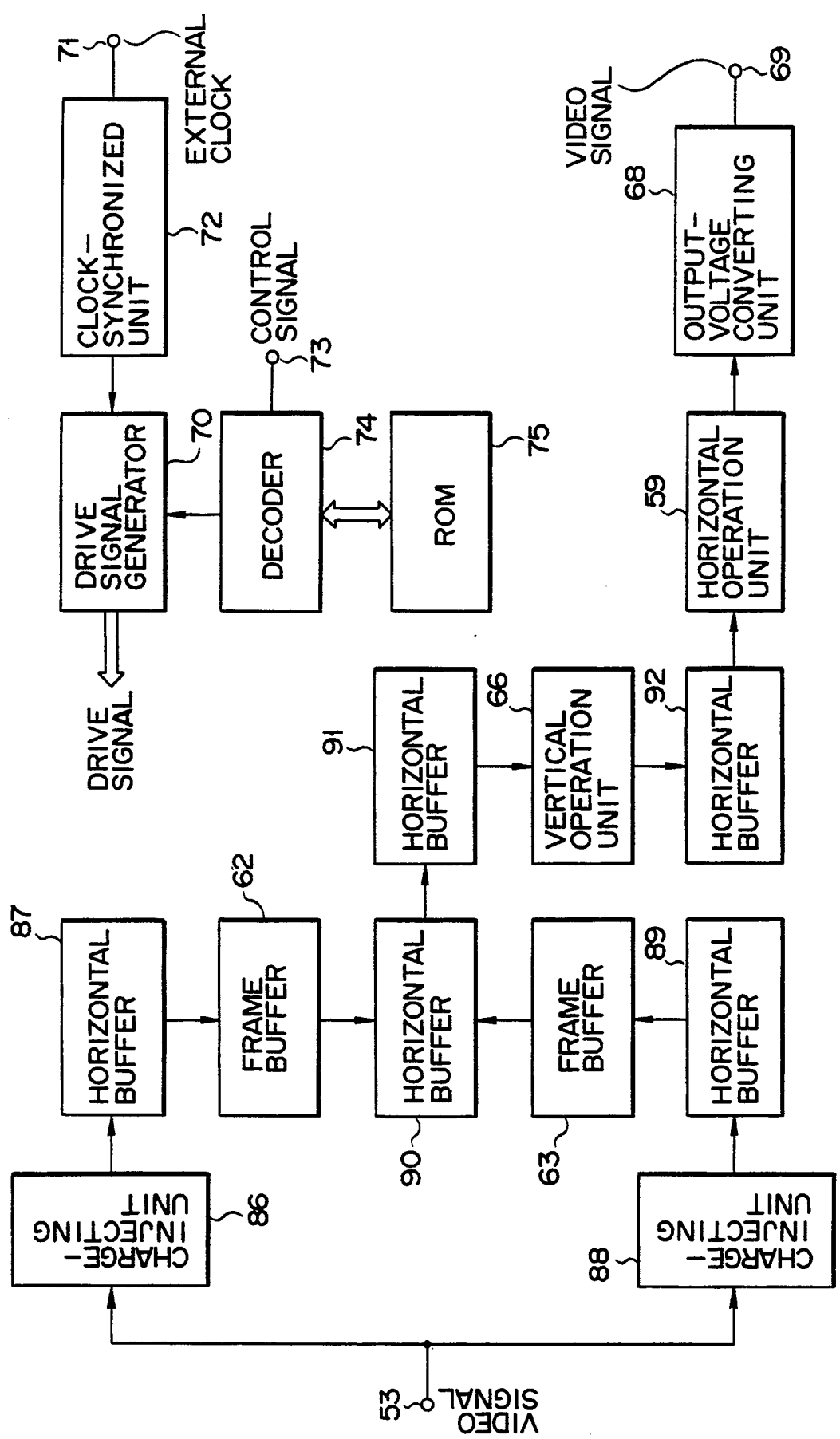
F I G. 27

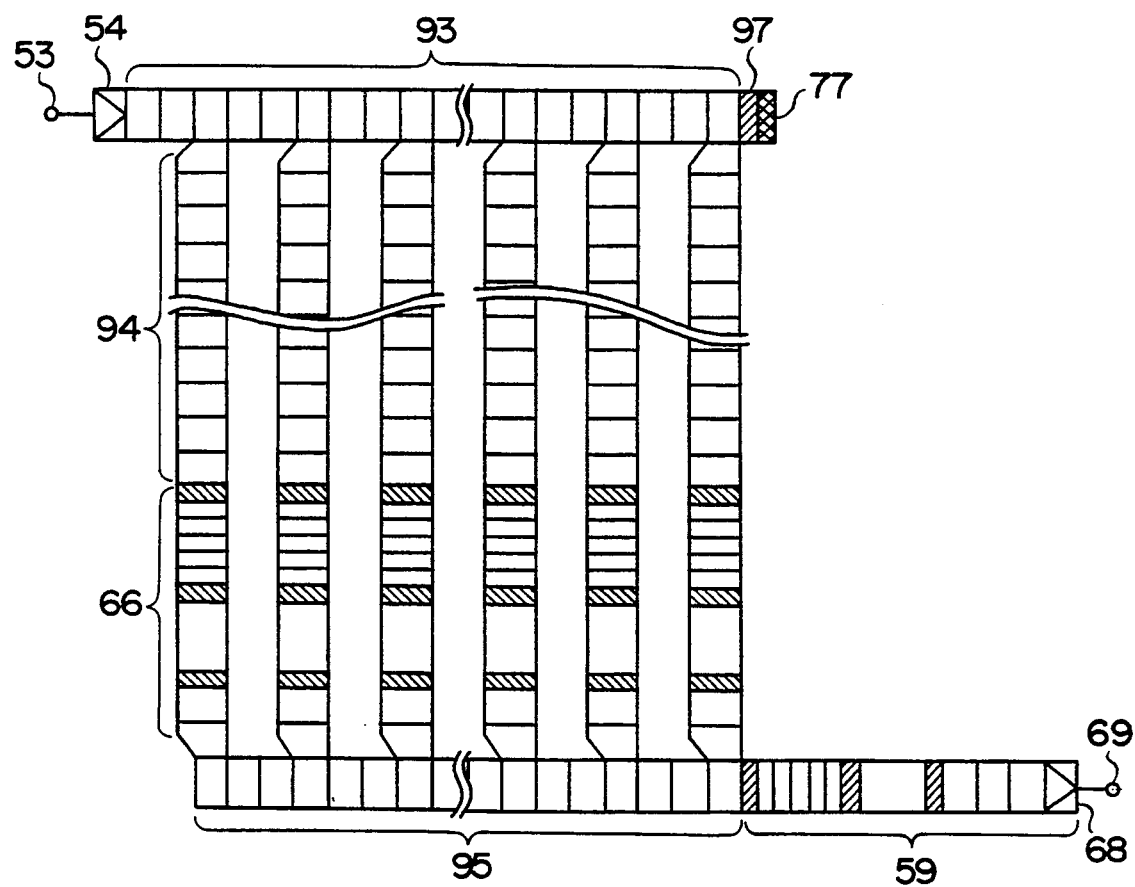
F I G. 30

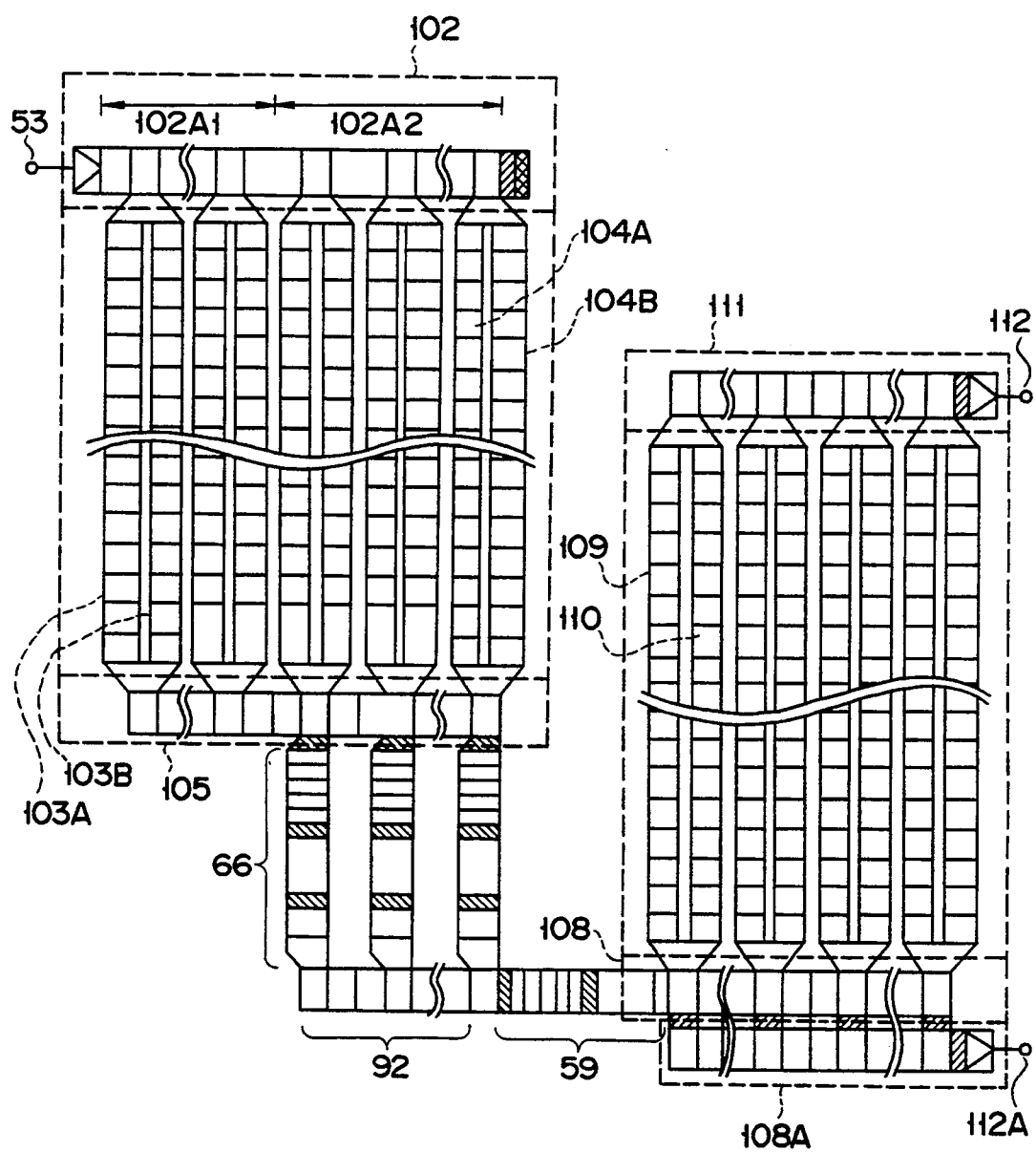
F I G. 36

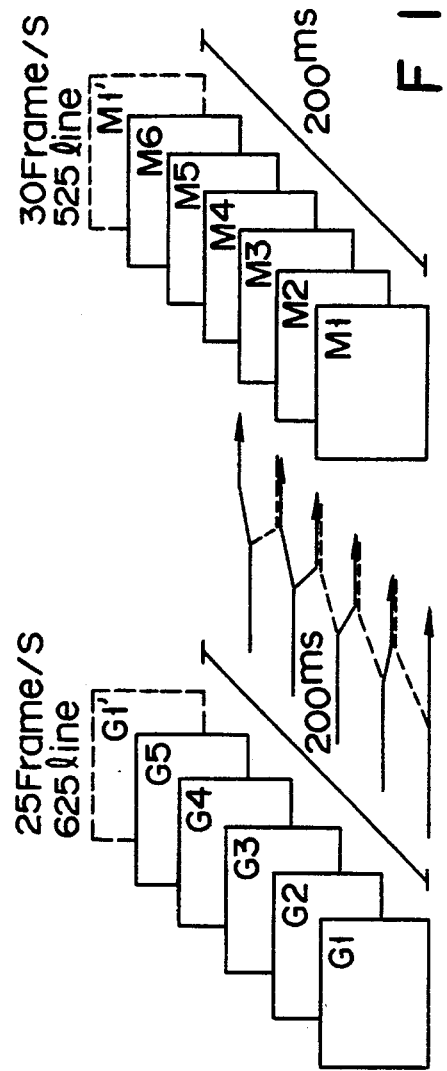
F I G. 38
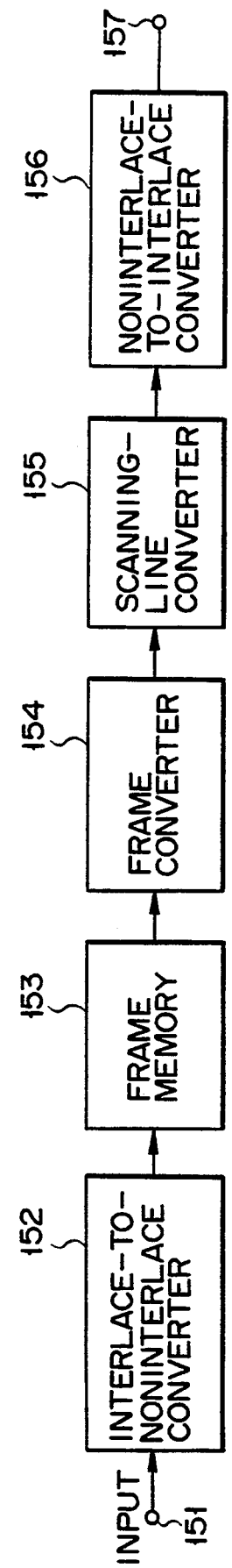
F I G. 39

(r = 25/21)

CONVERSION FROM 625-LINE FRAME TO 525-LINE FRAME

FIG. 41A

CONVERSION FROM 525-LINE FRAME TO 625-LINE FRAME (r=21/25)

FIG. 41B

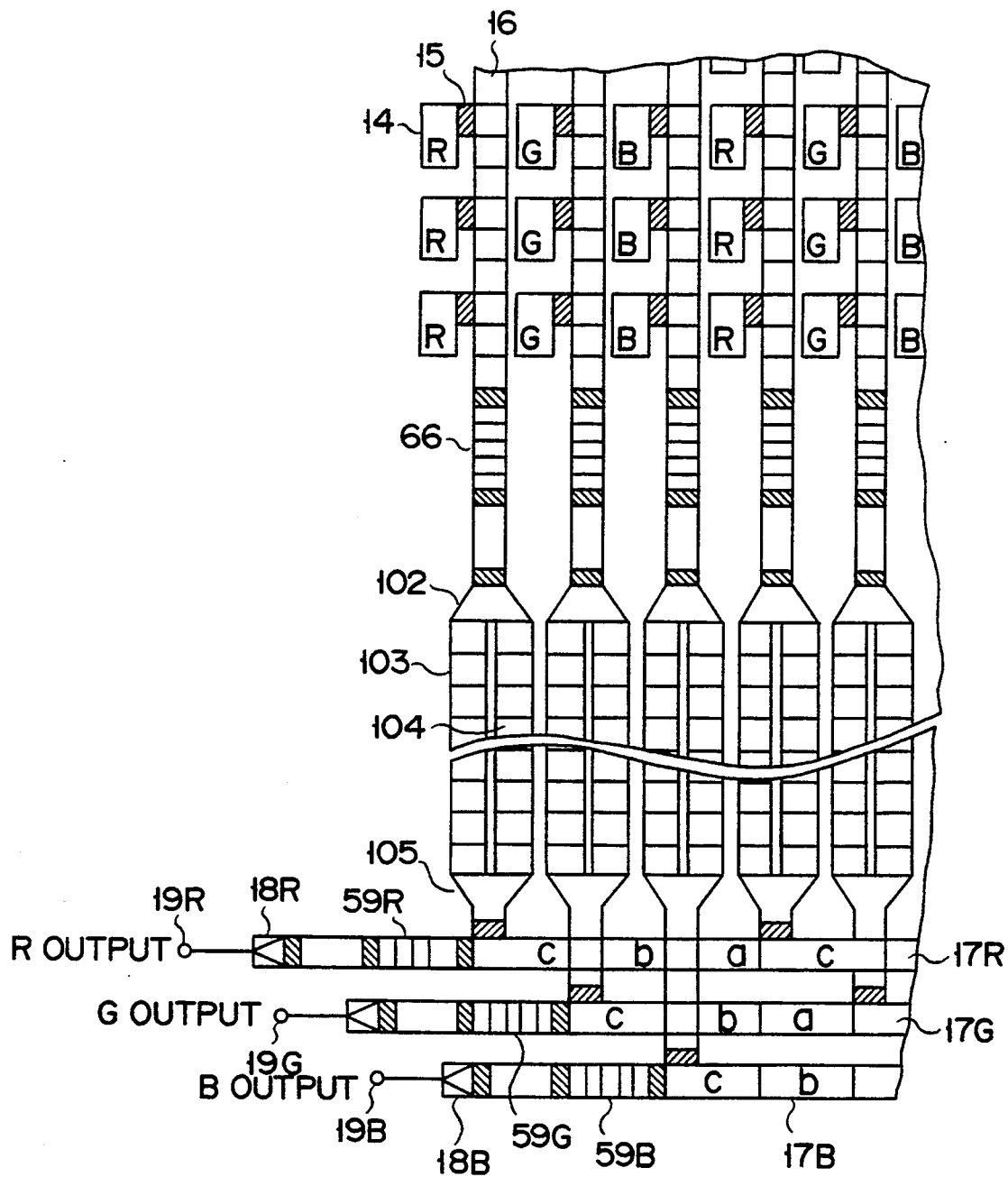
F I G. 44

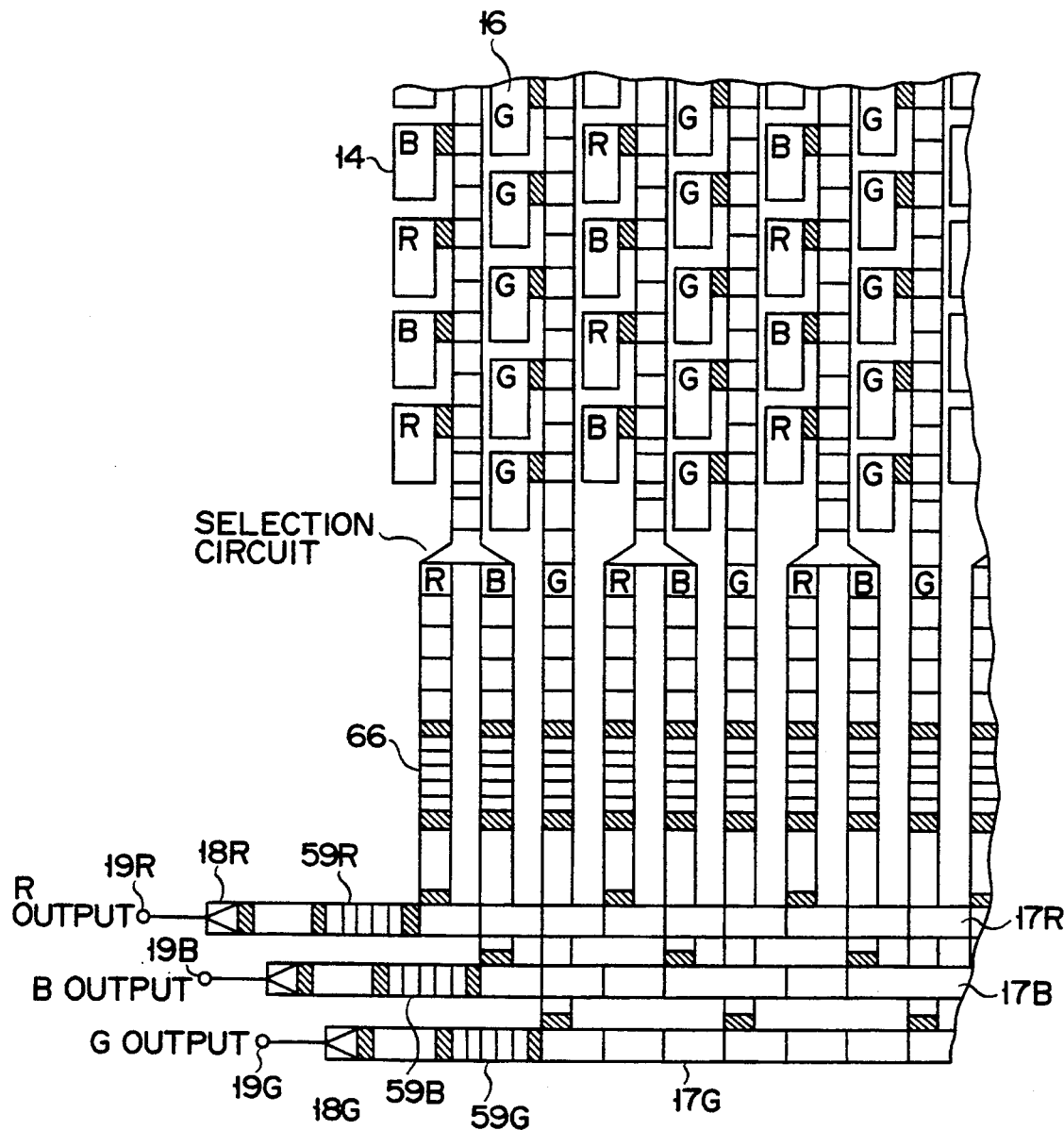
F I G. 45

SIGNAL-CONVERTING DEVICE

This is a continuation of application Ser. No. 07/676,352, filed on Mar. 28, 1991, which was abandoned upon the filing hereof May, 7, 1993.

BACKGROUND OF THE INVENTION

1. Field of the invention

This invention relates to a signal-converting device for converting video signals output by a television camera or an electronic camera, thereby to change the size of the image formed of the video signals. More particularly, the invention relates to a signal-converting device suitable for use in a so-called "electronic zooming" device which processes an input signal to enlarge the image formed by the video signal, or a so-called "picture imposing apparatus" which processes the input video signal to reduce the image formed by the video signal, or a scanning line conversion apparatus which converts a video signal for a specific number of scanning lines to a video signal for a different number of scanning lines.

2. Description of the Related Art

Along with the advance in electronic technology, electronic cameras and video movie cameras (i.e., VTRs each having a built-in camera)—all for home use—are used in increasing numbers. It is demanded that the electronic cameras and the VTRs be modified so that they can be smaller and can be operated more easily. In most video movie cameras, zooming, i.e., one of the functions of the video movie camera, performed by operating a zoom lens. The use of a zoom lens, which is a relatively large component, has been an obstacle to the miniaturization of the video movie camera and the reduction in the weight thereof. Recently, a high-resolution solid-state imaging device has been developed, making it possible to achieve electronic zooming by processing the video signals generated by the imaging device. Hence, the video movie camera need not have a zoom lens, and can therefore be made smaller. A signal-converting device, which processes the video signals output by a solid-state imaging device, thereby to achieve electronic zooming, must be as simple as possible so that the video movie camera can be sold at so low a price that every household can buy it.

The signal-converting device used for achieving electronic zooming has the following problems, however.

First, when the signal-converting device processes the video signals such that the image formed of these signals is enlarged or reduced at a non-integral magnification, each component line of the original image may have a different thickness, depending on its location in the image. In other words, the enlarged or reduced image is noticeably distorted.

Second, the signal-converting device needs to have an A/D converter, a D/A converter and a memory since its main function is to process digital signals. These indispensable components are relatively expensive, and the video movie camera may be too expensive a home-use apparatus.

Further, the signal-converting device must have a circuit which can process the video signals output by the solid-state imaging device at high speed, thus within a limited period of time. This is because the video signals represents an image which is moving. The high-speed signal-processing circuit consumes much electric power.

SUMMARY OF THE INVENTION

The first object of the present invention is to provide a signal-converting device which can process signals, such as TV signals, at high speed in real time, thereby to enlarge or reduce the image formed by time signals by a signal-converting method as simple as the conventional one, such that the image, even if enlarged or reduced at a non-integral magnification, is not distorted at all.

The second object of the present invention is to provide a signal-converting device which has neither an A/D converter nor a D/A converter and is simple in structure, which can yet process video signals such that the image formed of these signals is enlarged or reduced at any magnification desired, and which is suitable for home use.

The third object of the invention is to provide a signal-converting device which can be used not only in home-use apparatuses such as video movie cameras, put also in other various apparatuses, and which can be available at a relatively low price.

In order to achieve these objects, according to the present invention, there is provided a signal-converting device which comprises:

- signal-converting means for converting some of pixel signals forming an image sequentially input at scanning intervals, into new pixel signals the number of which is proportional to a desired magnification at which the image is enlarged or reduced, without changing an energy sum of these pixel signals and without distorting the waveform of the video signal formed of the pixel signals; and
- level-correcting means for correcting level errors in the new pixel signals supplied from the signal-converting device which comprises:
- signal-compensating means for compensating by adding components to the new pixel signals output from the signal-converting means, said components having been lost while the signal-converting means is converting the pixel signals into new pixel signals.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 consists of three diagrams, explaining a method applied in the system of FIG. 1 in order to enlarge an image;

FIG. 6A shows the waveform of an original video signal, and FIG. 6B shows the waveform of a new video signal obtained by performing the method shown in FIG. 5, thereby to enlarge the image represented by the original video signal;

FIGS. 7A to 7E are diagrams explaining the gist of the present invention;

FIGS. 8A to 8D illustrate the waveforms of video signals, explaining the basic concept of the invention;

FIG. 11 is a table of variables, which explains the operation of the zooming system of FIG. 9;

FIGS. 20 to 24, FIGS. 25A and 25B, and FIGS. 26A and 26B are timing charts which explain the operation of the CCD section illustrated in FIG. 19;

FIG. 27 is a block diagram showing another signal-converting device according to the present invention;

FIG. 30 is a schematic plan view of the CCD section of the signal-converting device shown in FIG. 29;

FIGS. 35 and 36 schematically show other two interlace-noninterlace converters, either comprising a CCD;

FIG. 38 is a schematic plan view of a video signal converter;

FIG. 39 is a block diagram showing a system which performs the video signal converter, explained with reference to FIG. 38;

FIGS. 41A and 41B are tables of division coefficients for use in the conversion of scanning lines; and FIGS. 42 to 45 schematically illustrate CCD image sensors having the signal-converting device according to the present invention.

DETAILED DESCRIPTION OF THE PREFERRED EMBODIMENTS

Before describing the gist of thus invention and the embodiments thereof, a conventional electronic zooming system designed for use in a home-use, noninterlaced, monochrome video movie camera, will now be described with reference to FIG. 1 which is a system block diagram illustrating the video movie camera.

Figure 1:
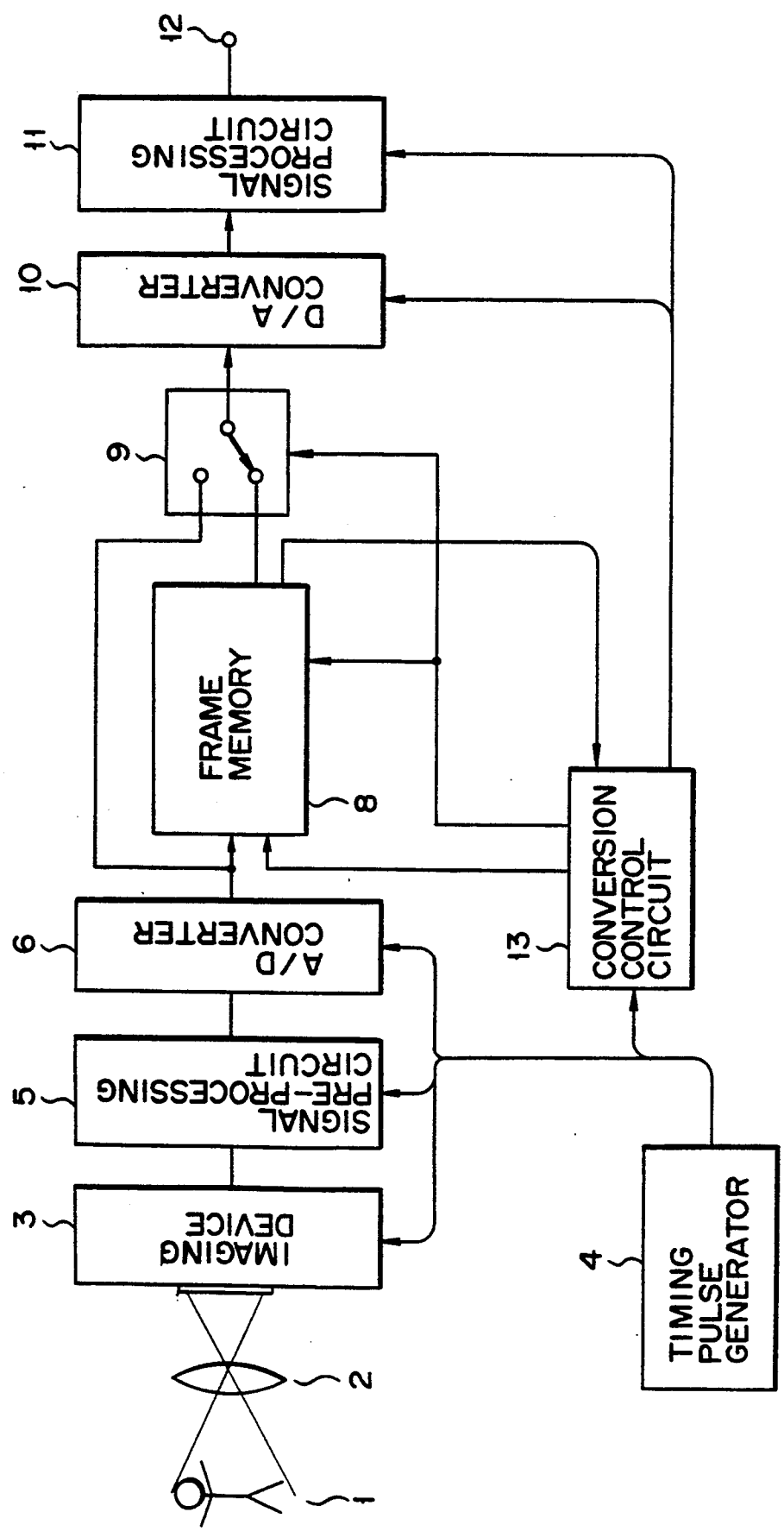
FIG. 1 is a block diagram schematically showing a video movie camera having a conventional electronic zooming system.

As is shown in FIG. 1, the light reflected from an object 1 passes through a lens 2 and is focused on the surface of an imaging device 3 which has a number of photodiodes arranged in rows and columns on its surface. These photodiodes form an electrical charge image which corresponds to the optical image formed on the surface of the imaging device 3. When driven by drive pulses supplied from a timing pulse generator 4, the imaging device 3 outputs a video signal representing the image of the object. The video signal, which is an analog signal, is processed by a signal pre-processing circuit 5 and then is converted into a digital signal by means of an analog-to-digital (A/D) converter 6.

The digital signal, i.e., the output of the A/D converter 6, is supplied to input terminal of a frame memory 8 and also to one of the two input terminals of a switch circuit 9.

To zoom the image electronically, the digital video signal representing the image is written into a frame memory 8. The frame memory 8 is replaced by a field memory if the video movie camera is an interlace type.

If the image need not be zoomed electronically, the digital video signal is input to a digital-to-analog (D/A) converter 10 via the switch circuit 9. Alternatively, the digital video signal is written into the frame memory 8 and read therefrom at ordinary scanning intervals and supplied to the D/A converter 10 through the switch circuit 9. In either case, the D/A converter 10 converts the digital video signal to an analog video signal. The analog video signal is input to a signal processing circuit 11 and output from an output terminal 12.

Before the electronic zooming is explained, the imaging device 3 will be explained in more detail, to facilitate the understanding of the electronic zooming.

Like the imaging element used in most video movie cameras for home use, the imaging device 3 is a CCD image sensor which comprises a number of photodiodes (i.e., photoelectric converting elements) and a charge-coupled device (CCD) and which is designed to convert an optical image into electrical signals. The photodiodes detect the pixels of the optical image of the object and generate electric signals which represent the brightnesses of the pixels.

Figure 2A:
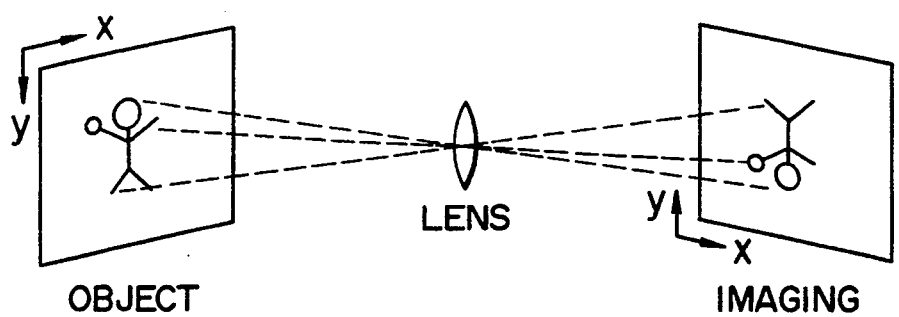
FIGS. 2A to 2C are diagrams representing the image of an object and the optical image of the object.
Figure 2B:
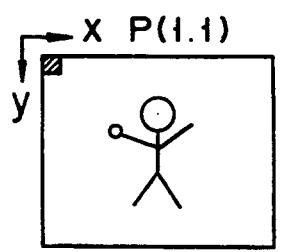
Figure 2C:
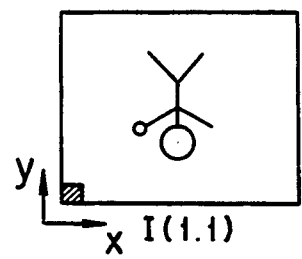

FIGS. 2A to 2C represent the images of an object and the optical images thereof, respectively. As is shown in FIG. 2A, the optical image of the object is inverted on the imaging surface of the imaging device 3. Hence, when the video signal is processed as a television signal in a line-scanning system, horizontal scanning proceeds from the lower-left corner to the upper-right corner of the imaging surface, while vertical scanning proceeds from the lower side to the upper side of the imaging surface, as can be understood from FIG. 2B showing the image displayed on a television screen and FIG. 2C showing the optical image formed on the imaging surface of the device 3.

To correlate the pixels of the image displayed on the television screen with those of the optical image formed on the imaging surface, the upper-right corner of the television screen is used as origin P(1, 1) of the two-dimension coordinate system, whereas the lower-left corner of the imaging surface of the device 3 is used as origin I(1, 1) of the two-dimensional coordinate system. Thus, the pixel at point P(x, y) on the screen can be correlated, in both location and brightness, with the pixel at point I(x, y) on the imaging surface.

Figure 3:
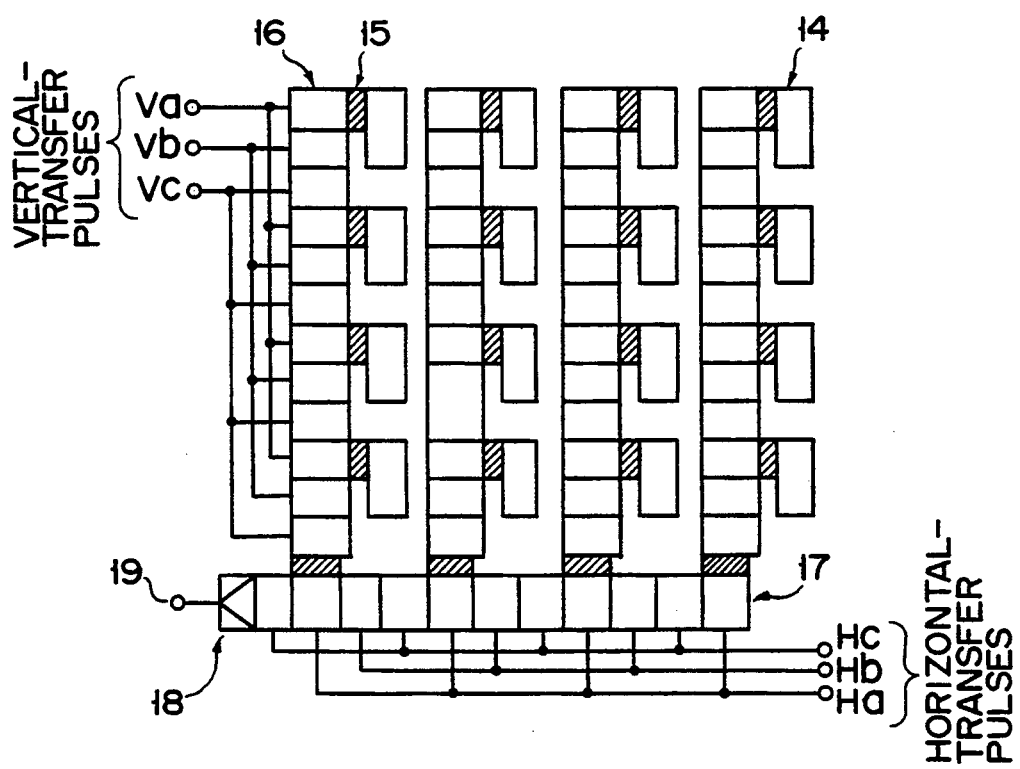
FIG. 3 is a schematic plan view of the CCD image sensor incorporated in the electronic zooming system shown in FIG. 1.

FIG. 3 is a schematic plan view of the CCD image sensor, i.e., the imaging device 3. For the sake of simplicity, this is a 4×4 pixel CCD image sensor for use in a non-interlaced, monochrome video movie camera. More specifically, the CCD image sensor comprises 16 photodiodes 14 arranged in four rows and four columns, 16 transfer gates 15 arranged in four rows and four columns, four vertical transfer CCDs 16, one horizontal transfer CCD 17, a voltage converter 18, and an output terminal 19. The vertical transfer CCDs 16 extend vertically and are arranged parallel to one another. Each vertical transfer CCD 16 has four transfer stages arranged in a vertical line and connected in series, each consisting of three electrodes. The horizontal CCD 17 extends horizontally and has four transfer stages arranged in a horizontal line and connected in series, each consisting of three electrodes. The first electrodes of the transfer stages of each vertical transfer CCD 16 are connected by transfer gates 15 to the photodiodes 14 forming the same column. Four charge-transfer paths are formed beneath the first electrodes of the four transfer stages of the horizontal transfer CCD 17. Similarly, four charge-transfer paths are formed beneath the third electrodes of the lowest stages of the four vertical transfer CCDs 16. The charge-transfer paths of the horizontal transfer CCD 17 are connected to those of the vertical transfer CCDs 16 by four separators, respectively. The left end of the horizontal transfer CCD 17 is connected to the voltage converter 18, which in turn is connected to the output terminal 19. The voltage converter 18 generates a voltage proportional to any electric charge the horizontal CCD 17 receives from any photodiode 14 via any vertical CCD 16.

Figure 4A:
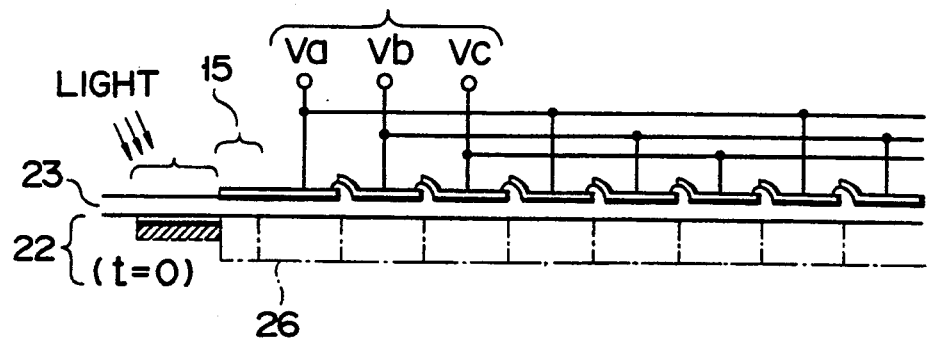
FIGS. 4A to 4C are diagrams explaining how the CCD image sensor shown in FIG. 3 transfers electrical charge.

FIG. 4A is a sectional view showing each of the vertical transfer CCDs 16. As is evident from FIG. 4A, the CCD image sensor comprises a substrate 22, an insulating layer 23 formed on the substrate 22, and series-connected CCD stages. Each CCD stage consists of three electrodes partly overlapping. Hence, all electrodes forming the vertical transfer CCD 16 are electrically connected. When a predetermined drive voltage is applied to any one of these electrode, a charge-transfer path 26 is formed in that portion of the substrate 22 which is right below that electrode.

The transfer gate 15 is formed between the photodiode 14 and the first electrode of any transfer stage. When a voltage, which is higher than that applied to the CCD electrodes, is applied to the gate 15, the transfer gate 15 functions as a charge-transfer path. In most cases, it is through the first electrode of the CCD stage that the higher voltage is applied to the transfer gate 15.

Figure 4B:
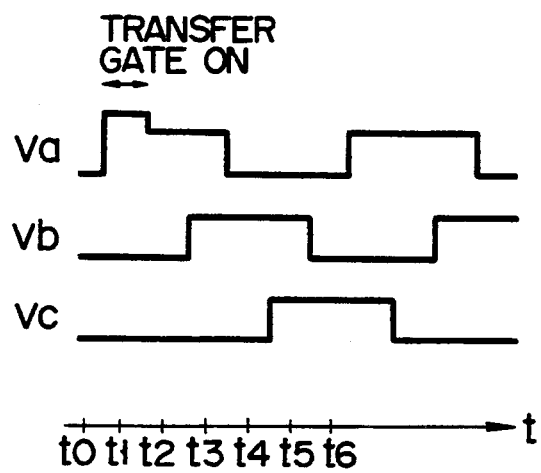
Figure 4C:
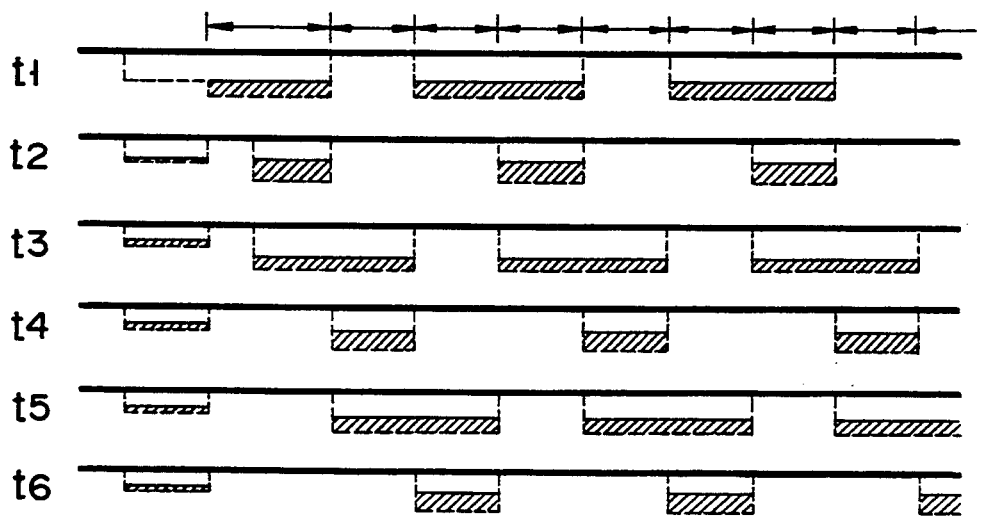

FIG. 4B is a timing chart, illustrating the waveforms of drive signals supplied to the three electrodes of each vertical-transfer CCD stage. FIG. 4C are diagrams, explaining how signal charges output from the photodiodes 14 are transferred through a charge-transfer path 26.

Any photodiode 14 formed on the insulating layer 23 generates an electric charge which is proportional to the produce of the intensity of light applied to it and the time during which the light is applied to it. The electric charge is accumulated in the PN junction formed in the substrate 22 and located below the photodiode 14. Let us assume that at time $t_0$, the photodiode 14 generates an electric charge, whereas no transfer gates 15 accumulate electric charges, as is illustrated in FIG. 4A. At time $t_1$, a high voltage is applied on the first electrode Va of the CCD stage as is shown in FIG. 4B, and the electric charge generated by the photodiode 14 is supplied to the first charge-transfer path 26 of the CCD stage through the transfer gate 15 as is illustrated in FIG. 4C. The distances indicated by arrows in FIG. 4C represent the positions of the electrodes. At time $t_2$, the drive voltage Va falls to a lower value as is shown in FIG. 4B. As a result of this, the transfer gate 15 is closed, whereby the photodiode 14 and the first charge-transfer path 26 are electrically disconnected. At time $t_3$, the predetermined drive voltage is applied to both the first and second electrodes Va and Vb as is illustrated in FIG. 4B. Then, part of the electric charged accumulated in the first charge-transfer path is supplied to the second charge-transfer path, as is evident from FIG. 4C. At time $t_4$, the application of the drive voltage to the first electrode Va is stopped, whereby the charge remaining in the first charge-transfer path is supplied to the second charge-transfer path, as is shown in FIG. 4C. At time $t_5$, the predetermined drive voltage is applied to the third electrode Vc, whereby part of the charge accumulated in the second charge-transfer path is supplied to the third charge-transfer path. At time $t_6$, the application of the drive voltage to the second electrode Vb is stopped. As a result, the charge remaining in the second charge-transfer path is supplied to the third charge-transfer path. Thereafter, the electric charges are transferred in the same way, from one charge-transfer path to another.

The electric signals representing the optical image on the imaging surface of the device 3 are read out in the imaging device 3 in the following manner. First, the signal charges generated by the photodiodes 14 and representing a charge image are simultaneously transferred through the transfer gates 15 to the stages of each vertical transfer CCD during every vertical blanking period, such that these charge signals are not mixed together at all. Next, the signal charges, thus transferred to the lowest stages of the respective vertical transfer CCDs 16, are transferred to the stages of the horizontal transfer CCD 17. Then, in the horizontal transfer CCD 17, the signal charges are transferred, from one state to another, during the horizontal scanning periods, and sequentially supplied to the voltage converter 18. The voltage converter 18 converts each electric charge into a proportional voltage. Thus, the voltages corresponding to the signal charges are supplied from the output terminal 19, in the form of a video signal.

Now it will be explained how the electronic zooming is performed in the video movie camera shown in FIG. 1. To zoom the image of the object 1 electronically, the digital video signal written in the frame memory 8 is input to the conversion control circuit 13, processed thereby, and is written at another address of the frame memory 8. The digital video signal processed by the circuit 13 is read from the frame memory 8 at ordinary television scanning intervals and supplied to the D/A converter 10 through the switch circuit 9. The D/A converter 10 converts the signal into an analog video signal, which is supplied to the signal processing circuit 11. The circuit 11 processes the analog video signal. The analog video signal, thus processed, is output from the output terminal 12. In the meantime, the timing pulse generator 4 generates timing pulses, which are supplied to the imaging device 3, the signal pre-processing circuit 5, the A/D converter 6, and the conversion control circuit 13.

FIG. 5 consists of three diagrams, explaining how to perform the electronic zooming. For the sake of simplification, it is assumed that the image 5a of an object, e.g., a tulip, will be displayed on a TV screen which has 1600 pixels arranged in 40 rows and 40 columns. The image 5a has a size corresponding to the storage capacity of the frame memory 8 (FIG. 1). As has been described, the optical image of the tulip, which is focused by the lens 2 on the imaging surface of the device 3 is up-side down, and right-side left, with respect to the image 5a.

A portion of the image 5a can be enlarged into an image 5b at the magnification of 2, said portion being defined by a square whose upper and lower sides coincide with the 11th and 30th pixel-rows of the TV screen and whose left and right sides coincide with the 11th and 30th columns of the TV screen. In this case, any pixel of the image 5a, that is located at point P(x, y), corresponds to the pixel of the image 5b which is located at point G(x, y). The pixel at the upper-left corner of the image 5a is located at point P(1, 1); the upper-right corner of the image 5a is located at point P(40, 1); the pixel at the lower-left corner of the image 5a is located at point P(1, 40); and the pixel at the lower-right corner of the image 5a is located at point P(40, 40). Similarly, the pixels at the upper-left, upper-right, lower-left, and lower-right corners of the enlarged image 5b are located at points G(1, 1), G(40, 1), G(1, 40), and G(40, 40), respectively. The square defining that portion of the image 5a, which is to be enlarged into the image 5b, has a diagonal which extends from point P(11, 11) to point P(30, 30).

To enlarge the image 5a at the magnification of 2 to the image 5b, it suffices to expand each pixel of the original image 5a double in the horizontal direction and also in the vertical direction. Hence, the four pixels of the image 5b, which are at points G(1, 1), G(2, 1), G(1, 2) and G(2, 2), correspond to the pixel of the original image 5a, which is located at point P(11, 11).

Since video signals are sequentially written into the frame memory 8, they need to be converted, frame by frame, for electronically zooming the image 5a in the way described above. The video signals cannot be converted at so high a speed that all of them are processed within the vertical blanking period. Thus, the frame memory 8 comprises two one-frame memories, more precisely an input memory M1 and an output memory M2, one of which is used as a work area.

The input memory M1 and the output memory M2 have 40 addresses M(1, 1) to M(40, 40) each. Video signals for one frame of the image formed by the imaging device 3 are stored into the input memory M1 during the scanning period of an ordinary TV signal. No signals are input to the memory M1 during the vertical blanking period. Using the vertical blanking period, that portion of the data which is to be converted is transferred within the input memory M1, to the rear storage region of the memory M1, so that any data not converted yet may not be rewritten when the next frame data is stored into the input memory M1. Any item of data is rewritten to new item as soon as it is converted, and the contents of the input memory M1 becomes entirely new at the end of the frame period.

The two data items representing pixels at points P(11, 11) and P(30, 30), which define the diagonal of the square defining that portion of the image 5a which is to be enlarged into the image 5b, are transferred to the input memory M1 and stored at the addresses M1(1, 21) and M1(20, 40). Shortly before the image is displayed on the TV screen, the data item stored at the address M1(1, 21) and representing the pixel at point P(11, 11), i.e., the left end of the upper side of the square, is input to the conversion control circuit 13, written into the output memory M2, and stored at the addresses M2(1, 1) and M2(2, 1) thereof. Next, the data item stored at the addresses M1(2, 21) of the input memory M1 is read out, written into the output memory M2, and stored at the addresses M2(3, 1) and M2(4, 1) thereof. Further, the other data items stored in the input memory M1, which represent the upper side of said square, together with the data items stored at the addresses M1(1, 21) and M1(2, 21), are read out and written into the output memory M2, one after another, in the same way. Hence, the data item stored at the addresses M1(20, 21) of the input memory M1, which represents the right end of the lower side line of the square, is read out, written into the output memory M2, and stored at the addresses M2(39, 1) and M2(40, 1). Next, the data items stored at the addresses M2(1, 1), M2(2, 1), M2(3, 1), M2( 4, 1) . . . M2(39, 1) and M2(40, 1) are copied into the addresses M2(1, 2), M2(2, 2), M2(3, 2), M2(4, 2), . . . M2(39, 2) and M2(40, 2). In other words, the same data is used in any two adjacent lines.

Next, the data item stored at address M1(1, 22), which corresponds to the data item representing the pixel at point P(11, 12), is read from the input memory M1, written into the output memory M2, and stored at the addresses M2(1, 3) and M3(2, 3). Further, the other data items stored in the input memory M1, which represent said horizontal line, together with the data items stored at the addresses M1(1, 22) and M1(2, 22), are read out and written into the output memory M2, one after another, in the same way. Hence, the data item stored at the addresses M1(20, 22) of the input memory M1, which represents the right end of the horizontal line, is read out, written into the output memory M2, and stored at the addresses M2(39, 3) and M2(40, 3). Next, the data items stored at the addresses M2(1, 3), M2(2, 3), M2(3, 3), M2( 4, 3) . . . M2(39, 3) and M2(40, 3) are copied into the addresses M2(1, 4), M2(2, 4), M2(3, 4), M2(4, 4), . . . M2(39, 4) and M2(40, 4).

In the same way as described in the two preceding paragraphs, the data items which represent any other horizontal line in the square and the lower side thereof are transferred from the input memory M1 to the output memory M2. As a result of this, the data stored in the output memory M2 represents that part of image 5a defined by the square, which is now electronically zoomed, more precisely magnified two times.

The data items representing the pixels forming each horizontal line in said square are read from the output memory M2 during the next scanning period. All data items read from the output memory M2 are processed by the signal processing circuit 11, and are used to display the image 5b (FIG. 5) enlarged double. Although not described herein, both the input memory M1 and the output memory M2 are so designed that data can be written into them almost at the same time other data is read from them.

The image 5a (FIG. 5) can be enlarged at the magnification of 4/3 which is not an integral multiple of one, thus forming an image 5c shown in FIG. 5. To enlarge the image 5a into the image 5c, every three data items, which represent every three consecutive pixels, are processed. One of the data items stored in the input memory M1 is copied twice in the output memory M2, while the remaining two data items are copied only once in the output memory M2, respectively. Also, those of the data items stored in the memory M1 and showing every three consecutive horizontal lines, which represent one of the three lines, are copied twice in the output memory M2, while the data items representing the remaining two lines are copied only once in the memory M2, respectively.

Whether the image 5a is magnified at the magnification of 2 or 4/3, the electronic zooming is performed under the control of the signal conversion control circuit 13. The zooming, though a complicated operation, can easily achieved by means of the microprocessor (MPU) incorporated in the circuit 13.

As is evident from FIG. 5, the 4/3-magnified image 5c is somewhat distorted from the original image 5a. To be more specific, in the image 5c, some of the lines, vertical or horizontal, are twice as thick as the corresponding lines of the original image 5a, while the remaining lines are just as thick as the corresponding lines of the image 5a.

The cause of the distortion of the 4/3-magnified image 5c is a loss in similarity of the signal waveform. This loss of similarity is inevitable because the factor of adding pixels differs in accordance with the location where the pixels are added. Assuming that the energy of a signal representing a pixel (hereinafter called "pixel signal") is the product of the geometrical size of the pixel and the magnitude of the pixel signal, the distortion of the image can said to have resulted from a change in the energy distribution of pixel signals.

The original image 5a can be reduced at the magnification of ½ in the following way. First, all data stored in the input memory M1 is transferred to the output memory M2. Then, one of any two data items now stored in the memory M2 and representing every two consecutive pixels is deleted, and one of any data items stored in the memory M2 and showing every two consecutive horizontal lines is also deleted. When the image 5a is reduced at the magnification of ½ or at any other magnification which is a reciprocal to an integral multiple of one, the reduced image is not distorted at all.

The image 5a can be reduced at the magnification of ¾ in the following way. First, all data stored in the input memory M1 is transferred to the output memory M2. Then, one of the three data items stored in the memory M2 and representing every three consecutive pixels is deleted, and one of the three data items stored in the memory M2 and showing every three consecutive horizontal lines is deleted.

When the image 5a is reduced at the magnification of ½ or at any other magnification which is a reciprocal to an integral multiple of one, the reduced image is not distorted at all. However, when the image 5a is reduced at the magnification of ¾ or any other magnification which is a reciprocal of a non-integral multiple of one, the reduced image is distorted, inevitably because the factor of thinning pixels differs in accordance with the location where the pixels are deleted.

FIG. 6A is a graph representing the energy distribution of 10 signals representing pixels located at points P(6, 6) to P(35, 6). The positions of the ten pixels are plotted on the X axis, whereas the magnitudes (i.e., charges) of the 10 pixel signals are plotted on the Y axis. FIG. 6B is a graph showing the energy distribution of 13 signals representing pixels located at points G(1, 1) to G(40, 1), i.e., thirteen of the pixels a partly forming the image 5c (FIG. 5) enlarged at the magnification of 4/3. In FIG. 6B, too, the positions of the 13 pixels are plotted on the X axis, whereas the magnitudes (i.e., charges) of the 13 pixel signals are plotted on the Y axis. Obviously, the image formed of the pixels 2 to 4 shown in FIG. 6B is not similar to the image formed of the pixels 2 to 4 shown in FIG. 6A, though the image formed of the pixels 1 to 3 shown in FIG. 6B is similar to the image formed of the pixels 1 to 3 shown in FIG. 6A. As a result, the enlarged image 5c is distorted, or is not similar to the original image 5a. This is inevitable since the image 5c has been obtained by copying one of three data items showing every three consecutive pixels twice, while copying the remaining two data items only once, in the output memory M2.

A method of electronically zooming an image at various magnifications, allowing but a minimum distortion of the image, is disclosed in Published Unexamined Japanese Patent Application No. 1-194752. This method, which is devised for use in facsimile apparatuses or PPCS, cannot successfully achieve real-time processing of signals, such as TV signals, which need to be processed at very high speed.

The gist of the present invention will now be described with FIGS. 7A to 7E.

Let us assume that the imaging device 3 (FIG. 1) corresponds to a 3×3 matrix 40 which has, as is shown in FIG. 7A, nine pixels arranged in four rows and four columns in the same plane, the first row consisting of pixels a1, a2 and a3, the second row consisting of pixels b1, b2 and b3, and the third row consisting of pixels c1, c2 and c3. Let us further assume that the signals output from the pixels a1, a2, a3 and b1 are at such levels as form the time series illustrated in FIG. 7B.

It will be explained how to enlarge the image formed by the imaging device 3, at the magnification of 4/3, to an image which is similar to the original image.

Imagine a virtual imaging device which is shown in FIG. 7C and corresponds to a 4×4 matrix 41 obtained by expanding the matrix 40 at the magnification of 4/3. The 4×4 matrix is formed of 16 pixels arranged in four rows and four columns. The first row consists of pixels a11 to a14; the second row consists of pixels b11 to b14; the third row consists of pixels c11 to c14; and the fourth row consists of pixels d11 to d14. Hence, as can be understood from FIG. 7B, any signal output by the virtual imaging device (FIG. 7A) and representing one horizontal line is the combination of the pixel signals produced by the four pixels of the same row of the 4×4 matrix 41. In fact, however, only three pixel signals a1, a2 and a3 are available, as is evident from FIG. 7B, which represent one horizontal line. Hence, to enlarge the original image at the magnification of 4/3, it is necessary to convert the signals a1, a2 and a3 to four virtual pixel signals a11, a12, a13 and a14 shown in FIG. 7D. In other words, the signals a1, a2 and a3 must be processed, thereby to provide four virtual signals a11, a12, a13 and a14 whose total energy is equal to that of the signals a1, a2 and a3.

How to convert the pixel signals a1, a2 and a3 to pixel signals a11, a12, a13 and a14 will be explained, with reference FIG. 7E. FIG. 7E consists of four graphs. The upper graph represents the energy distribution of the pixel signals a1, a2, a3 and b1. As has been described, the magnification applied in this instance is 4/3. Hence, the signal block formed of the pixel signals a1, a2 and a3 is divided into four signal components, as is indicated by broken lines. As is evident from FIG. 7E, the signal component consists of the first three quarters of the signal a1; the second signal component consists of the last quarter of the signal a1 and the first half of the signal a2; the third signal component consists of the second half of the signal a2 and the first quarter of the signal a3; and the fourth signal component consists of the last three quarters of the signal a3.

As can be understood from the upper graph of FIG. 7E, each signal component has an energy less than that of any signal of which the component is formed. Therefore, the level of any part of each signal component is multiplied by the reciprocal of the magnification, thereby to determine the energy of a new pixel signal.

More specifically, as the upper graph in FIG. 7E shows, the pixel signals a1, a2, a3 and b1 are at levels 13, 17, 22, and 20. Hence, the following operation is performed, thereby providing pixel signals a11, a12, a13, a14, and b11:

$$a11 = 13 \times (\tfrac{3}{4})$$

$$a12 = 13 \times (\tfrac{1}{4}) + 17 \times (2/4)$$

$$a13 = 17 \times (2/4) + 22 \times (\tfrac{1}{4})$$

$$a14 = 22 \times (\tfrac{3}{4})$$

$$b11 = 20 \times (\tfrac{3}{4})$$

The pixel signals a11, a12, a13, a14 and b11, thus provided, are written into the output memory M2 and stored at the addresses thereof which correspond to the locations where the pixels represented by these signals will be displayed.

The pixel signals which represent any other horizontal line, e.g., the signals b1, b2 and b3 output from the pixels b1, b2 and b3 (FIG. 7A), are converted to pixel signals b11, b12, b13, and b14, in the same way as the pixel signals a1, a2 and a3, whereby the image formed by the imaging device 3 is expanded 4/3 times in the horizontal direction.

Thereafter, the pixel signals which represent each vertical line, e.g., the signals a1, b1 and c1 output from the pixels a1, b1 and c1 (FIG. 7A), are converted to pixel signals in the same way as in expanding the image in the horizontal direction, whereby the image formed by the device 3 is expanded 4/3 times in the vertical direction. As a result, the image is enlarged at the magnification of 4/3.

In practice, the pixel signals representing the image formed by the imaging device 3 are converted to pixel signals representing an image enlarged at the magnification of 4/3, by means of the specific arithmetic operation which will be explained as follows.

Let us assume that the pixel signals a1, a2 and a3 shown in FIG. 7B have magnitudes D1, D2 and D3, that the virtual pixel signals a11, a12, a13 and a14 shown in FIG. 7D have magnitudes E1, E2, E3 and E4, and that the new pixels signals representing the enlarged image have magnitudes F1, F2, F3 and F4. If the pixels forming the original image have a width of 1, as measured in the horizontal direction, then each pixel represented by the virtual pixels shown in FIG. 7C have a width of $\tfrac{3}{4}$. Therefore:

$$F1 = E1 \times 4/3 = (D1 \times \tfrac{3}{4}) \times 4/3$$

$$F2 = E2 \times 4/3 = (D1 \times \tfrac{1}{4} + D2 \times 2/4) \times 4/3$$

$$F3 = E3 \times 4/3 = (D2 \times 2/4 + D3 \times \tfrac{1}{4}) \times 4/3$$

$$F4 = E4 \times 4/3 = (D3 \times \tfrac{3}{4}) \times 4/3$$

FIG. 8A is a graph showing the energy distribution of the pixel signals output by the imaging device 3 and forming a video signal representing the image formed by the device 3. FIG. 8B is a graph representing the energy distribution of the pixel signals obtained by processing the output signal of the device 3 and forming a video signal representing an enlarged image. Obviously, the video signal shown in FIG. 8B has a waveform which is similar to that of the video signal shown in FIG. 8A.

FIG. 8C is a graph identical to that of FIG. 8A, and illustrates the energy distribution of the pixel signals output by the imaging device 3 and forming a video signal representing the image formed by the device 3. FIG. 8D is a graph representing the energy distribution of the pixel signals obtained by means of the electronic zooming described with reference to FIGS. 5 and 6 and forming a video signal representing an image electronically zoomed. Inevitably, the video signal shown in FIG. 8C has a waveform which is not similar to that of the video signal shown in FIG. 8C. This is because the energies of the original pixels have not been evenly distributed to the virtual pixel signals.

The gist of the present invention is to process signals of various dimensions, including time-axis signals, in real time. These signals are: audio signals which are one-dimensional ones having a single axis (i.e., the time axis); still image signals which are two-dimensional ones having the X and Y axes; moving image signals or stereoscopic image signals which are three-dimensional ones; and stereoscopic moving image signals which are four-dimensional ones. The signal-converting device according to the present invention can process all these signals in real time, in the direction of any axis, and outputs pixel signals at the same frequency in whatever direction the input signals are processed.

Figure 9:
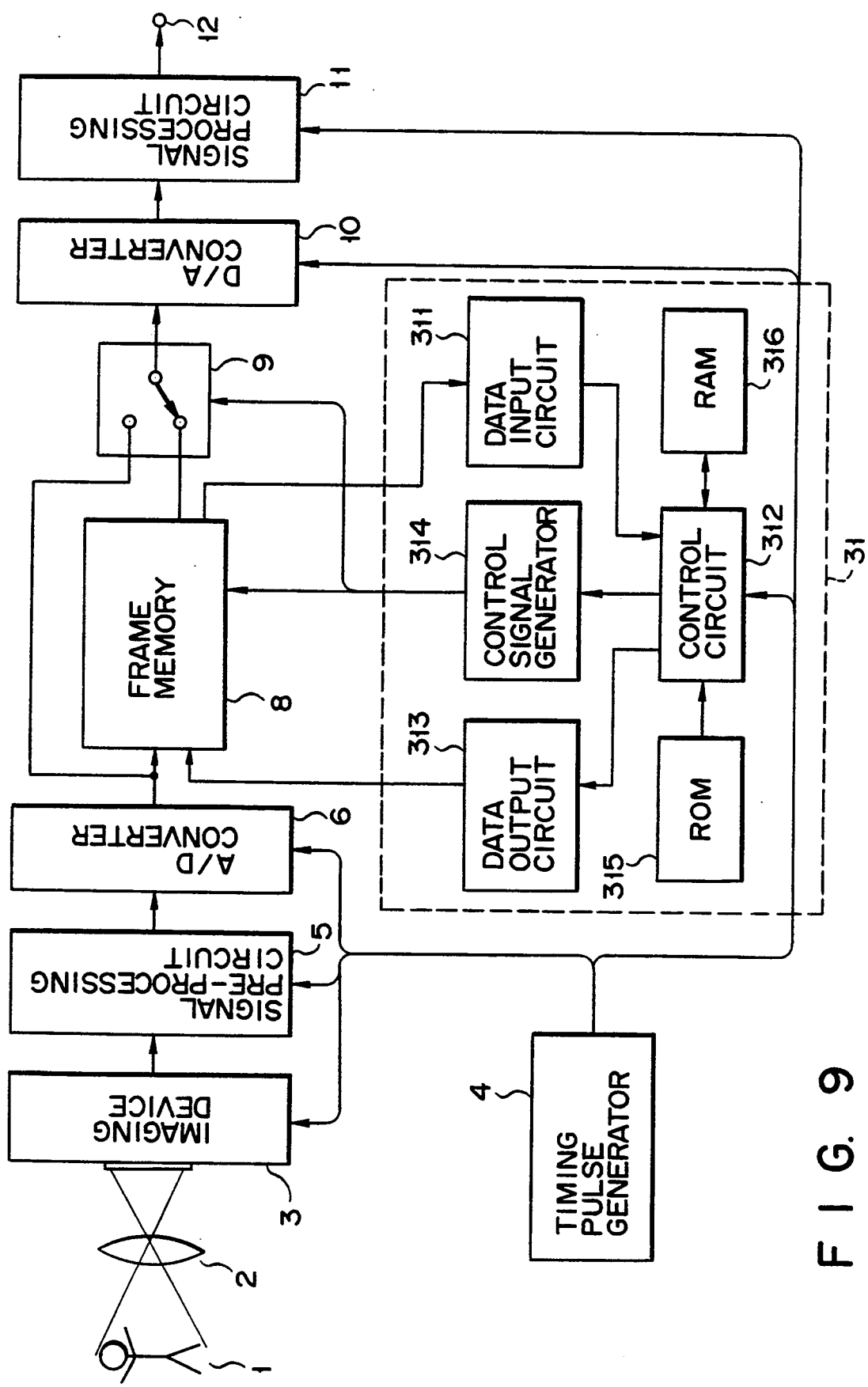
FIG. 9 is a block diagram showing a digital electronic zooming system according to the present invention.

FIG. 9 is a block diagram showing a digital electronic zooming system according to the present invention. As may be understood if FIG. 9 is compared with FIG. 1, this zooming system is different from the conventional system (FIG. 1) in that, instead of the conversion control circuit 13, a signal-converting section 31 is used, which will be later described in detail.

As is illustrated in FIG. 9, the light reflected from an object 1 passes through a lens 2 and is focused on the surface of an imaging device 3 which has a number of photodiodes arranged in rows and columns on its surface. These photodiodes form an electrical charge image which corresponds to the optical image focused on the surface of the imaging device 3. When driven by drive pulses supplied from a timing pulse generator 4, the imaging device 3 outputs a video signal representing the image of the object 1. The video signal, which is an analog signal, is processed by a signal preprocessing circuit 5 and then is converted into a digital signal by means of an analog-to-digital (A/D) converter 6.

The A/D converter 6 is connected to a memory 8. The memory 8 comprises three frame memories 8a, 8b and 8c, each having storage capacity of one frame of an image. The digital signal, i.e., the output of the A/D converter 6 is supplied to the input terminal of the first frame memory 8a and also to one of two input terminals of a switch circuit 9.

To zoom the image electronically, the digital video signal representing the image is written into the first frame memory 8a. The video signal stored in the first frame memory 8a is supplied to the signal-converting section 31. The section 31 performs electronic zooming on the video signal. The video signal output by the section 31 is supplied to the memory 8. In the memory 8, the video signal is stored into the second frame memory 8b and then into the third frame memory 8c. Finally, the video signal is read from the third frame memory 8c.

If the image need not be zoomed electronically, the digital video signal generated by the A/D converter 6 is input to a digital-to-analog (D/A) converter 10 through the switch circuit 9. Alternatively, the digital video signal is written into the memory 8 and read therefrom at ordinary scanning intervals and supplied to the D/A converter 10 through the switch circuit 9. In either case, the D/A converter 10 converts the digital video signal to an analog video signal. The analog video signal is input to a signal processing circuit 11 and then output from an output terminal 12.

The signal-converting section 31 is designed to divide the total energy of pixel signals, thus providing signal components, and also add the energies of the signal components, in the specific method which has been described with reference to FIGS. 7A to 7E. Microprocessors of the ordinary types cannot process video signals (i.e., TV signals) in real time. Therefore, the section 31 has a microprocessor specially designed and able to process video signals at speeds high enough to accomplish real-time arithmetic operations.

As is shown in FIG. 9, the signal-converting section 31 comprises a data input circuit 311, a control circuit 312, a data output circuit 313, a control signal generator 314, a ROM 315, and a RAM 316. The control circuit 312 receives the data from the first frame memory 8a through the data input circuit 311, and processes the data, thus enlarging or reducing the image represented by the data. The data output by the control circuit 312 can be written into the second frame memory 8b and the third frame memory 8c. In other words, the circuit 312 can supply data to the memory 8 through the signal output circuit 313. The control circuit 312 can also input write addresses to the memory 8, and can cause the control signal generator 314 to generate switching signals. The switching signals output by the generator 314 are supplied to the memory 8 and also to the switching circuit 9. The circuit 312 operates in one of the modes defined by the programs stored in the ROM 314. The RAM 316 is connected to the control circuit 312, and is used as a buffer memory.

Figure 10C:
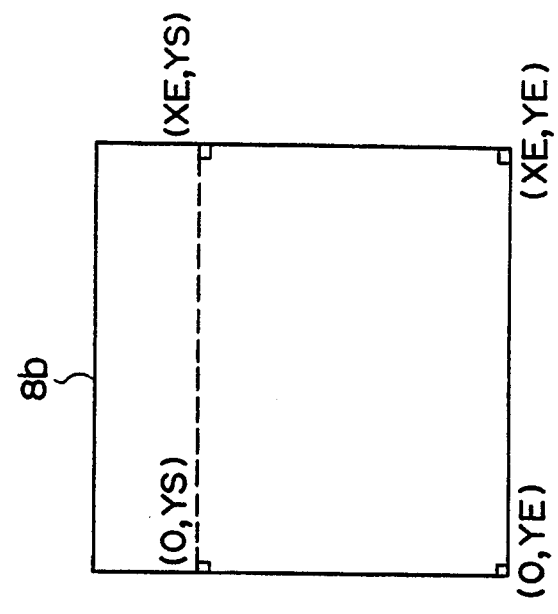
FIGS. 10A to 10C schematically represent the storage regions of the frame memories incorporated in the electronic zooming system shown in FIG. 9.
Figure 10B:
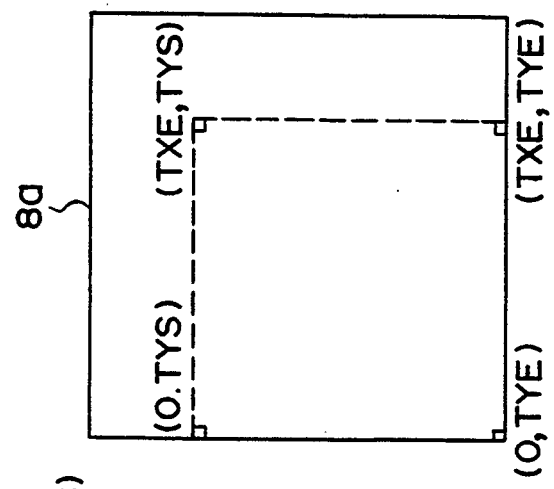
Figure 10A:
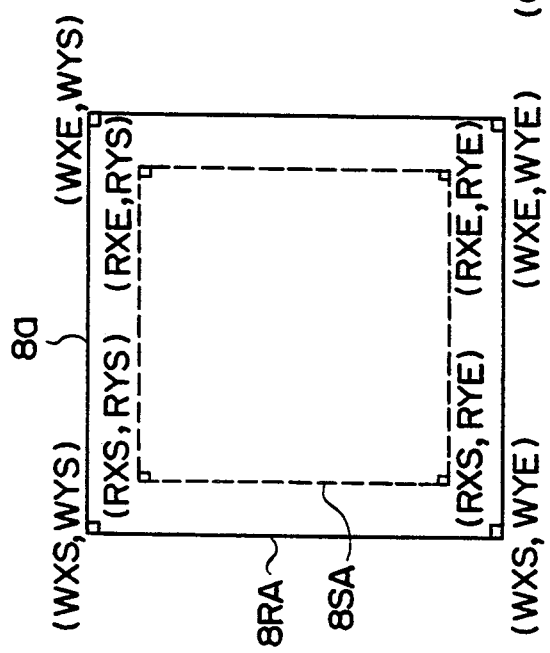

FIGS. 10A to 10C schematically represent the storage regions of the frame memories. With reference to FIGS. 10A to 10C, it will now be explained how the signal-converting section 31 operates.

The signal-converting section 31 automatically starts operating when the power switch (not shown) of the electronic zooming system is pushed. First, the control circuit 312 reads variables stored in the ROM, whereby the variables (including the zooming magnification) are initialized. Thereafter, when a zoom select button (not shown) is pushed, a desired zooming magnification, a desired zooming-start position, and a desired zooming-end position are set. Further, the coordinate data items representing the locations on the TV screen, where pixels are to be displayed, are converted to addresses, and various operation coefficients are set. FIG. 11 represents a table of pixel locations, and also a table of operation coefficients.

When a zooming-start button (not shown) is pushed, the control circuit 312 initializes the variables necessary for achieving the electronic zooming. Then, the circuit 312 does nothing at all until a first vertical sync signal is supplied to the timing pulse generator 4. Hence, no electronic zooming begins at a middle part of a one-frame image. When the circuit 312 receives the first vertical sync signal is supplied, the data representing the image formed by the imaging device 3 is stored into the first frame memory 8a. Upon receipt of the second vertical sync signal, the circuit 312 starts converting pixel signals to virtual pixel signals. The image data can be continuously written into the memory 8 and read therefrom. However, the data is written into the memory 8 only in the case where the image represented by the data needs to be electronically zoomed, since much power is required to rewrite the contents of the memory 8.

FIG. 10A schematically represents the storage region of the first frame memory 8a. Let us assume the first frame memory 8a stores the data representing an image. To enlarge a portion 8SA of this image, which is defined by a square, at the magnification of 4/3, the addresses of the pixel signals forming the data are changed, whereby the data representing the portion 8SA of the image is shifted to the lower-left corner of the square storage region 8RA of the first frame memory 8a, as is illustrated in FIG. 10B. This shifting of data proceeds during a vertical blanking period, in synchronism with high-speed clock pulses.

The data is read from the first frame memory 8a, starting at the address (RXS, RYS) and ending at the address (RXE, RYE). Then, the data is written back into the first frame memory 8a, starting at the addresses (O, TYE) and ending at the address (TXE, TYE). "0" bits, for example, are written at all addresses outside the square whose upper and right sides are defined by the broken lines shown in FIG. 10B.

After the data has been shifted in the first frame memory 8a but before an effective image period in a display connected to the signal-converting device, the pixel signals are converted to virtual pixel signals in synchronism with horizontal sync signals, thereby to expand the image in the horizontal direction.

More specifically, to expand the image 4/3 times in the horizontal direction, the data stored in the first frame memory 8a is transferred to the second frame memory 8b. The signal block formed of the pixel signals representing each horizontal line is divided into signal components, and the energies of the signal components are added in the specific method which has been described with reference to FIGS. 7A to 7E, whereby the pixel signals are converted to virtual pixel signals. As a result of this, the image shown by the data stored in the lower-left corner of the storage region 8RA of the first frame memory 8a is expanded 4/3 times in the horizontal direction, as can be understood from FIG. 10C which schematically represents the storage region of the second frame memory 8b and the contents thereof.

Then, the data stored in the second frame memory 8b is transferred to the third frame memory 8c. The pixel signals which represent each vertical line are converted to pixel signals in the same way as in the case of expanding the image in the horizontal direction, whereby the image formed by the device 3 is expanded 4/3 times in the vertical direction. As a result of this, the image is enlarged at the magnification of 4/3.

It is desirable that the signal conversion in the second frame memory 8c be started after the pixel signals representing the first horizontal line have been transferred from the second frame memory 8b to the third frame memory 8c. The timing of the signal conversion for achieving the vertical expansion of the image needs to be changed in accordance with the magnification at which to enlarge or reduce the image. If the magnification ranges from 1 to 2, it is necessary to convert the pixel signals for at least two horizontal lines to virtual pixel signals before the next effective image period begins.

In order to explain the image in the vertical direction, a line buffer is required which can store at least pixel signals representing one horizontal line. Part of the RAM 316 is used as a line buffer. This part of the RAM 316 (hereinafter referred to as a "line buffer") is cleared by a vertical sync signal. The control circuit 312 starts converting the pixel signals stored in the line buffer, in response to a horizontal sync signal. The pixel signal a1 representing the first of the pixels forming the first horizontal line is supplied to the control circuit 312. The circuit 312 multiplies the energy of the signal a1 by a first coefficient (¾). The product of the multiplication is written into the third frame memory 8c. Next, the circuit 312 multiplies the energy of the pixel signal a1 by a second coefficient (¼). The product of the multiplication is written into the line buffer. Further, the control circuit 312 multiplies the energy of each of the remaining pixel signals showing the first horizontal line by the first coefficient (¾), writes the product of the multiplication into the third frame memory 8c, multiplies the energy of the same pixel signal by the second coefficient (¼), and writes the product of this multiplication into the line buffer.

In response to the next horizontal sync signal, the control circuit 312 reads the pixel signal a2 representing the first of the pixels forming the second horizontal line, and multiplies the energy of the signal a2 by a third coefficient (2/4). The circuit 312 then adds the product of the multiplication to the data stored in the line buffer and representing the first pixel of the first horizontal line. The sum obtained by this addition is written into the third frame memory 8c, at the address for the first pixel of the second horizontal line. Further, the control circuit 312 multiplies the energy of the signal a2 by a fourth coefficient (2/4) and stores the product of this multiplication into the line buffer.

Thereafter, the control circuit 312 multiplies the energy of each of the remaining pixel signals showing the second horizontal line by the third coefficient (2/4), then adds the product of the multiplication to the data stored in the line buffer and representing the corresponding pixel of the first horizontal line, further writes the resultant sum into the third frame memory 8c, at the address for the pixel of the second horizontal line, then multiplies the energy of the signal by the fourth coefficient (2/4), and finally stores the resultant product into the line buffer. Thus, the circuit 312 processes all pixel signals representing the second horizontal line.

In response to the next horizontal sync signal, the control circuit 312 reads the pixel signal a3 showing the first of the pixels forming the third horizontal line from the second frame memory 8b. The circuit 312 multiplies the energy of the pixel signal a3 by a fourth coefficient (¼), and adds the product of the multiplication to the energy of the pixel signal stored in the line buffer and representing the first pixel of the second horizontal line. The sum of this addition is supplied via the data output circuit 313 to the second frame memory 8b and stored at the address for the first pixel of the second horizontal line. Further, the circuit 312 multiplies the energy of the pixel signal a3 by a sixth coefficient (¾), and stores the resultant product into the line buffer. Thereafter, the circuit 312 reads each of the remaining pixel signals representing the third horizontal line from the second frame memory 8b, then multiplies the energy of the pixel signal by the fourth coefficient (¼), further adds the resultant product to the energy of the pixel signal stored in the line buffer and representing the corresponding pixel of the second horizontal line, and supplies the resultant sum via the data output circuit 313 to the second frame memory 8b, thus storing the sum at the address for the corresponding pixel of the second horizontal line. Further, the circuit 312 multiplies the energy of each remaining signal showing the third horizontal line by the sixth coefficient (¾), and stores the resultant product into the line buffer.

After all data about the third horizontal line is written into the third frame memory 8c, the data stored in the line buffer is transferred at high speed to those addresses of the third frame memory 8c which are designated for the fourth horizontal line.

As other horizontal sync signals are supplied to the control circuit 312, the circuit 312 repeats the sequence of the operations described above, and thus converts the pixel signals representing the remaining horizontal lines. As a result, the image represented by the data stored in the first frame memory 8a is enlarged at the magnification of 4/3.

Of course, to enlarge or reduce the image formed by the imaging device 3 (FIG. 9) at any other magnification, the circuit 312 repeats the sequence of operations a different number of times, and coefficients are used which are different from those used for enlarging the image at the magnification of 4/3.

As soon as the control circuit 312 finishes converting the first-frame pixel signals, the second-frame pixel signals representing the second frame of the image are written into the first frame memory 8a. Thereafter, as the signal-converting section 31 performs electronic zooming of the image, one frame after another, the digital video signals are input, one after another, from the A/D converter 6 to the first frame memory 8a, one after another, while the digital video signals formed of the pixel signals output by the circuit 312 are sequentially read from the third frame memory 8c via the switch circuit 9 to the D/A converter 10. The D/A converter 10 converts the digital video signals to analog video signals, which are processed by the signal processing circuit 11. The video signals output from the circuit 11 are output to an external device from the output terminal 12.

The third frame memory 8c is necessary to zoom the image at various magnifications or to get an effect of the picture image. In the case where it suffices to zoom the image at a fixed magnification, the third frame memory 8c may be change to a simple buffer memory. In the embodiment shown in FIG. 9, the first analog video signal cannot be output from the terminal 12 before the control circuit 312 finishes converting the pixel signals representing the first three frames of the image. This output delay, nonetheless, does matter in practice.

In the electronic zooming described above, the image is expanded, first in the horizontal direction and then in the vertical direction. The signal-converting section 31 can, however, expand the image, first in the vertical direction and then in the horizontal direction. Moreover, the section 31 can perform the horizontal expansion and the vertical expansion alternately, provided that pixel signals (i.e., signals not converted) are written into either the second frame memory 8b or the third frame memory 8c, along with the virtual pixel signals. Further, the signal-converting section 31 can expand or contract an image horizontally at a magnification and vertically at a different magnification. Still further, the signal-converting section 31 can convert the pixel signals such that the image is deformed.

Figure 12:
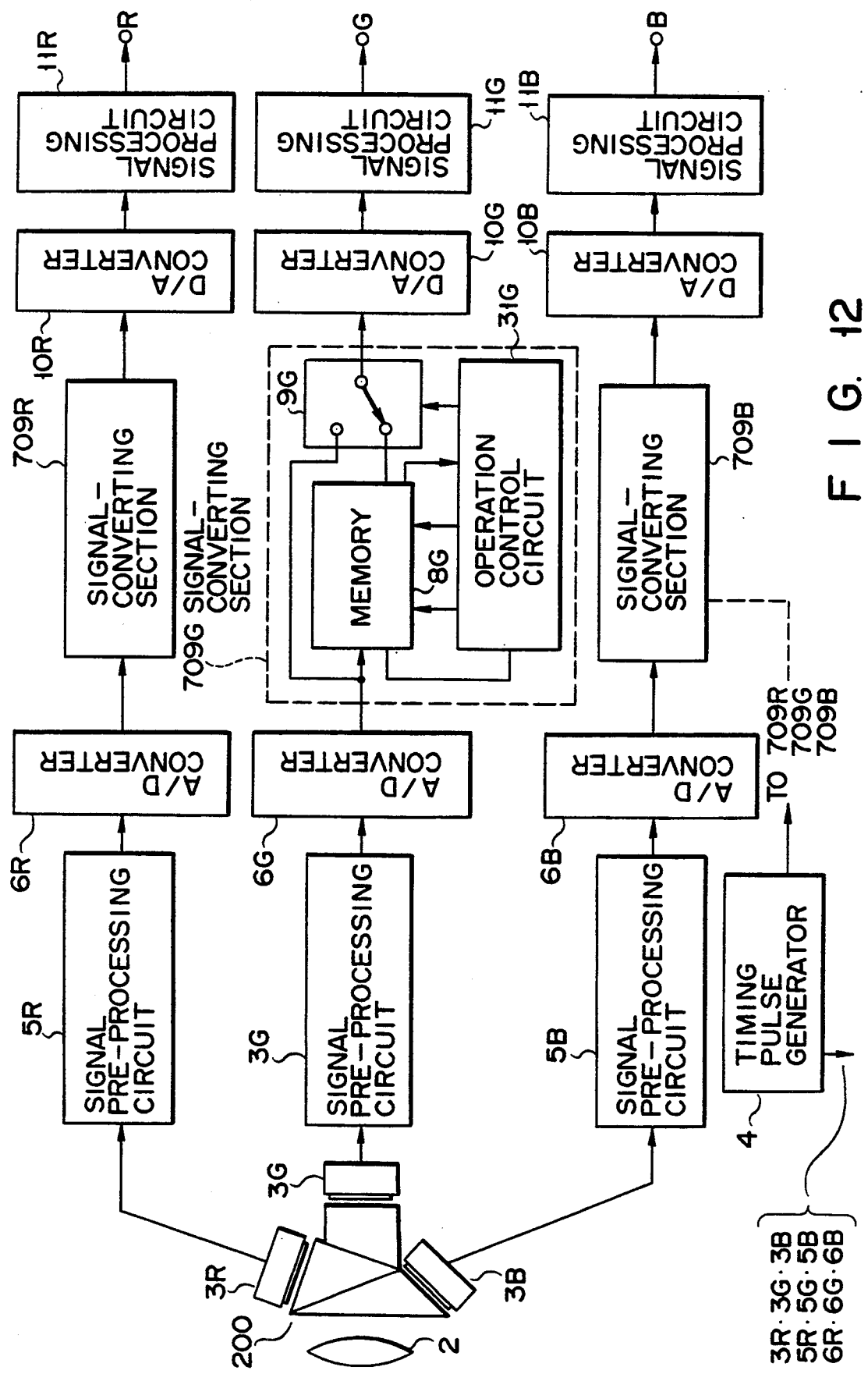
FIG. 12 is a block diagram illustrating another digital electronic zooming system according to the invention, which is of primary color type designed for use in a three-plate primary color camera.

FIG. 12 illustrates a digital electronic zooming system according to the invention, which is of a primary color type designed for use in a three-plate primary color camera. In this system, it is easy to control three color signals, a R signal, a G signal and a B signal, since these signals can be processed simultaneously. In order to obtain clear images, however, the system needs to have many memories.

The light passing through a lens 2 is applied to a color-separating prism 200. The prism 200 separates the input light into three light beams, i.e., a red beam, a green beam, and a blue beam. The red, green and blue beams are applied to solid-sate imaging devices 3R, 3G and 3B, respectively. As a result, a red optical image, a green optical image, and a blue optical image are formed on the imaging surfaces of these devices 3R, 3G and 3B. The solid-state imaging devices 3R, 3G and 3B generate electric signals representing the red, green and blue images. These signals are supplied to signal pre-processing circuits 5R, 5G and 5B. The circuits 5R, 5G and 5B convert the input signals to analog video signals. The three video signals generated by the circuits 5R, 5G and 5B are converted to digital video signals by means of A/D converters 6R, 6G and 6B, respectively. The digital video signals are input to signal-converting sections 709R, 709G and 709B.

The signal-converting sections 709R, 709G and 709B perform the same function as the signal-converting section 31 shown in FIG. 9. They are of the same structure, each comprising a memory, an operation control circuit and a switch. For example, the section 709G comprises a memory 8G, an operation control circuit 31G, and a switch 9G. The signal-converting sections 709R, 709G and 709B process the digital video signals, providing new digital video signals which represent a red image, a green image and a blue image, which are either enlarged or reduced at the same magnification. The digital video signals output by the sections 709R, 709G and 709B are supplied to D/A converters 10R, 10G and 10B, respectively.

The D/A converters 10R, 10G and 10B convert the digital video signals to analog video signals. The analog video signals are input to signal-processing circuits 11R, 11G and 11B. The circuits 11R, 11G and 11B adjust the gains of the input signals, thus outputting three color signals, i.e., a R signal, a G signal and a B signal.

Figure 13:
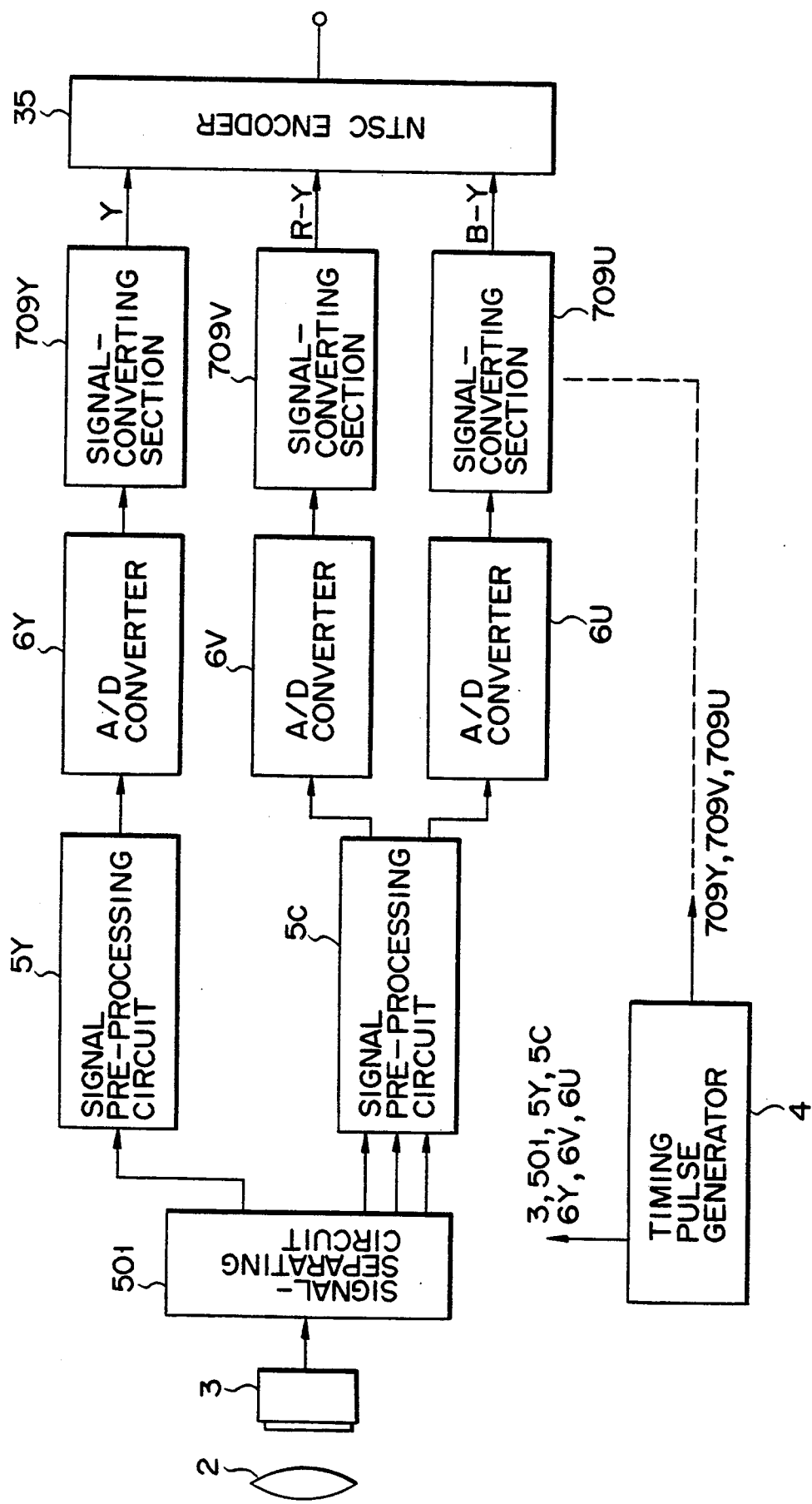
FIG. 13 is a block diagram showing a digital electronic zooming system according to the invention, which is of color-difference type designed for use in a single-plate color-difference camera.

FIG. 13 is a block diagram showing a digital electronic zooming system according to the invention, which is of a color-difference type designed for use in a single-plate color-difference camera. In this system, signal control, which is more complex than that performed in the system of FIG. 12, must be conducted. Nonetheless, the system is advantageous over the system of FIG. 12 in that fewer memories are required.

As is shown in FIG. 13, the digital electronic zooming system has an imaging device 3 which has a color filter on its imaging surface. The signal output by the device 3 is input to a signal-separating circuit 501. The circuit 501 separates the signal into a Y signal (i.e., a luminance signal), a R (red) signal, a G (green) signal and a B (blue) signal. The Y signal is supplied via a signal pre-processing circuit 5Y to an A/D converter 6Y, which converts the input signal to a digital signal. The R, G and B signals are input to a signal pre-processing circuit 5C. The circuit 5C processes these signals and produces a (R-Y) signal and a (B-Y) signal. The (R-Y) and (B-Y) signals are input to A/D converters 6V and 6U, respectively. The A/D converters 6V and 6U convert these signals to two digital signals.

The digital signals output by the A/D converters 6Y, 6V an 6U are supplied to signal-converting sections 709Y, 709V and 709U, respectively. These sections process the input digital signals, providing a new Y signal, a new (R-Y) signal and a new (B-Y) signal which represent a color image either enlarged or reduced at a desired magnification. The Y signal, the (R-Y) signal and the (B-Y) signal, which have been output by the signal-converting sections 709Y, 709V and 709U, are input to an NTSC encoder 35. The NTSC encoder 35 converts these signals to an NTSC television signal.

In the embodiments described above, the signal-converting section or sections process signals, thus electronically zooming an original image in order to accomplish the gist of the present invention explained with reference to FIGS. 7A to 7E. However, means for achieving the gist of the invention is not limited to the signal-converting method performed in the signal-converting section or sections.

CCD Signal-Converting System

As has been pointed out, the conventional signal-converting device needs to have an A/D converter and a D/A converter since its main function is to process digital signals. Both the A/D converter and the D/A converter are expensive, inevitably raising the cost of the home-use video movie cameras which incorporate the signal-converting device. Hence, as has been described earlier, the second object of the invention is to provide a signal-converting device which has neither A/D converters nor D/A converters, which can yet process video signals such that the image formed of these signals is enlarged or reduced at any magnification desired, and which can be manufactured at low cost and can, therefore, be suitable for use in home-use video movie cameras.

To achieve the second object, a CCD is used which is a device able to store the energies of analog signals use and to add and divide signal energies, thereby to accomplish electronic zooming of images, without assistance of A/D converters or D/A converters.

A CCD can add and divide signal energies if some of the electrodes of its charge transfer unit are so small that drive voltages are applied to them, independently of the voltages applied to the remaining electrodes of the unit. In other words, the CCD can not only transfer signal charges, but also add and divide signal energies, provided that the small electrodes of its charge transfer unit are driven at a certain timing.

Figures 14A, 14B:
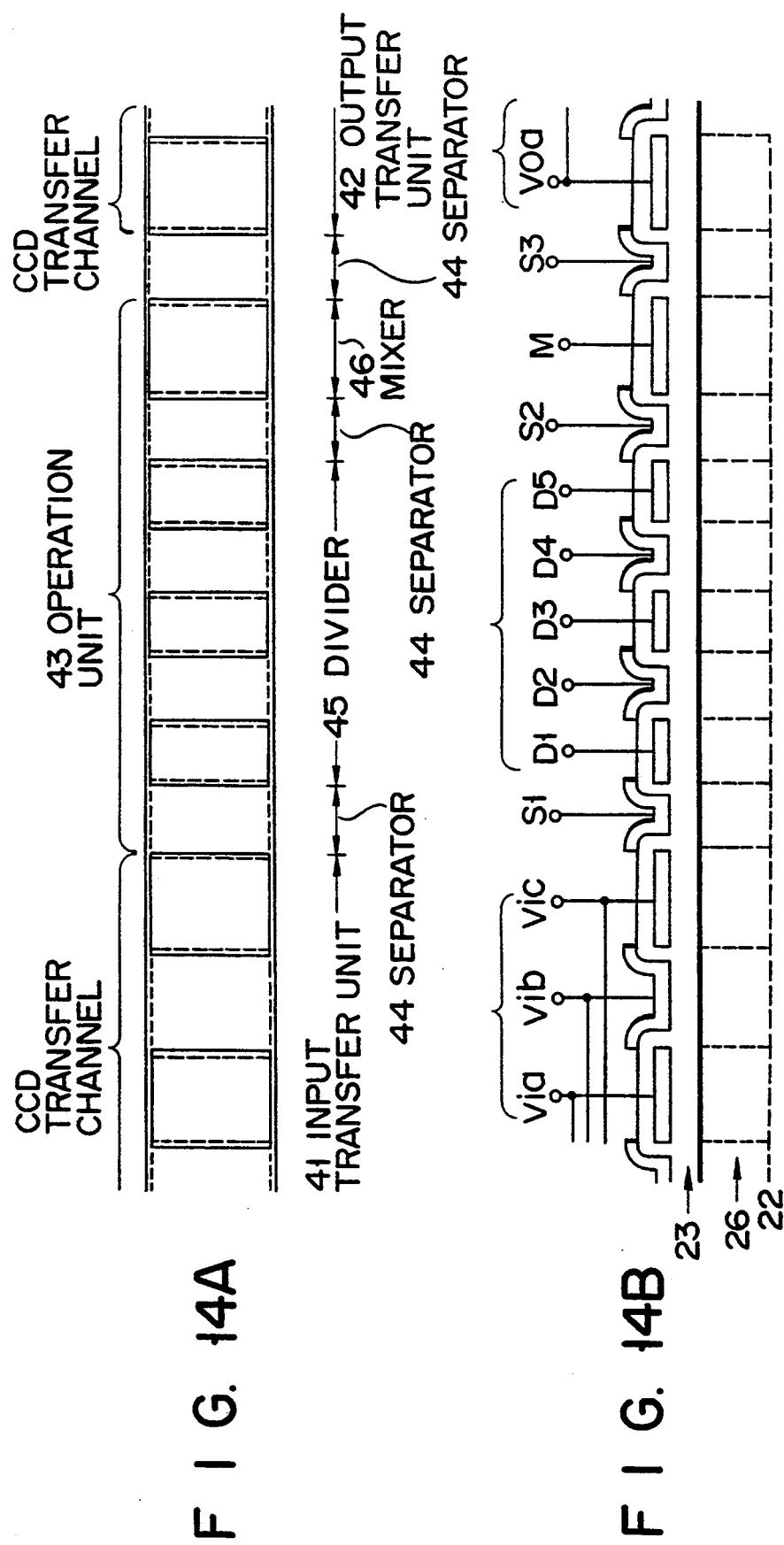
FIGS. 14A and 14B are diagrams illustrating the basic structure of a CCD-signal converting device according to the invention.

FIG. 14A is a plan view showing that section of a CCD-signal converting device according to the invention, which can add and divide signal energies. FIG. 14B is a cross-sectional view of this section of the CCD-signal converting device.

The CCD-signal converting device according to the invention will be described, on the assumption that, for the sake of simplicity, the device has a CCD having three phase driving electrodes.

As is illustrated in FIGS. 14A and 14B, the CCD-signal converting device has an input charge-transfer unit 41, an output charge-transfer unit 42, and an operation unit 43 connected between the charge-transfer units 41 and 42. The operation unit 43 has three separators 44 comprising electrodes S1, S2 and S3, respectively, a divider 45 having five electrodes D1 to D5, and a mixer 46 having an electrode M. The separators 44 are large enough to separate signal charges. The electrodes D1 to D5 of the divider 45 form potential wells which have the same capacity and are electrically independent of one another. The capacity of the potential wells is large enough to store the maximum electric charge that can be transferred by one of the charge-transfer stages. The electrode M of the mixer 46 is larger than either charge-transfer unit, and its size is determined in accordance with the magnification at which the CCD-signal converting device is to electronically zoom an original image.

As is shown in FIG. 14B, the input charge-transfer unit 41 has three charge-input electrodes Via, Vib, and Vic, and the output charge-transfer unit 42 has a charge-output electrode Voa. As is evident from FIG. 14B, the CCD-signal converting device further comprises a semiconductor substrate 22 and an insulating layer 23 formed on the substrate 22. In FIG. 14B, numeral 26 designates charge-transferring stages.

Figure 15:
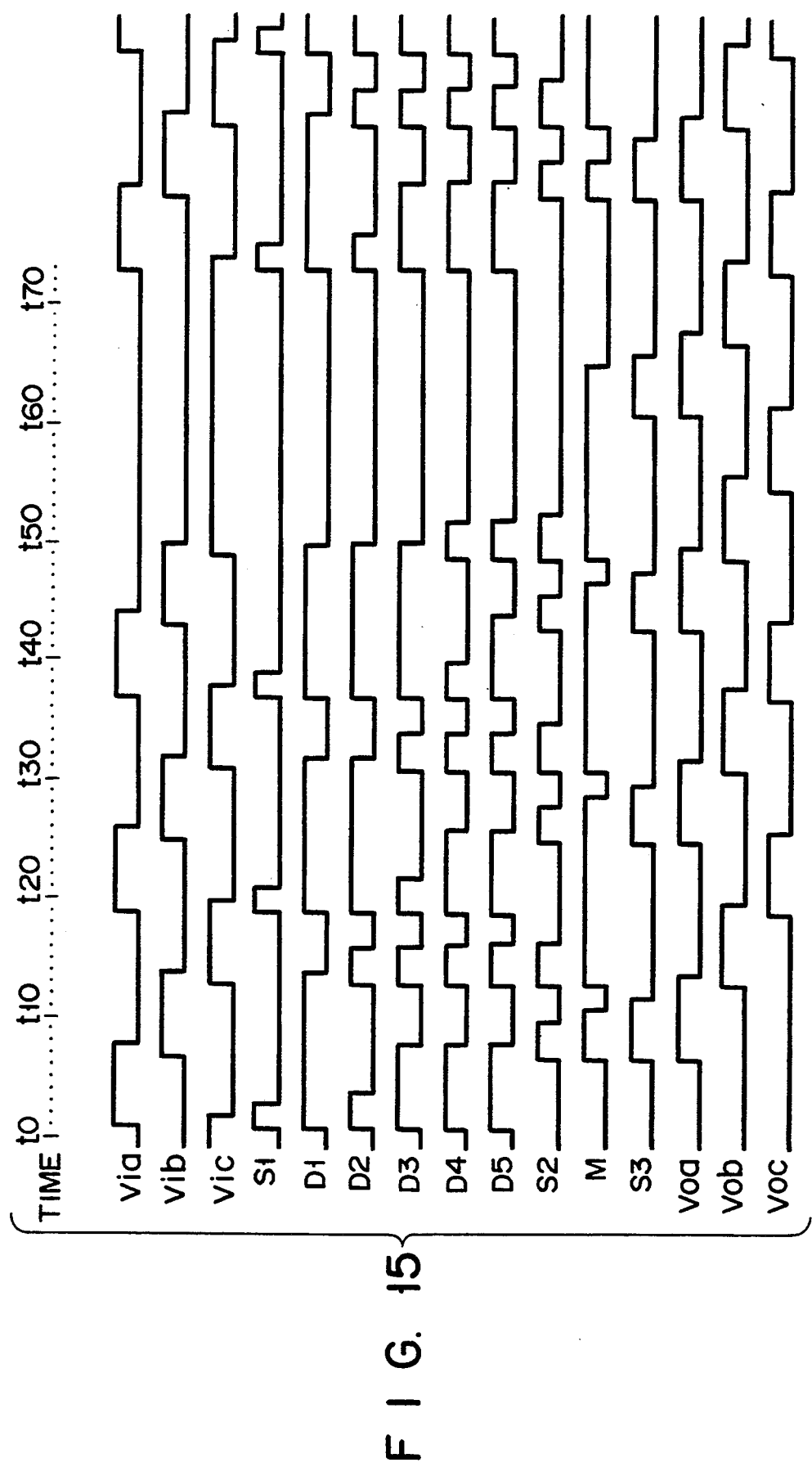
FIG. 15 is a timing chart showing the waveforms of the drive signals used in the CCD-signal converting device (FIG. 14) in order to enlarge an image at a magnification of 4/3.
Figure 16:
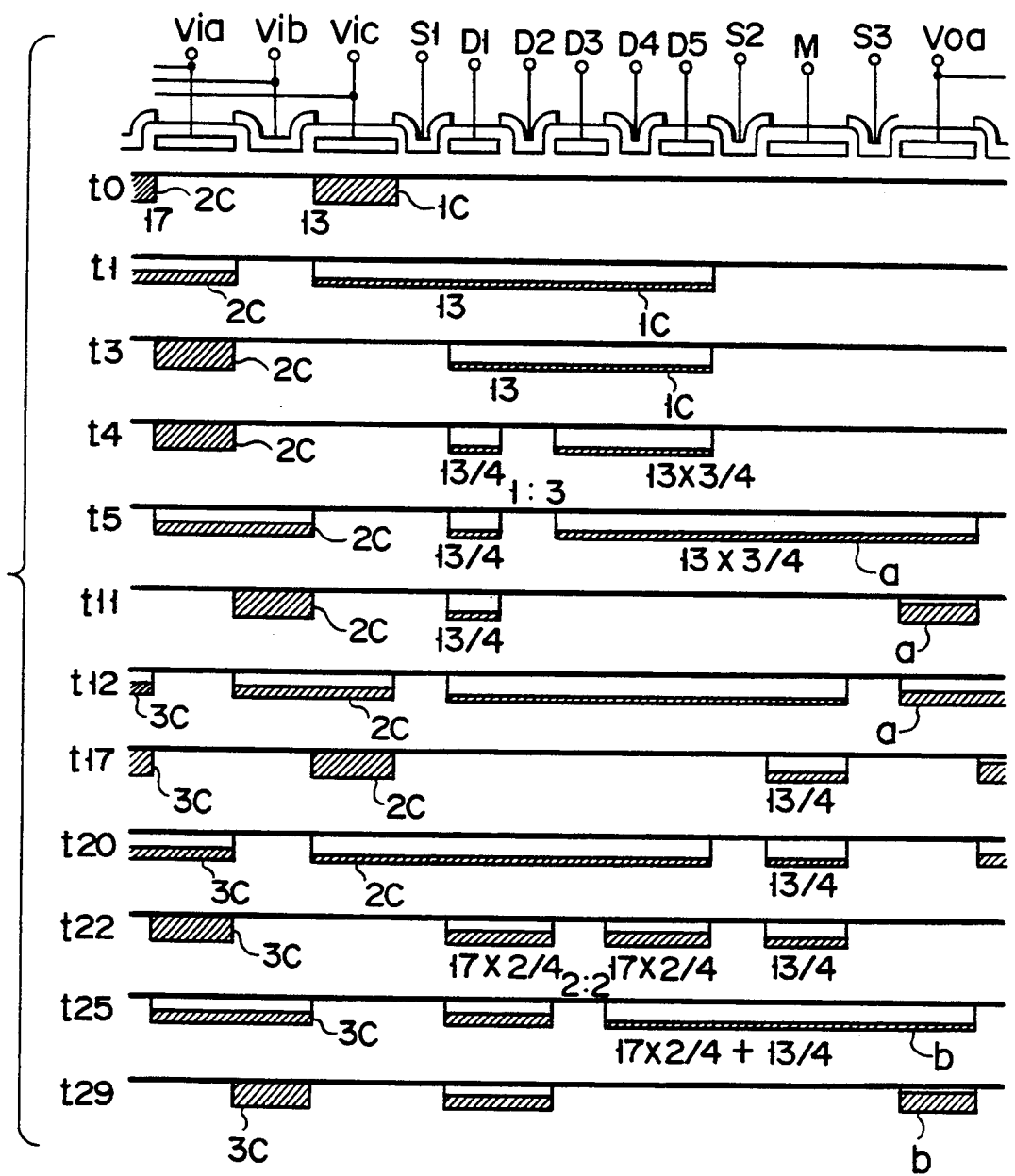
FIG. 16 is a diagram explaining how the CCD-signal converting device (FIG. 14) divides and adds CCD signals.

FIG. 15 is a timing chart showing the waveforms of the drive signals supplied to the electrodes of the CCD-signal converting device, in order to enlarge an image at a magnification of 4/3. FIG. 16 is a diagram explaining how the CCD-signal converting device divides and adds signal charges.

With reference to FIGS. 15 and 16, it will now be described how the device shown in FIGS. 14A and 14B processes CCD signals in order to achieve electronic zooming.

Let us assume that, at time $t_0$, a signal charge is accumulated beneath the third charge-input electrode Vic, and no signal charges are accumulated beneath the electrodes of the divider 45 or the electrode of the mixer 46. (In FIG. 16, the hatched boxes represents electric charges, and symbol 1C designates the first pixel signal.) In other words, at time $t_0$, the electrode Vic only is at high potential.

At time $t_1$, the electrodes Via, S1, D1, D2, D3, D4, and D5 are set at high potential. At time $t_2$ to $t_3$, the electrode Vic and S1 are set at low level. As a result of this, the signal charge beneath the last charge-input electrode Vic of the input charge-transfer unit 41 is transferred to those portions of the substrate 22 which are located beneath the electrodes D1 to D5 of the divider 45. In other words, this signal charge is uniformly distributed to the electrodes D1 to D5. At time $t_4$, the potential of the electrode D2 falls to a low level. As a result, the electric charge beneath the electrodes D1 to D5 is divided into two components (1:3). The first component is accumulated beneath the electrode D1, and the second component is accumulated beneath the electrodes D3 to D5. At time $t_7$, the potentials of the electrodes Vib, S2, M, S3 and Voa rise to a high level. Then, for the period between time $t_7$ and time $t_{12}$, the potentials at the electrodes Via, D3, D4, D5, S2 and S3 fall to the low level, one after another. Hence, the first charge component is transferred to the charge-output electrode Voa.

Therefore, the electric charge of the first pixel signal a1 (FIG. 7E) is divided into two components (1:3), i.e., one quarter of the charged and three quarters thereof. The three quarters of the charge are transferred to the charge-output terminal Voa, whereby a new pixel signal a11 (FIG. 7E) formed of these three quarters of charge is output from the electrode Voa.

Next, at time $t_{12}$, the potential of the electrodes Vic, D2 to D5, M and Vob increase to the high level. During the period between time $t_{14}$ to time $t_{17}$, the potentials of the electrodes Vib, D1 to D5, and S2 sequentially fall to the low level. As a result of this, the charge of the second pixel signal 2C is transferred to that portion of the substrate 22 which is located beneath the third charge-input electrode Vic of the input charge-transfer unit 41. Simultaneously, the second part component of the charge of the first pixel signal is held beneath the electrode M of the mixer 46.

At time $t_{19}$, the potentials of the electrodes Via, S1, D1 to D5, and Voc rise to the high level. At time $t_{20}$, the potentials of the electrodes Vic, Vob and S1 sequentially decrease to the low level. Hence, the charge of the second pixel signal, accumulated beneath the third charge-input electrode Vic, is transferred to that portion of the substrate 22 which is located below the electrode D1 to D5 of the divider 45. Then, at time $t_{22}$, the potential of the electrode D3 decreases to the low level. Thus, the electric charge accumulated beneath the electrodes D1 to D5 is divided into two components of the same magnitude (2:2). The first component is accumulated beneath the electrodes D1 and D2, whereas the second component is accumulated beneath the electrodes D4 and D5.

During the period between time $t_{26}$ and time $t_{29}$, the potentials of the electrodes Via, Voc, D4, D5, S2, M and S3 sequentially decrease to the low level. As a result, the first component of the second pixel-signal charge is added to the second component of the first pixel-signal charge, beneath the electrode M of the mixer 46. The sum of these charge components is transferred to that portion of the substrate 22 which is located below the first charge-output electrode Voa.

More precisely, the last quarter (¼) of the charge of the first pixel signal a1 (FIG. 7E) is added to the first half (½) of the charge of the second pixel signal a2, thereby forming the second new pixel signal a12 (FIG. 7E).

Thereafter, the sequence of the operations described with reference to FIGS. 15 and 16 is repeated. In other words, the electric charges of the other original pixel signals are divided, each into two components, and the resultant charge components are added, in the scheme illustrated in FIG. 7E. More precisely, first, the electric charge of any other original pixel is divided into two components. Next, the first charge component is used as a new pixel signal. Then, the second charge component is added to the first charge component of the next pixel signal. The resultant sum of the charge components is used as another new pixel signal.

As a result, an image enlarged at the magnification of 4/3 will be formed by processing the pixel signals output by the CCD-signal converting device illustrated in FIGS. 14A and 14B.

As is evident from FIG. 15, no electrical charges are transferred in the input charge-transfer unit 41 during the period between time $t_{55}$ to time $t_{66}$, which corresponds to the duration of a 4-pixel signal. No signal charges should be transferred during this period. Otherwise, the four pixel-signal charges obtained by dividing and adding the charge components of every three input pixel-signal charges cannot be output at the same intervals as the three pixel-signal charges that have been input to the CCD-signal converting device.

Needless to say, the period of time during which to prohibit the charge transfer must be changed in accordance with the magnification of electronic zooming. Further, some measures must be taken to superpose two images, either electronically zoomed, despite that the unavoidable time lag between the input of a signal charge and the output of the corresponding signal charge. The method of changing the charge-transfer prohibited period in accordance with the magnification selected, and the method of superposing images will be described.

It should be noted that the magnitude of each pixel signal output from the CCD-signal converting device shown in FIGS. 14A and 14B is ¾ times the magnitude of any pixel signal input to the device. In other words, the magnitude of the pixel signal decreases in the CCD-signal converting device. This decrease is the same for all pixels which form the optical image of an object. Hence, it suffices to amplify the pixel signals output by the CCD-signal converting device with an amplification factor.

It should also be noted that, in the CCD-signal converting device, the pixel-signal charges need not be transferred exactly at the timing specified in FIG. 15. For example, the potentials of the electrodes can be increased or decreased in various sequences other than that illustrated in FIG. 15, provided that the pixel-signal charges are transferred at intervals long enough to prevent mixing of these pixel-signal charges.

When the zooming magnification is changed from the magnification of 4/3 to another one, the charge-transfer prohibited period must be changed. In order to zoom original image defined by pixels arranged in rows and column, each row consisting of m pixels, into a new image defined by pixels arranged in rows and columns, each row consisting of n pixels, the magnification r is: r=n/m. Hence, the CCD-signal converting device used to achieve this particular electronic zooming of the original image needs to have a row of (m+1) electrodes. If m is a least common multiple of several given integers, then the original image can be electronically zoomed at two or more magnifications. For example, if the given integers are 2, 3 and 4, then m=12. Hence, use is made of a CCD-signal converting device which comprises a divider having 13 (=12+1) electrodes. Experiments show that the magnification r should fall within the range of: ½≦<r≦<2; otherwise, the image obtained by electronically zooming an original image will have but a poor quality. Therefore, r=½, ⅔, ¾, 5/6, 7/6, 5/4, 4/3, 3/2, 7/4, 5/3, and so on. (Of course, the range for r can be broadened at the expense of the quality of the resultant image.)

It has been described that the size of the mixer 46 is determined by the magnification at which to enlarge or reduce the original image. To be more precise, if the magnification is ½, the mixer 46 must be two times larger than in the case where the magnification is 1; if the magnification is ⅓ the mixer 46 must be three times larger.

Further, when the magnification is changed, it is necessary to alter the timing of driving the electrodes of the divider 45, in accordance with the new magnification. This alteration can easily be achieved. It suffices to use a ROM (Read-Only Memory) storing data items at various addresses, which represent various frequencies of generating timing pulses, and then to read the data item showing the electrode-driving timing suitable for the magnification. One of the alternative methods known in the art can be employed to generate timing pulses in accordance with the data item thus read out of the ROM.

The ratio at which the CCD-signal converting device shown in FIGS. 14A and 14B changes the magnitude of each input pixel signal to a new pixel signal of a different magnitude can easily be altered by means of a gain-controlled amplifier. The device shown in FIGS. 14A and 14B electronically zooms the original image in only one direction, either the horizontal direction or the vertical direction. It cannot zoom the image in both directions. In order to convert video signals, thereby to zoom the image in both the horizontal direction and the vertical direction, it is necessary to use some CCD-signal converting devices identical to the device of FIGS. 14A and 14B.

Non-Interlaced Monochrome TV System 1

Figure 17:
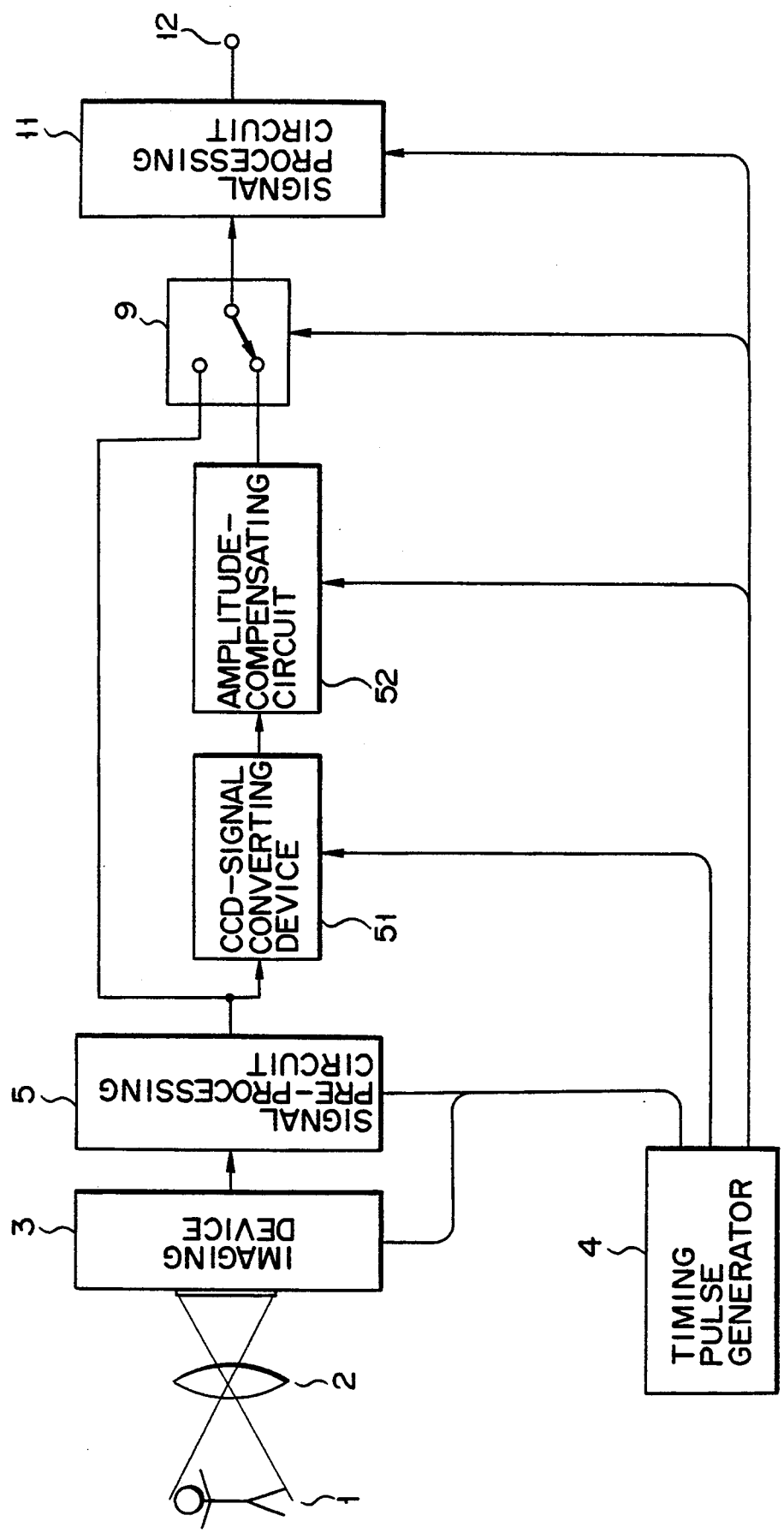
FIG. 17 is a block diagram showing an electronic zooming system having a CCD-signal converting device shown in FIG. 14.

FIG. 17 illustrates an electronic zooming system having a CCD-signal converting device identical to the device shown in FIGS. 14A and 14B. This is a non-interlaced monochrome TV system which is similar to the system illustrated in FIG. 9. The same components as those shown in FIG. 9 are designated at the same numerals, and will now be described in detail.

As FIG. 17 shows, the non-interlaced monochrome TV system comprises a lens 2, an imaging device 3, a timing pulse generator 4, a signal pre-processing circuit 5, a switch circuit 9, a signal-processing circuit 11, an output terminal 12, a CCD-signal converting device 51, and a amplitude-compensating circuit 52. The CCD-signal converting device 51 performs the functions of the A/D converter 6, the switch circuit 7, the frame memory 8, and the D/A converter 11, and the operation control circuit 31—all described above. The amplitude-compensating circuit 52 is connected to the output of the CCD-signal converting device 51. The circuit 52 is either an attenuator or an amplifier for changing the amplitude of any signal output by the device 51 to the amplitude of the corresponding pixel signal input to the device 51. The circuit 52 can be incorporated into the signal-processing circuit 11. Further, the circuit 52 can be one designed not only to change the amplitude of the output signal of the device 51, but also can perform so-called "aperture correction," thereby to prevent the zoomed image from degrading in clearness despite of the integration effect resulting from the signal conversion.

Figure 18:
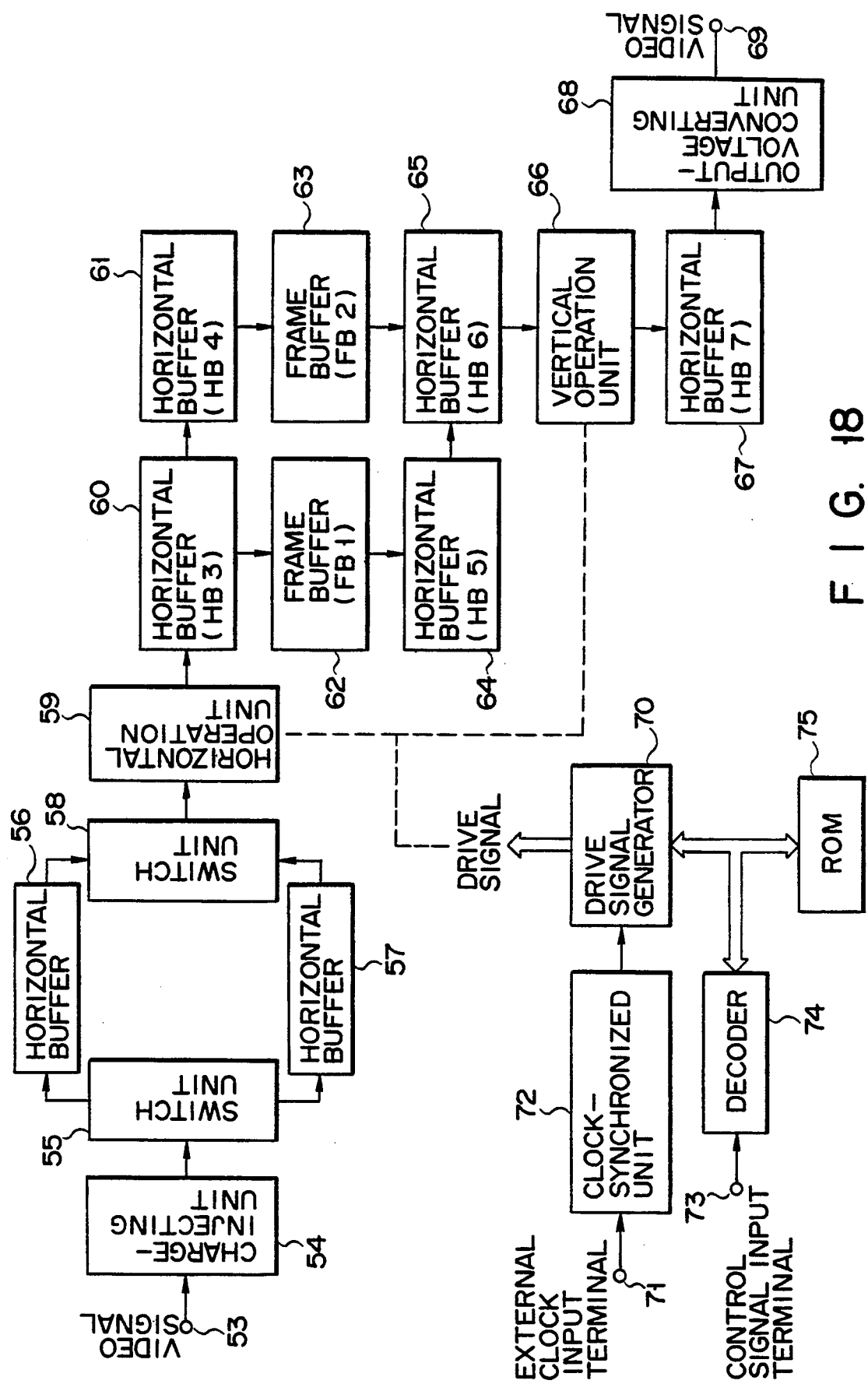
FIG. 18 is a function-block diagram illustrating the CCD-signal converting device used in the system shown in FIG. 17.

FIG. 18 is a function-block diagram illustrating the CCD-signal converting device 51 in detail. As can be understood from FIG. 18, a video signal output from the signal pre-processing circuit 5 (FIG. 17) is input via an input terminal 53 to a charge-injecting unit 54. The video signal output by the unit 54 is supplied to a switch unit 55, which distributes the signal to two horizontal buffers 56 and 57 during the period of a horizontal sync signal. More precisely, the signals for odd-numbered scanning lines are stored into the horizontal buffer 56, whereas the signals for even-numbered scanning lines are stored into the horizontal buffer 57. These buffers 56 and 57 are arranged in parallel to each other for a specific purpose, that is, in order to achieve time adjustment which ensures a successful horizontal zooming in a horizontal operation unit 59 (later described).

The signals output by the horizontal buffers 56 and 57 are input through the switch unit 58 to the horizontal operation unit 59. While the signals output by one of the horizontal buffers are being input to the unit 59, the signals are supplied from the switch unit 55 to the other horizontal buffer.

The horizontal operation unit 59 processes the input signals in the same method described with reference to FIGS. 14, 15 and 16, thereby expanding the image in the horizontal direction.

The signals output by the unit 59 are input to a horizontal buffer 60. The signals output by the buffer 60 are input to a horizontal buffer 61. These are also supplied to a frame buffer 62, in units of scanning lines. The signals output by the horizontal buffer 61 are supplied to a frame buffer 63, in units of scanning lines. The signals output by the frame buffer 62 are supplied to a vertical operation unit 66 through a horizontal buffer 64, in units of scanning lines. Similarly, the signals output by the frame buffer 63 are supplied to the vertical operation unit 66 through a horizontal buffer 65, in units of scanning lines.

As is evident from FIG. 18, the buffers 62 and 63 are arranged in parallel to each other. This is for the purpose of achieving time adjustment which ensures a successful vertical zooming in the vertical operation unit 66. To be more specific, the signal charges for every odd-numbered frame are input to the frame buffer 62, whereas the signal charges for every even-numbered frame are input to the frame buffer 63. While the signal charges are supplied from the frame buffer 63 via the horizontal buffer 65 to the vertical operation unit 66, the signal charges are supplied from the horizontal buffer 60 to the frame buffer 62. Further, while the signal charges are supplied from the frame buffer 62 to the vertical operation unit 66 via the horizontal buffers 64 and 65, the signal charges are supplied from the horizontal operation unit 59 are supplied to the frame buffer 63 through the horizontal buffers 60 and 61. Hence, during this period, the horizontal buffer 60 does nothing but transfer signal charges.

The vertical operation unit 66 divides and adds pixel data items by the same method as has been explained with reference to FIGS. 14 to 16, except that the data items are divided in the vertical direction. Though not illustrated, the unit 66 comprises operation elements which are arranged parallel in the same number as the pixels defining a horizontal line. The signals output by the vertical operation unit 66 are input to a horizontal buffer 67, in units of scanning lines. The signals output by the horizontal buffer 67 are supplied to an output-voltage converting unit 68. The unit 67 converts the input signal charges to voltage signals, which form a video signal. The video signal is output through an output terminal 69.

The CCD-signal converting device 51 comprises a CCD. The electrodes of the CCD are driven by the drive signals generated by a drive signal generator 70, which in turn is driven by the internal clock pulses which a clock-synchronized unit 72 produces when driven by the reference clock signal supplied to an external clock input terminal 71. The generator 70 can output drive signals in various modes defined by the data items stored at the addresses of a ROM 75. The drive-signal output modes correspond to various magnifications at which to enlarge or reduce the image formed by the imaging device 3 (FIG. 17). A control signal is supplied by an operator to the control signal input terminal 73. This signal determines which data item representing a specific drive-signal output mode should be supplied to the generator 70. The control signal is input to a decoder 74. The decoder 74 decodes the signal into an address signal. The address signal is supplied to the ROM 75, designating the address of the data item which represents a desired mode of outputting drive signals.

Figure 19:
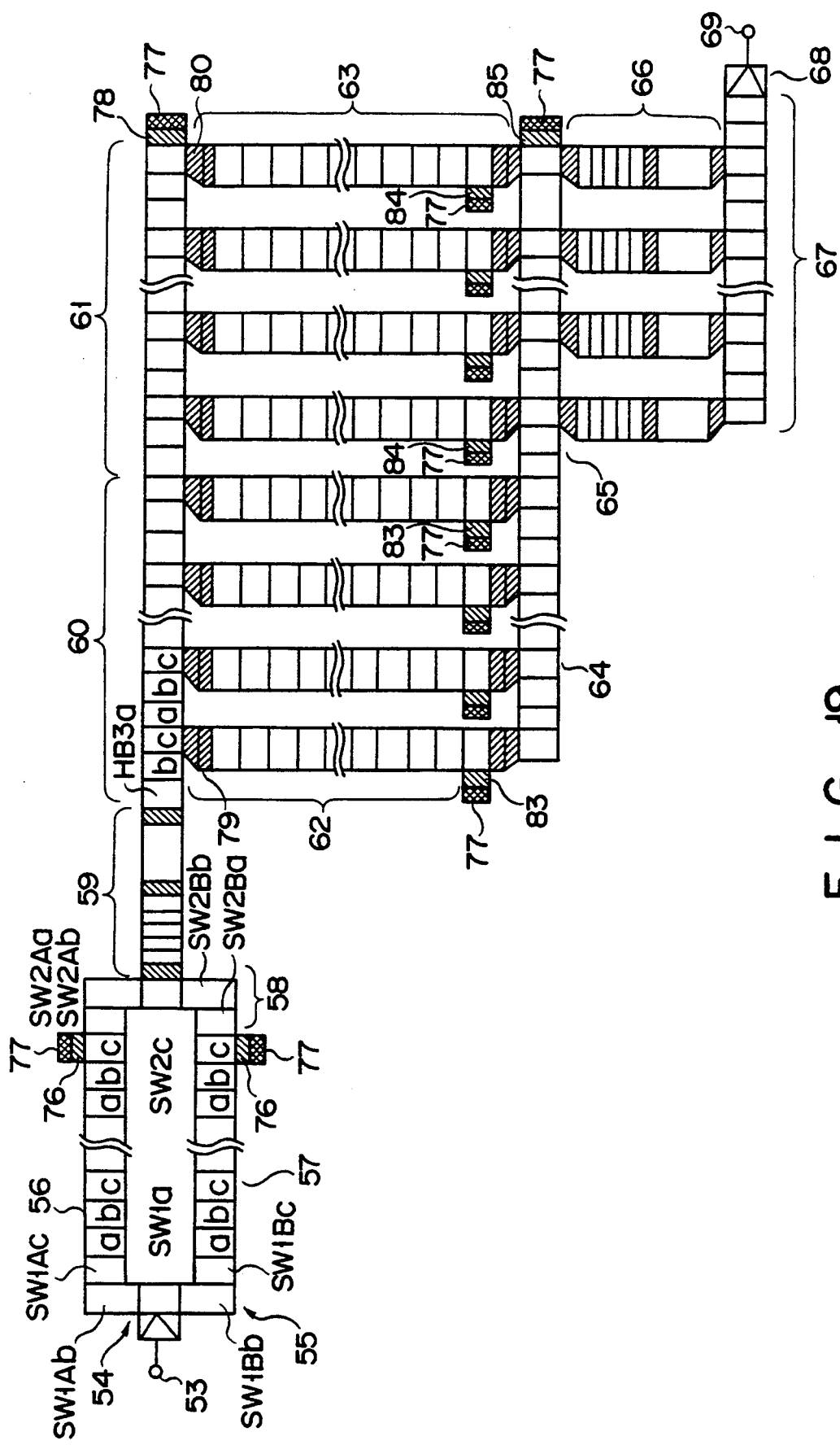
FIG. 19 is a schematic plan view of the CCD-section of the CCD signal converting device incorporated in the system of FIG. 17.

FIG. 19 is a schematic plan view of the CCD-signal converting device 51. For the sake of simplicity, the same components as those shown in FIG. 18 are designated by the same numerals in FIG. 19.

The device 51 shown in FIG. 19 is designed to enlarge the center part of a 40×40 pixel-matrix image at a magnification of 4/3. The CCD-signal converting device 51 is of three-phase driven type. As is shown in FIG. 19, the input terminal 53 is connected to the charge-injecting unit 54. The switch unit 55, designed to transfer a signal charge in one direction or the other direction, is coupled to the charge-injecting unit 54. The signal charge being transferred in the first direction is supplied to the 40-stage horizontal buffer 56 and then to the switch unit 58. Similarly, the signal charge being transferred in the second direction is supplied to the 40-stage horizontal buffer 57, which extends parallel to the horizontal buffer 56, and then to the switch unit 58. Further, both signal charges are input from the switch unit 58 to the horizontal operation unit 59.

Two separators 76 are connected to the last stages of the horizontal buffers 56 and 57, respectively. Two drains 77 are connected to these separators 76, respectively. The separators 76 and the drains 77 are used for discharging unnecessary portions of the signal charges.

The horizontal buffer 60 is coupled to the output of the horizontal operation unit 59. The horizontal buffer 61 is connected to the output of the horizontal buffer 60. The horizontal buffers 60 and 61, each having forty CCD transfer stages, function as input stages of the frame buffers 62 and 63, respectively. A separator 78 is connected to the last CCD stage of the buffer 61, and a drain 77 is coupled to the separator 78, for discharging the unnecessary portion of the signal charge being transferred through the horizontal buffer 61.

The frame buffers 62 and 63 comprise 40 vertical CCDs each. Each of the vertical CCDs has 40 CCD stages, the first and last of which have a separator electrode each. The electrodes of the 40 CCD stages are driven by the same drive signal. A separator 83 is connected to the last CCD stage of each vertical CCD, and a drain 77 is connected to this separator 83. The horizontal buffers 64 and 65, which function as output stages of the frame buffers 62 and 63, respectively, are connected in series. The last stage of the horizontal buffer 65 is connected to a separator 85, which in turn is connected to a drain 77. The horizontal buffer 65 also servers as the input stage of the vertical operation unit 66. Each stage of the buffer 65 has a first electrode. That side of the first electrode which faces away from the frame buffer 63 is connected to the vertical operation unit 66. The unit 66 comprises 40 operation sections. Each of these operation sections has two buffer CCDs located at the input and output, respectively.

The horizontal buffer 67 has 40 stages, each having a first electrode. The output of the vertical operation unit 66 is connected to the first electrodes of these stages of the horizontal buffer 67. The last stage of the buffer 67 is coupled to the output-voltage converting unit 68, which in turn is connected to the output terminal 69.

It is the drive signal generator 70 (FIG. 18) which supplies drive signals to the CCD-signal converting device 51. The generator 70 can generates various types of drive signals in response to the clock signals output by the clock-synchronized unit 72 which operates in synchronism with the clock signal externally input to the external clock input terminal 71. The sequence of generating drive signals is controlled by the data read from the ROM 75 in accordance with the control code input to the decoder 74 from the control signal input terminal 73.

The operation of the CCD-signal converting device 51, shown in FIG. 19, will now be explained with reference to FIGS. 20 to 24, FIGS. 25A and 25B, and FIGS. 26A and 26B. To facilitate the understanding of the processing of the 40×40 pixel-image data, the description will be made on the assumption that one frame consists of 45 scanning lines, and that the horizontal scanning period is 45 times longer than the duration of a one-pixel clock pulse.

FIG. 20 is a timing chart representing the waveforms of a vertical sync signal (VSYNC) A, a vertical blanking signal (VBLK) B, a horizontal sync signal (HSYNC) C, a video signal D, and a sampling clock signal (SPLCK) E—all input to the CCD-signal converting device 51. The signal E is supplied to the charge-injecting unit 54, for controlling the supply of signal charges to the switch unit 55. In FIG. 20, the broken lines mean the waves repeatedly formed, and "F" indicates the control signal supplied to the switch units 55 and 58.

FIG. 21 is a timing chart representing the waveforms of the other signals input to the CCD-signal converting device 51, i.e., a horizontal sync signal (HSYNC) A, a horizontal blanking signal (HBLK) B, a video signal C, and a sampling clock signal (SPLCK) D. The signal D is supplied to the charge-injecting unit 54, for controlling the supply of signal charges to the switch unit 55. In FIG. 21, the broken lines mean the waves repeatedly formed. "E" indicates a signal which drives the CCDs used to transfer signal charges in the horizontal direction. This drive signal E has a repetition rate during the image-scanning period, and a different repetition rate during the blanking period.

Figure 22:
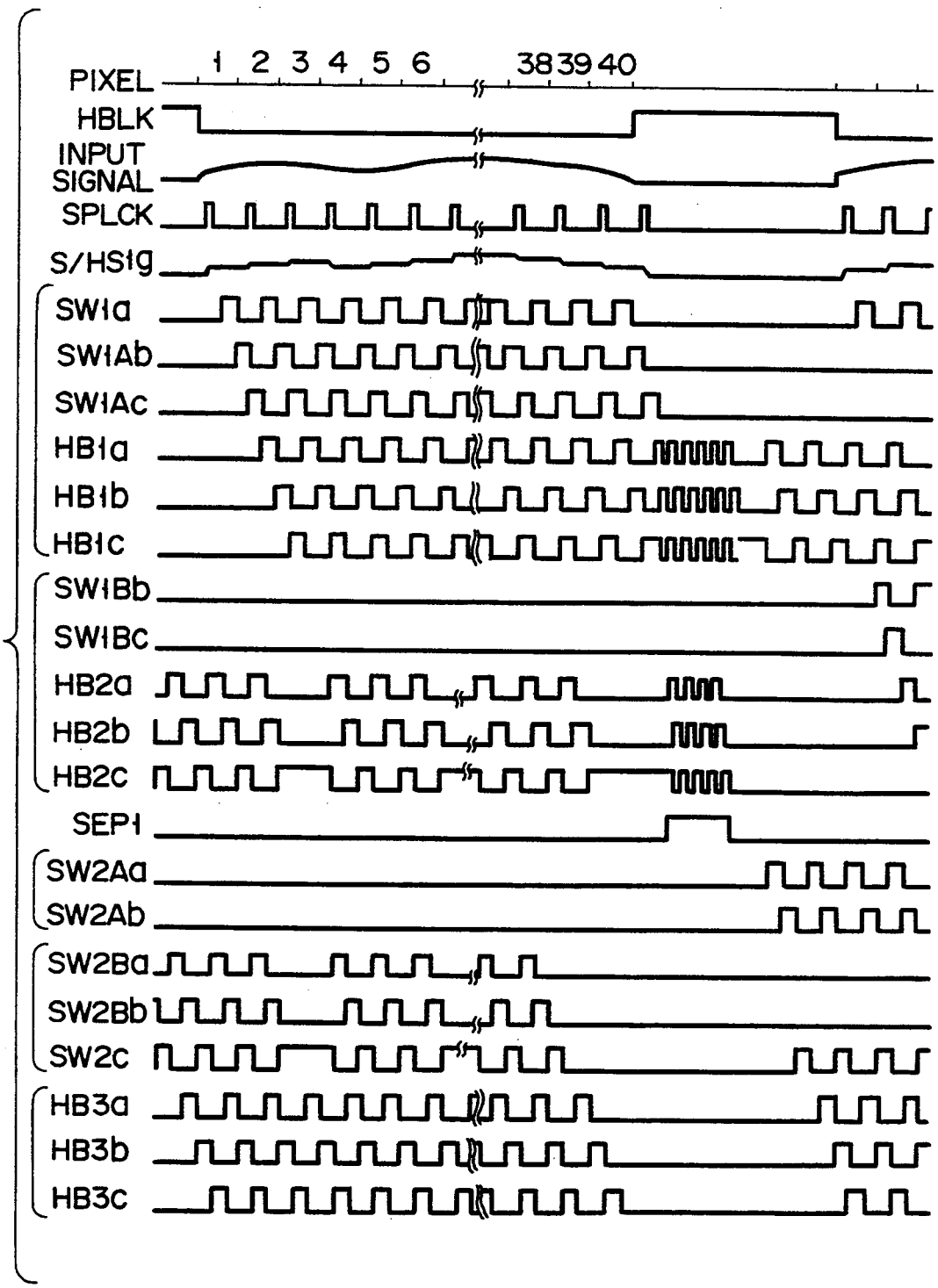

FIG. 22 is a timing chart illustrating the waveforms of the signal which drives the CCD-signal converting device 51 during the horizontal scanning period. The numerals on the horizontal scale shown in FIG. 22 show the positions of pixels. The signal HBLK and the input signal, both shown in FIG. 22, are identical to the horizontal blanking signal B and the video signal C (both illustrated in FIG. 21). Their waveforms represent the relation between CCD drive pulses and the horizontal scanning period. The signal SPLCK is a sampling clock signal; the signal S/H SIG is a video signal obtained by sampling the video signal with the sampling clock signal SPLCK in the charge-injecting unit 54.

The other signals shown in FIG. 22 are signals for driving the CCDs incorporated in the components 55, 56, 57, 58 and 59. More specifically, a signal SW1a is the drive signal supplied to the input electrode of the switch unit 55. Signals SW1Ab, SW1Ac, HB1a, BH1b, and BH1c are the drive signals supplied to the electrodes of the horizontal buffer 56. Signals SW1Bb, SW1Bc, HB2a, HB2b, and HB2c are the drive signals supplied to the electrodes of the horizontal buffer 57. Signal SEP1 is the drive signal supplied to the separator 76. Signals SWAa and SWAb are supplied to the output electrode of the horizontal buffer 56. Signal SW2c is the drive signal supplied to the common output electrode of the buffers 56 and 57. Signals HB3a, HB3b and HB3c are drive signals supplied to the electrodes of the horizontal buffer 60.

The video signal is supplied to the charge-injecting unit 54 through the input terminal 53. The unit 54 converts the video signal to a charge which is proportional to the level of the video signal. Since the image is to be enlarged at the magnification of 4/3 in this instance, the video signals, which represent the five uppermost scanning lines, the five lowermost scanning lines, and the five leftmost pixels and five rightmost pixels of each of the other scanning lines, are not necessary. Therefore, as is shown in FIG. 20, the supply of the sampling clock signal E is stopped, whereby the signals representing the five uppermost lines are not supplied to the charge-injecting unit. 54. The video signals representing the sixth to thirty-fifth scanning lines are sampled and supplied from the unit 54 to the switch unit 55. The switch unit 55 switches the direction of transferring charges during the horizontal scanning period. For example, the unit 55 distributes the charges representing each odd-numbered scanning line to the horizontal buffer 56, and the charges representing each even-numbered scanning line, to the horizontal buffer 57. All signal charges which represent one scanning line are transferred during a 40-clock-pulse period through the charge-transfer path. Of these signal charges, those representing the first five pixels signals are discarded via the separators 76 into the drains 77. Meanwhile, the charge-injecting unit 54 is reset to non-signal level by the first pulse of the sampling clock signal supplied to the unit 54 at the start of the horizontal blanking period. The switch unit 58 outputs the signal charges from the buffer 56 during the even-numbered line input, and the charges from the buffer 57 during the odd-numbered line input. Drive signals are supplied in synchronism with the sampling clock pulses to the horizontal buffers 56 and 57 in order to write the pixel signals into these buffers, and in synchronism with the sequence of the horizontal operation unit 59 in order to read the pixel signals form the buffers 56 and 57. The buffer, being thus switched, are used for the purpose of adjusting the timing of inputting signals to, and outputting signals from, the horizontal operation unit 59. The unit 59 outputs a signal upon lapse of a one-line scanning period after the inputting of the corresponding signal. The unit 59 operates in the same scheme as has been explained with reference to FIGS. 14A, 14B, 15, and 16.

The vertical operation unit 66 also outputs pixel signals representing four scanning lines for the pixel input signals representing every three scanning lines. Two frame buffers 62 and 63 are alternately used to adjust the timing of inputting signals to, and the timing of outputting them from, the vertical operation unit 66. To be more specific, the signals representing any odd-numbered frame are written into the first frame buffer 62, whereas the signals representing any even-numbered frame are written into the second frame buffer 63. While signals are being written into the second frame buffer 63, signals are read from the first frame buffer 62 and converted to new pixel signals.

Figure 23:
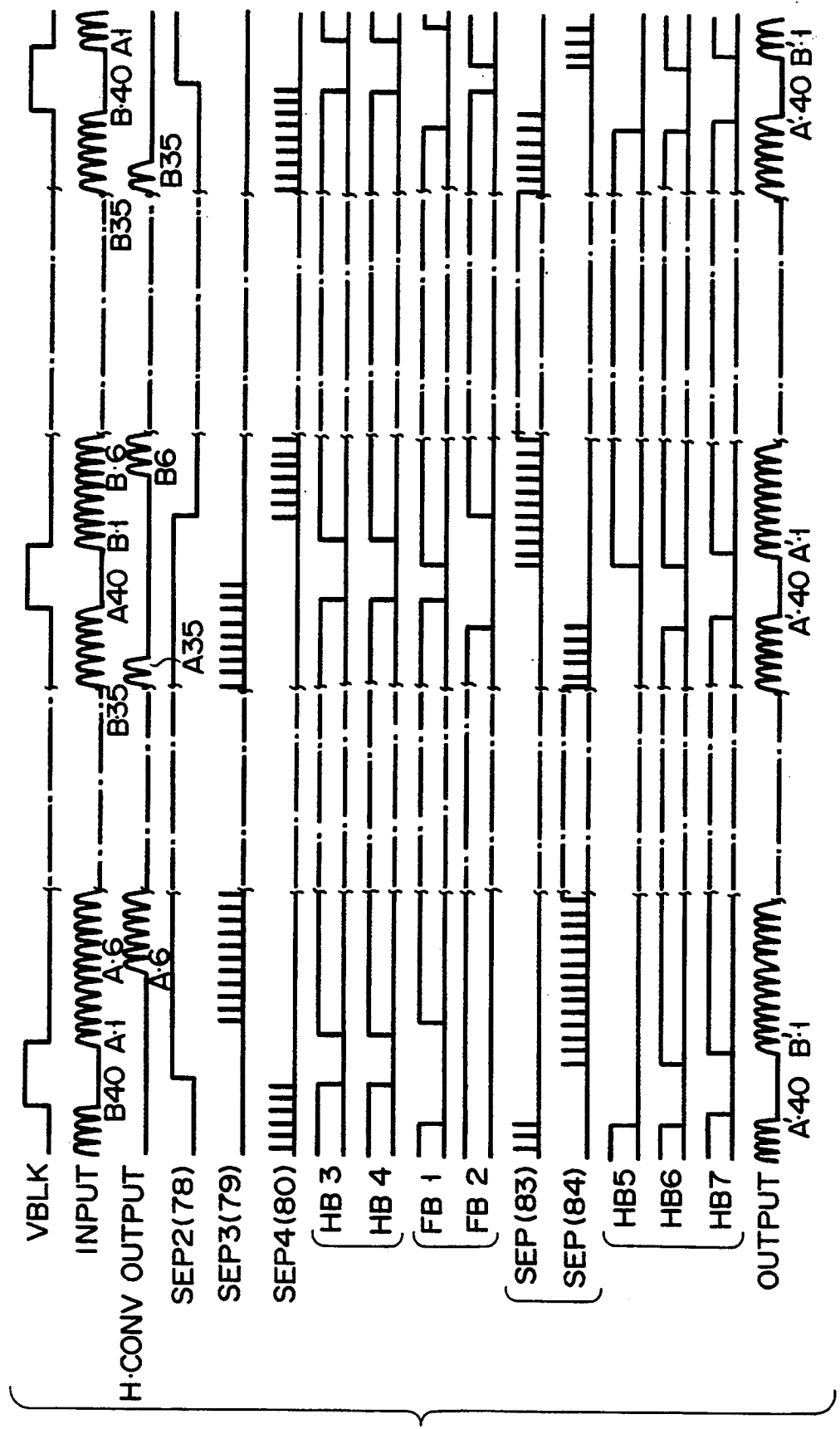

FIG. 23 is a timing chart illustrating the waveforms of the signal which drives the CCD-signal converting device 51 during the vertical scanning period. FIG. 24 is a timing chart which is expanded along the time-axis and represents the waveforms of the signals used in the CCD-signal converting device 51.

Let us assume that signals representing an odd-numbered frame are being input to the CCD-signal converting device 51. In this case, the horizontal operation unit 59 starts outputting signals upon lapse of a one-line scanning period after the first of the signals has been input to the unit 59. Hence, the horizontal buffer 60 starts transferring the signals upon lapse of a one-line scanning period following the vertical blanking period. At the beginning of the next horizontal blanking period, the signal charges representing one scanning line are transferred from the horizontal buffer 60 to the frame buffer 62 through the separator 79. While the signals are being written into the frame buffer 62, the horizontal buffer 61 discharges unnecessary signal charges into the drain 77 through the separator 78. It is better to discharge the signal charges into the drain 77 than to stop the horizontal buffer 61 during this period in order to prevent the necessary charges (e.g., charges resulting from noise) from entering the charge transfer path.

When signals representing an odd-numbered frame are being input, the separators 78 and 79 stop functioning. The horizontal buffer 60 holds signal charges while the stoppers 78 and 79 remain to function in the horizontal blanking period. These signal charges are only continuously transferred to the horizontal buffer 61, and are then written from the buffer 61 into the frame buffer 63 through the separators 80. This means that the writing of signal charges into the frame buffer 63 is started upon lapse of two one-line scanning periods following the vertical blanking period. While the signal charges are being written into the frame buffers 62 and 63, the unnecessary charge is discharged into the drains 77 from the last CCD stage of either frame buffer through the separators 83 or 84. Of the signal charges written into either frame buffer, those representing the first five scanning lines are discarded into the drains at the beginning of the next vertical blanking period.

In FIG. 23, VBLK is a vertical blanking signal, HCONV is the output generated by the horizontal operation unit 59, SEP2(78), SEP3(79), SEP4(80), SEP(83) and SEP(84) are the drive signals supplied to the separators 78, 79, 80, 83 and 84, respectively. Also in FIG. 23, HB3, HB4, HB5, HB6 and HB7 are the drive signals supplied to the horizontal buffers 60, 61, 64, 65 and 67, respectively, and FB1 and FB2 are the drive signals supplied to the frame buffers 62 and 63.

FIGS. 25A and 25B and FIGS. 26A and 26B are timing charts showing the waveforms of drive signals which are used for reading signals from the frame buffers 62 and 63 and for actuating the vertical operation unit 66. During the first horizontal scanning period following the vertical blanking period, the signal charges are read from the frame buffer 62 via the separators and then transferred from the horizontal buffer 64 to the horizontal buffer 65. During the horizontal blanking period immediately preceding the first horizontal scanning period, the signal charges are read from the frame buffer 63 via the separators directly into the horizontal buffer 65.

The vertical operation unit 66 processes signal charges representing each entire horizontal scanning line, at the same time, in order to expand the line in the vertical direction. Its operating scheme is just the same as has been explained with reference to FIGS. 14A, 14B, 15, and 16.

Figure 25B:
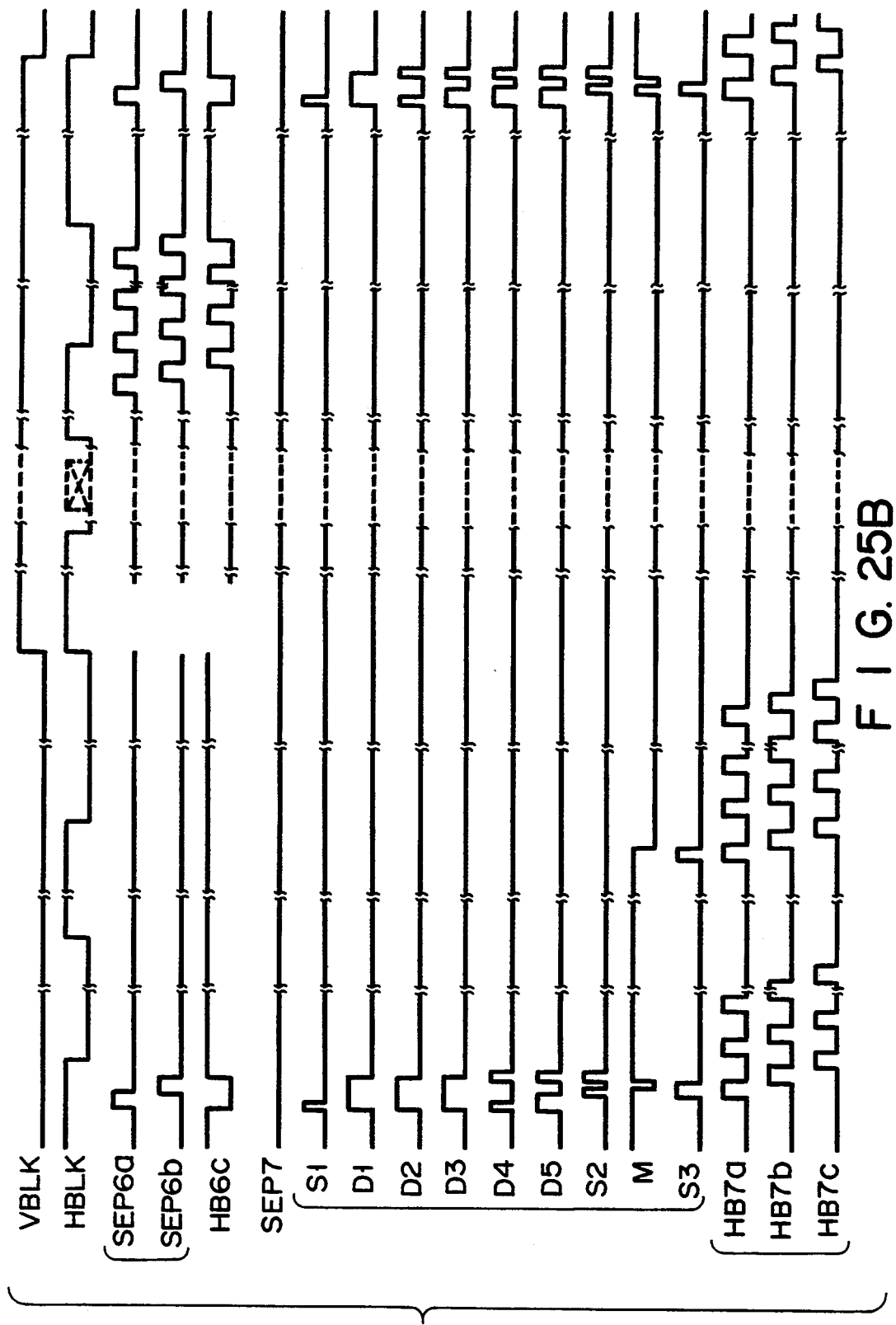

FIG. 25A illustrates how the signal charges are transferred from the horizontal buffer 65 to the vertical operation unit 66, and how they are transferred in the horizontal buffer 67. FIG. 25B explains how the signal charges are transferred from the horizontal buffer 64 to the vertical operation unit 66 through the horizontal buffer 65, and hence to the horizontal buffer 67, how they are processed by the unit 66, and how they are transferred in the horizontal buffer 67.

Figure 26A:
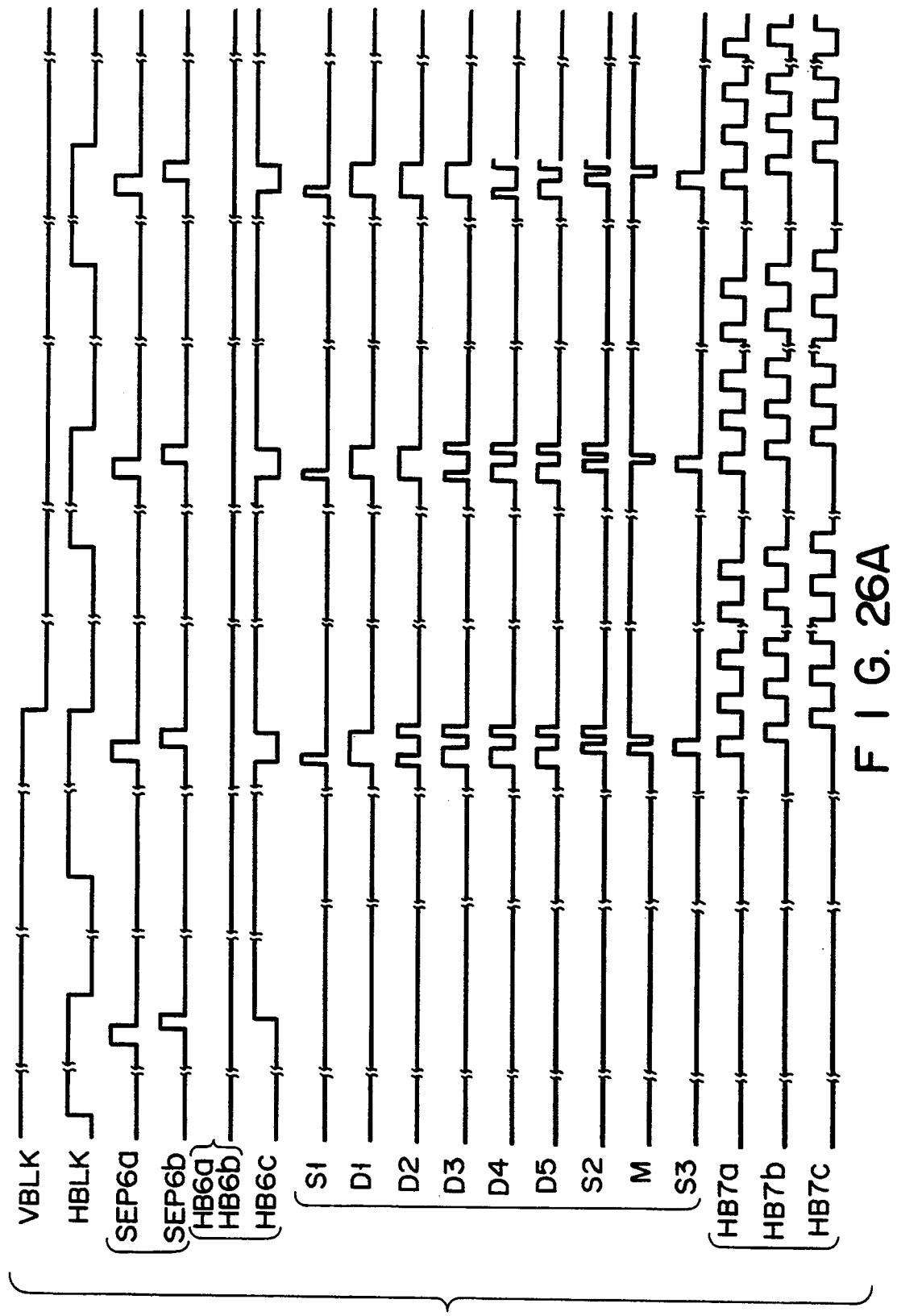
Figure 26B:
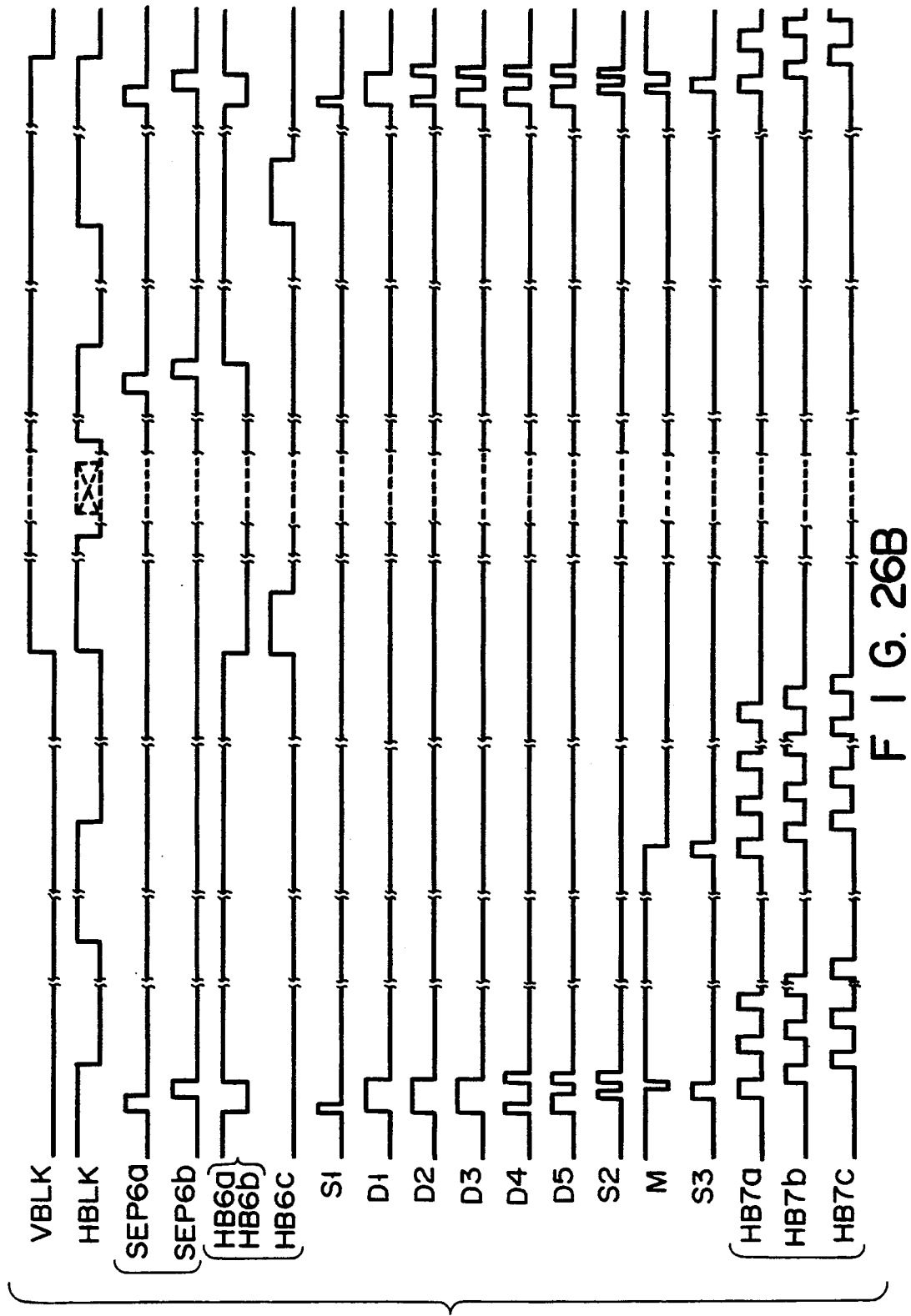

FIGS. 26A and 26B are timing charts representing the waveforms of the various drive signals used in the vertical operation unit 66. These figures explain how signals are transferred from the horizontal buffer 65 to the vertical operation unit 66, in units of three scanning lines, and also how the unit 66 processes the signals thus transferred from the horizontal buffer 65.

As the drive signals are supplied to the various components of the CCD-signal converting device 51 in the specific sequence described above, the signals input to the device 51 are converted to new pixel signals, one after another. It is true that any signal output by the device 51 is delayed by a one-frame period with respect to the corresponding input signal. This delay, however, makes no practical problems.

The two frame buffers 62 and 63 are indispensable in the CCD-signal converting device 51 illustrated in FIGS. 18 and 19. This is because the device 51 is designed to process signals representing moving images. If the device 51 needs to process the signals representing still images only, it need not be provided with either frame buffer.

Non-Interlaced Monochrome TV System 2

Figure 28:
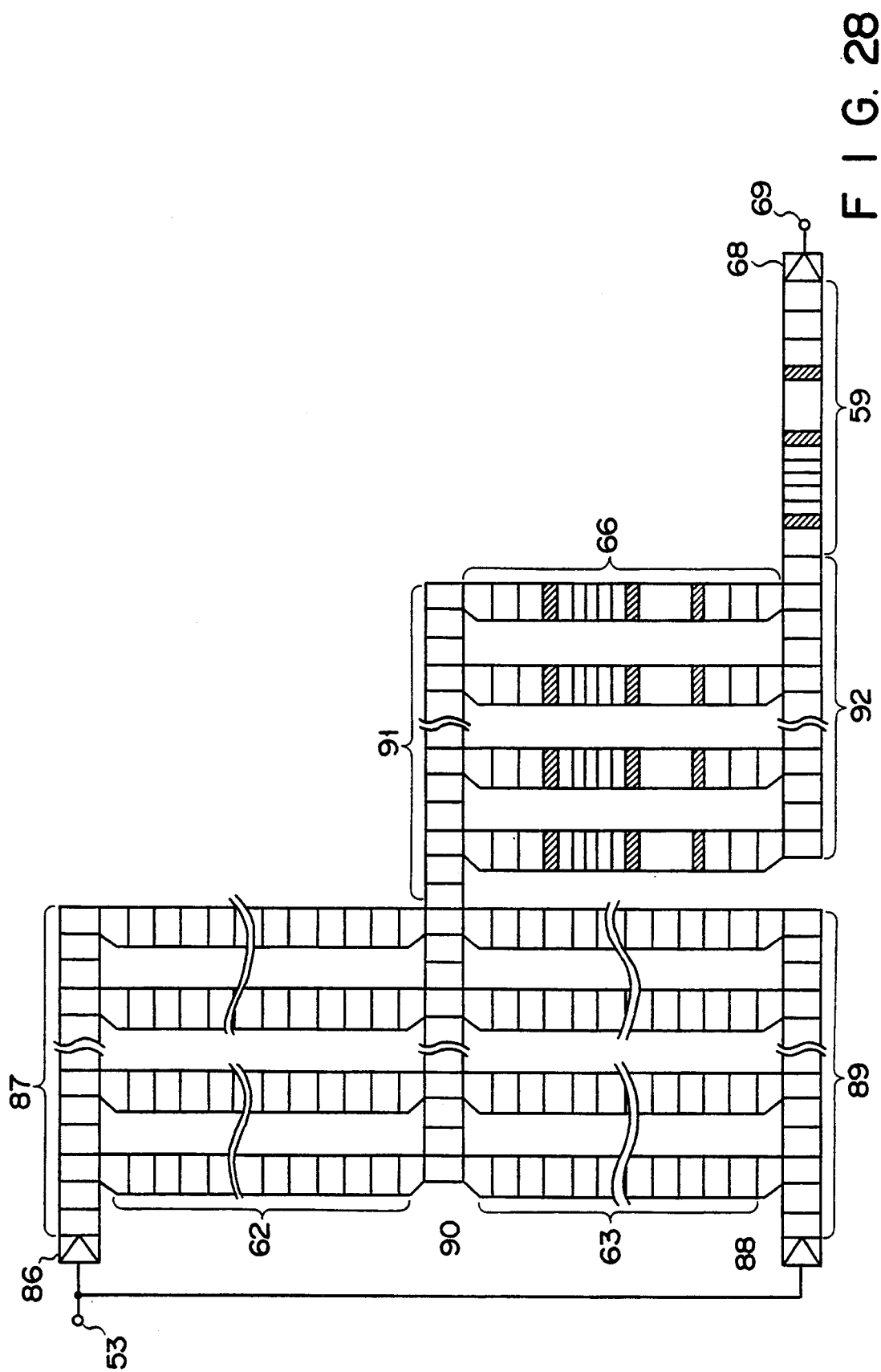
FIG. 28 is a schematic plan view of the CCD section of the signal-converting device shown in FIG. 27.

In the CCD-signal converting device 51 of FIGS. 18 and 19, the vertical operation unit 66 is located at an output stage of the horizontal operation unit 59. Nevertheless, the present invention can be applied to a CCD-signal converting device in which a vertical operation unit is located at an input stage of a horizontal operation unit, as is illustrated in FIGS. 27 and 28. In FIGS. 27 and 28, the same numerals designate the same components as those illustrated in FIGS. 18 and 19. The CCD-signal converting device shown in FIGS. 27 and 28 converts input signals in the same way as the device 51 illustrated in FIGS. 18 and 19. Therefore, its operation will not be described in detail.

The signal charge at an input terminal 53 is supplied to two charge-injecting units 86 and 88. During an odd-numbered field period, the signal charges which the charge-injecting unit 86 has sampled are supplied to a frame buffer 62 through a horizontal buffer 87. During an even-numbered field period, the signal charges which the charge-injecting unit 88 has sampled are supplied to a frame buffer 63 through a horizontal buffer 89. The signals output by the fame buffers 62 and 63 are transferred, in units of scanning lines alternately, via a horizontal buffers 90 and to a vertical operation unit 66. The unit 66 processes these signals such that the image represented by the signals is enlarged or reduced in the vertical direction. The signals output by the unit 66 are transferred to a horizontal buffer 92. The signals are read from the horizontal buffer 92 in units of horizontal scanning lines, and are subsequently input to a horizontal operation unit 59. The unit 59 processes these signals such that the image represented by the signals is enlarged or reduced in the horizontal direction. The signals the unit 59 outputs are input to an output-voltage converting unit 68. They are converted to voltage signals, which are supplied to an output terminal 69.

As is shown in FIG. 27, the CCD-signal converting device also has a drive signal generator 70, an external clock input terminal 71, a clock-synchronized unit 72, a control input terminal 73, a decoder 74, and a ROM 75—like the CCD-signal converting device 51 illustrated in FIGS. 18. Needless to say, however, the drive signal generator 70 generates drive signals in a scheme different from the scheme adopted in the device 51 of FIG. 18.

FIG. 28 is a schematic plan view of the CCD-signal converting device shown in FIG. 27. In FIG. 28, the same numerals denote the same components as those illustrated in FIG. 27.

Non-Interlaced Monochrome TV System 3

Both CCD-signal converting devices, one shown in FIGS. 18 and 19 and the other shown in FIGS. 27 and 28, have two frame buffers each. If either CCD-signal converting device is formed on a single semiconductor chip, the frame buffers occupy a greater part of the chip surface. As is known in the art, frame buffers are expensive components. Hence, it is desirable that a CCD-signal converting device have only one frame buffer so that it can be manufactured at lower cost.

A CCD-signal converting device which is another embodiment of the invention and which has only one frame buffer will now be described with reference to FIGS. 29 and 30.

As has been described, all signal charges in each line are transferred in the vertical direction at the same time in either frame buffer used in the CCD-signal converting devices shown in FIGS. 18 and 28. By contrast, in the CCD-signal converting device shown in FIG. 29, drive signals for transferring signal charges in the vertical direction are switched for one part of the frame buffer 94 and for another part thereof. As a result of this, some signal charges are read from one part of the buffer 94, while signals are written from another part of the buffer 94. Since the signal-writing and the signal-reading are simultaneously performed, a single frame buffer 94 suffices in the device illustrated in FIGS. 29. Hence, this can be a small CCD-signal converting device.

The video signals input to an input terminal 53 are sequentially supplied to a charge-injecting unit 54, which outputs signal charges. The signal charges are input to a horizontal buffer 93. The signal charges output by the horizontal buffer 93 are input to the frame buffer 94 in units of scanning lines. The signal charges are written into, and read from, the frame buffer 94 in a scheme specified to the embodiment shown in FIG. 29, as will be described later with reference to FIG. 31. The signal charges output by the frame buffer 94 are input to a vertical operation unit 66. The unit 66 processes the signal charges such that the image represented by the signal charges is expanded in the vertical direction. The signal charges output by the unit 66 are stored into a horizontal buffer 95. The signal charges are read from the buffer 95, in the units of horizontal lines, and are supplied to a horizontal operation unit 59. The unit 59 processes the input charge such that the image represented by these charge is expanded in the horizontal direction. The signal charge obtained by this processing are supplied from the unit 59 to an output-voltage converting unit 68. The unit 68 converts the signal charges to signal voltages, which are output from an output terminal 69.

Figure 29:
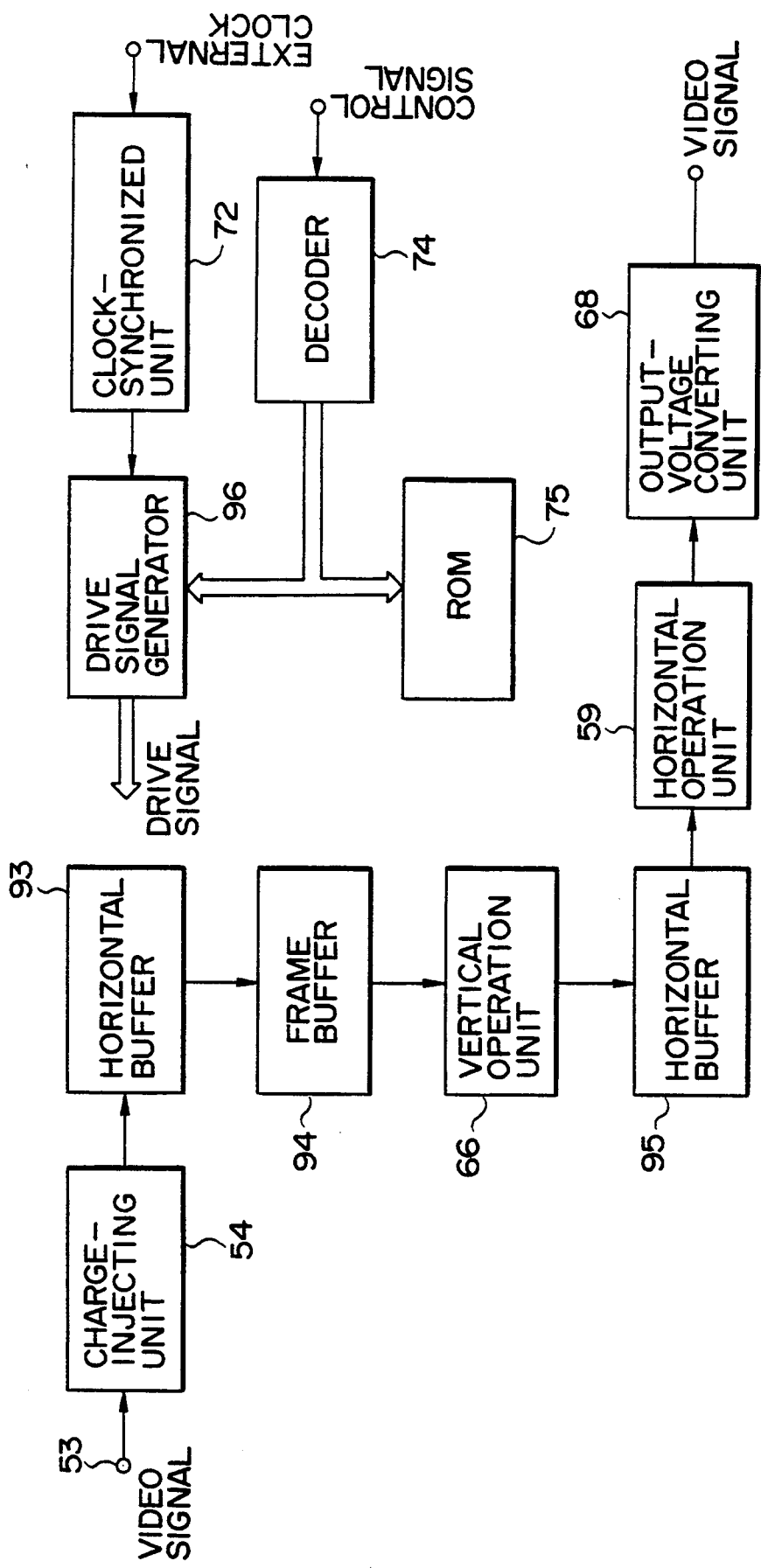
FIG. 29 is a block diagram illustrating still another signal-converting device according to this invention.

FIG. 30 is a schematic plan view of the CCD-signal converting device shown in FIG. 29. In FIG. 30, the same numerals denote the same components as are shown in FIG. 29.

Figure 31A:
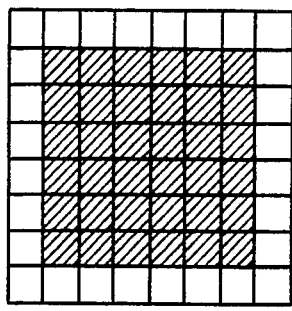
FIGS. 31A to 31J are schematic plan views of a frame buffer, explaining how the signal charges are transferred in the frame buffer.
Figure 31B:
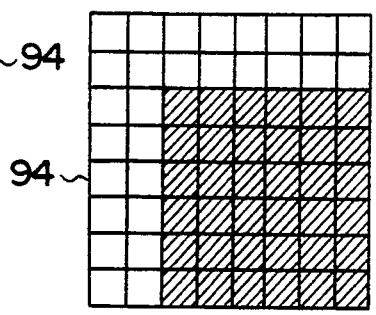

FIGS. 31A to 31J are schematic plan views of the frame buffer 94, explaining how the signal charges are transferred in the frame buffer 94. In FIG. 31A, the shaded squares represent the signal charges corresponding to the pixels forming that portion of an image which is to be enlarged. In FIG. 31B, the shaded squares indicate the signal charges corresponding to the pixels forming a first frame to be read from the frame buffer 94 to the vertical operation unit 66.

The pixels of the first horizontal line are discarded at the time of transferring the signal charges from the horizontal buffer 93 to the frame buffer 94. As a result of this the first frame is moved to the right and lower in the frame buffer 94.

FIGS. 31C to 31F explain how the scanning lines forming the first frame are read, one by one, from the frame buffer 94 to the vertical operation unit 66, and how the scanning lines forming the second frame are written, one by one, into the frame buffer 94 from the horizontal buffer 93.

Figure 31C:
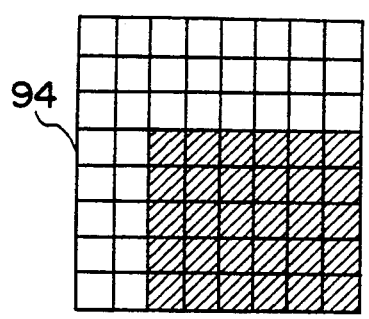
Figure 31D:
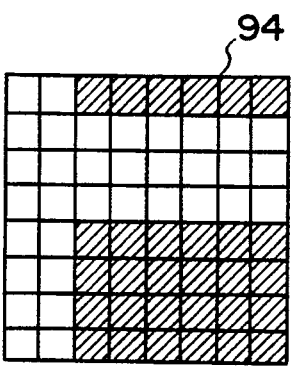
Figure 31E:
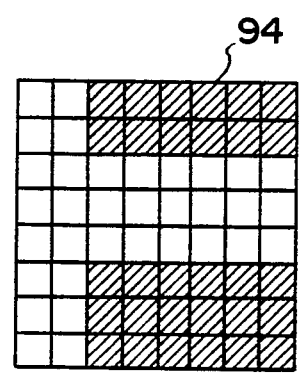
Figure 31F:
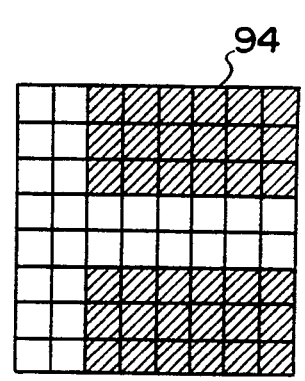

To enlarge the first frame at the magnification of 4/3, the first three horizontal scanning lines of the first frame are read from the frame buffer 94, one by one, to the vertical operation unit 66, as is shown in FIGS. 31C, 31D, and 31E. The unit 66 converts the signal charges representing the first three horizontal scanning lines to new signal charges representing four horizontal scanning lines by the method explained with reference to FIGS. 7A to 7E. As is evident from FIG. 31E, the signal charges showing the last three horizontal scanning lines of the first frame remain in the frame buffer 94.

In the meantime, the first two of the horizontal scanning lines forming the second frame are written into the frame buffer 94, one by one, as is illustrated in FIG. 31D and 31E. Next, as can be understood from FIG. 31F, the signal charges showing the last three scanning lines of the first frame are not transferred in the vertical direction, while those representing the third scanning line of the second frame are being written into the frame buffer 94. As a result, the spacing between the first-frame data and the second-frame data is reduced by one horizontal scanning line, as can be understood from FIGS. 31E and 31F.

Figure 31G:
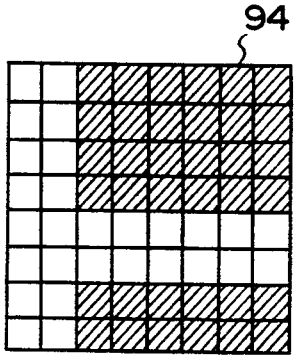
Figure 31H:
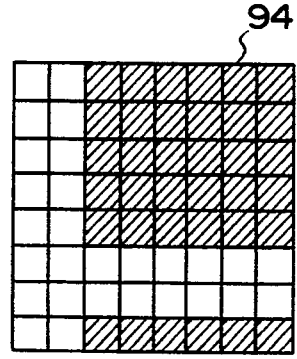
Figure 31I:
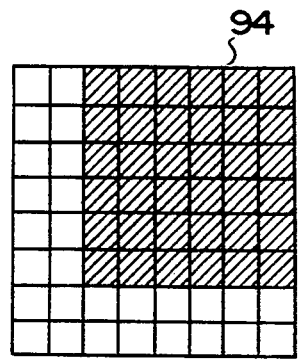
Figure 31J:
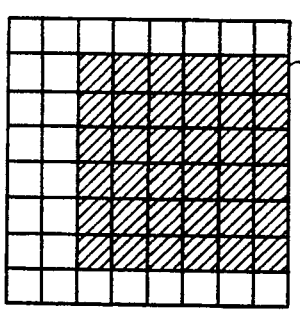

Thereafter, as is illustrated in FIGS. 31G, 31H, and 31I, the signal charges representing the first frame are read from the frame buffer 94, line by line, whereas the signal charges showing the second frame are written into the buffer 94 line by line. As is shown in FIG. 31I, all signal charges representing the first frame are read from the buffer 94, and, at the same time, the signal charges representing the last scanning line of the second frame are written into the buffer 94. Next, as is illustrated in FIG. 31J, the signal charges representing the second frame are transferred in the vertical direction by a one-line distance. At this time, the first-frame data is stored in the buffer 94 in its entirety.

The two-line spacing is maintained between a one-frame data and the next one-frame data, by driving the CCD electrodes in such a way that no signal charges are applied on two adjacent rows of CCD electrodes at any time while the signal charges are transferred in the frame buffer 94.

To accomplish the transfer of signal charges in the frame buffer 94 in the method (FIGS. 31A to 31J), it is necessary to drive all CCD electrodes of the buffer 94 independently of one another. The independent driving of the CCD electrodes can easily and reliably be achieved by virtue of the multi-layered wiring technology, recently developed, which enables the manufacture of semiconductor devices having CCD elements and MOS transistors formed on one and the same chip.

The drive signals for driving the CCD electrodes of the frame buffer 94 are generated by the drive signal generator 70 at the desired timing, in accordance with the CCD-driving program stored in the ROM 75. Needless to say, the timing of driving the CCD electrodes is altered in accordance with the location of that part of the image which is to be enlarged and/or the magnification at which to enlarge the image.

Addition of Interlacing Means

All embodiments described above are designed for use in non-interlaced video movie cameras. Nevertheless, this invention can be applied to interlaced video movie cameras. A signal-converting device adapted for use in an interlaced video movie camera will now be described.

Figure 32A:
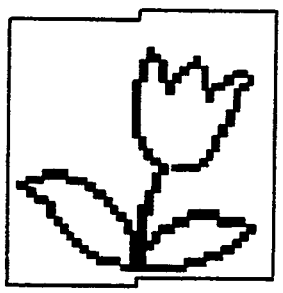
FIGS. 32A to 32C are views showing an image, explaining interlaced scanning.
Figure 32B:
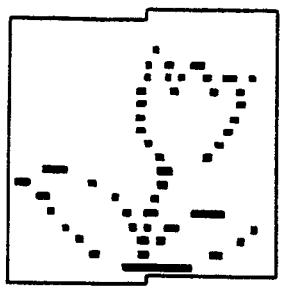
Figure 32C:
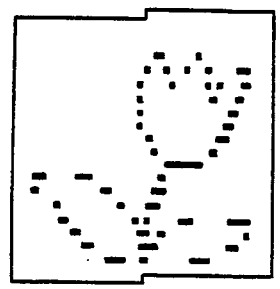

FIGS. 32A to 32C are diagrams showing various types of images, explaining interlaced scanning. FIG. 32A illustrates a frame image of a tulip, formed of pixels arranged on all scanning lines. The frame image is split into two field images shown in FIGS. 32B and 32C, respectively. The first field image (FIG. 32B) is formed by the pixels arranged in the odd-numbered scanning lines. The second field image (FIG. 32C) is formed by the pixels arranged in the even-numbered scanning lines. Hence, either field image consists of half the scanning lines forming the original image (FIG. 32A). The video signals representing odd-number field images and those representing even-numbered field images are alternately transmitted. Hence, each video signal input to the signal-converting device is discontinuous in the vertical direction. In order to enlarge or reduce the original image, the field images are combined into a frame image. Then, the signals representing the frame image are converted to new signals which represent an enlarged image. The new signals are distributed, forming two groups which define two field images.

Figure 33A:
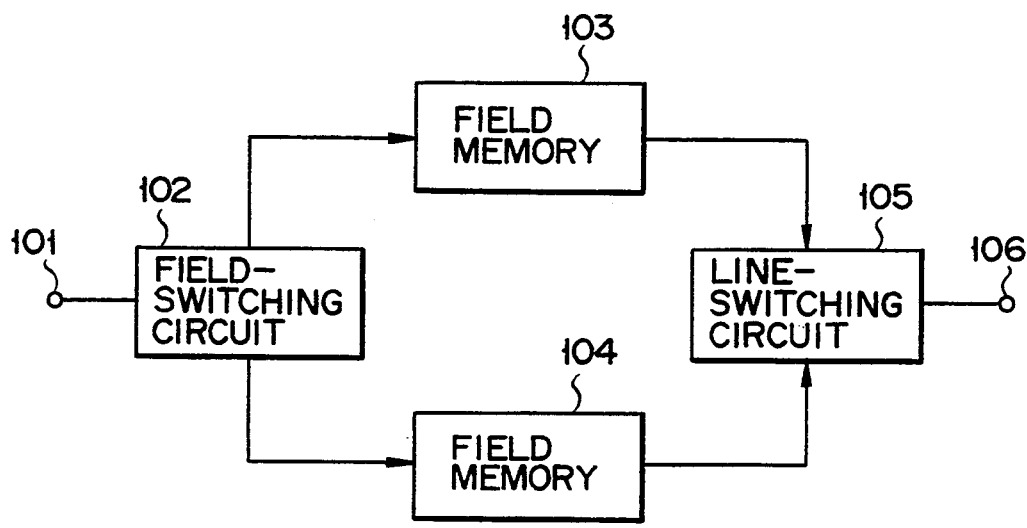
FIGS. 33A and 33B are block diagrams showing two types of interlace converters which may be used to perform the interlaced scanning.
Figure 33B:
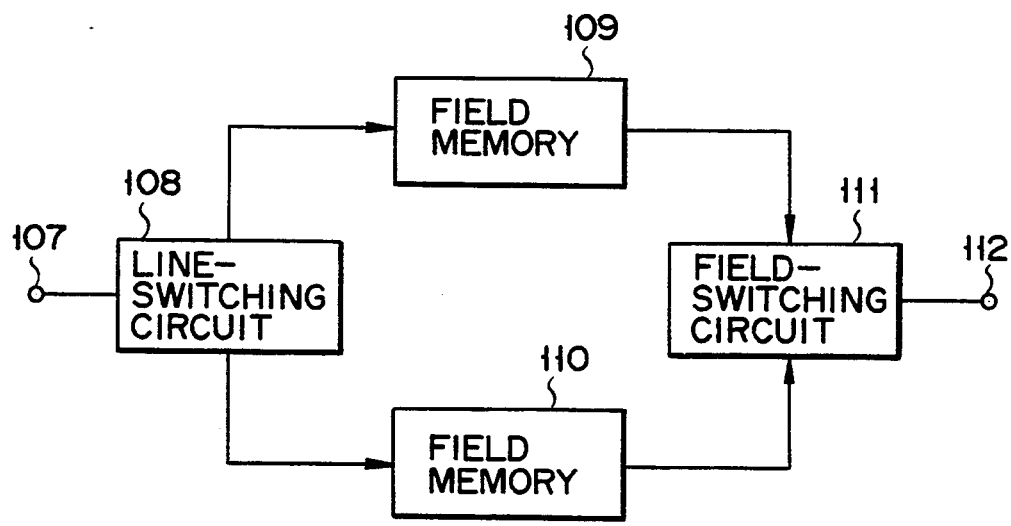

FIG. 33A is a block diagram showing an interlace converter designed to convert interlaced signals into non-interlaced signals. FIG. 33B is a block diagram showing an interlace converter of another type designed to convert non-interlaced signals to interlaced signals. Either interlace converter can be made by using a CCD, only if the frame buffers incorporated in it and the drive signals are modified a little.

The interlace-to-noninterlace converter, shown in FIG. 33A, will be described first. Interlaced video signals input to an input terminal 101 are supplied to a field-switching circuit 102. The circuit 102 distributes the pixel signals forming an odd-numbered field image to a first field memory 103, and the pixel signals forming an even-numbered field image to a second field memory 104. The signals output by the first field memory 103 are supplied to a line-switching circuit 105. The signals output by the second field memory 104 are supplied to the line-switching circuit 105, too. The circuit 105 outputs the signals of the first field image and those of the second field image, alternately in units of scanning lines, to an output terminal 106. As a result of this, the first field-image signals and the second field-image signals are combined, forming non-interlaced pixel signals.

The noninterlace-to-interlace converter, shown in FIG. 33B, will be now described. Non-interlaced video signals input to an input terminal 107 and representing a frame image are supplied to a line-switching circuit 108. The circuit 108 distributes the pixel signals representing the odd-numbered scanning lines of the frame image to a first field memory 109, and the pixel signals representing the even-numbered scanning lines of the frame image to a second field memory 110. The signals output by the first field memory 109 are supplied to a field-switching circuit 111. The signals output by the second field memory 110 are supplied to the field-switching circuit 111, too. The circuit 111 outputs the signals of the first field image to an output terminal 112, and then those of the second field image to the output terminal 112.

Figure 34A:
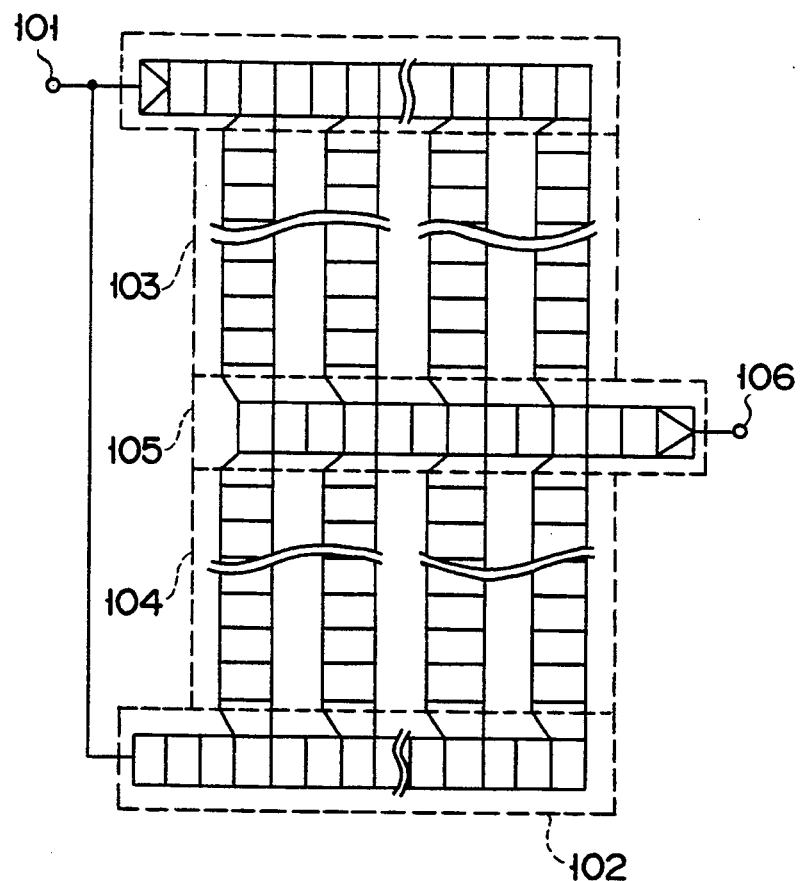
FIGS. 34A and 34B schematically illustrate two interlace-noninterlace converters, either comprising a CCD.
Figure 34B:
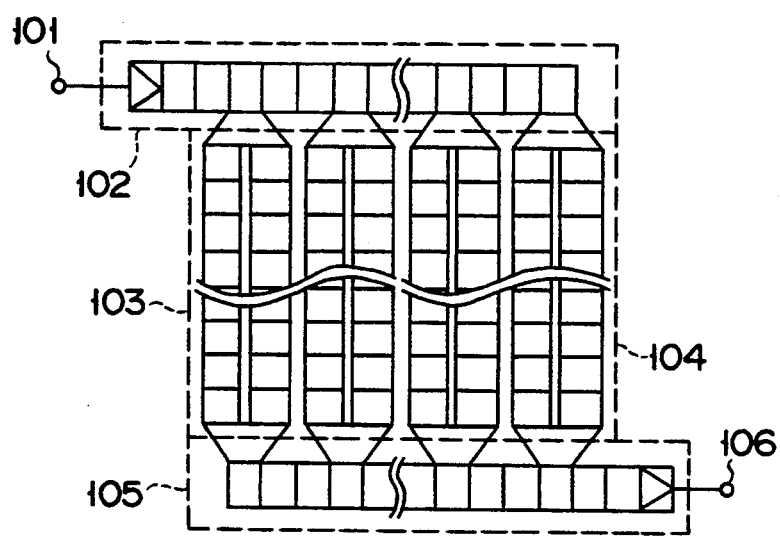

FIGS. 34A and 34B are plan views of two types of interlace-to-noninterlace converters, each comprising a CCD. In these figures, the broken-line boxes indicate the components 102, 103, 104, and 105—all shown in FIG. 33A. In either type of the interlace-to-noninterlace converter, the field-switching circuit 102 comprises a charge-injecting unit and a horizontal buffer, and the line-switching circuit 105 comprises a high-speed horizontal buffer, as can be understood from FIGS. 34A and 34B.

Although not illustrated, the noninterlace-to-interlace converter shown in FIG. 33B can be of the same structure as the interlace-to-noninterlace converter of FIG. 34A or the interlace-to-noninterlace converter of FIG. 34B, provided that the CCD is driven by signals different from the CCD-driving signals used in the converters shown in FIGS. 34A and 34B.

Figure 35:
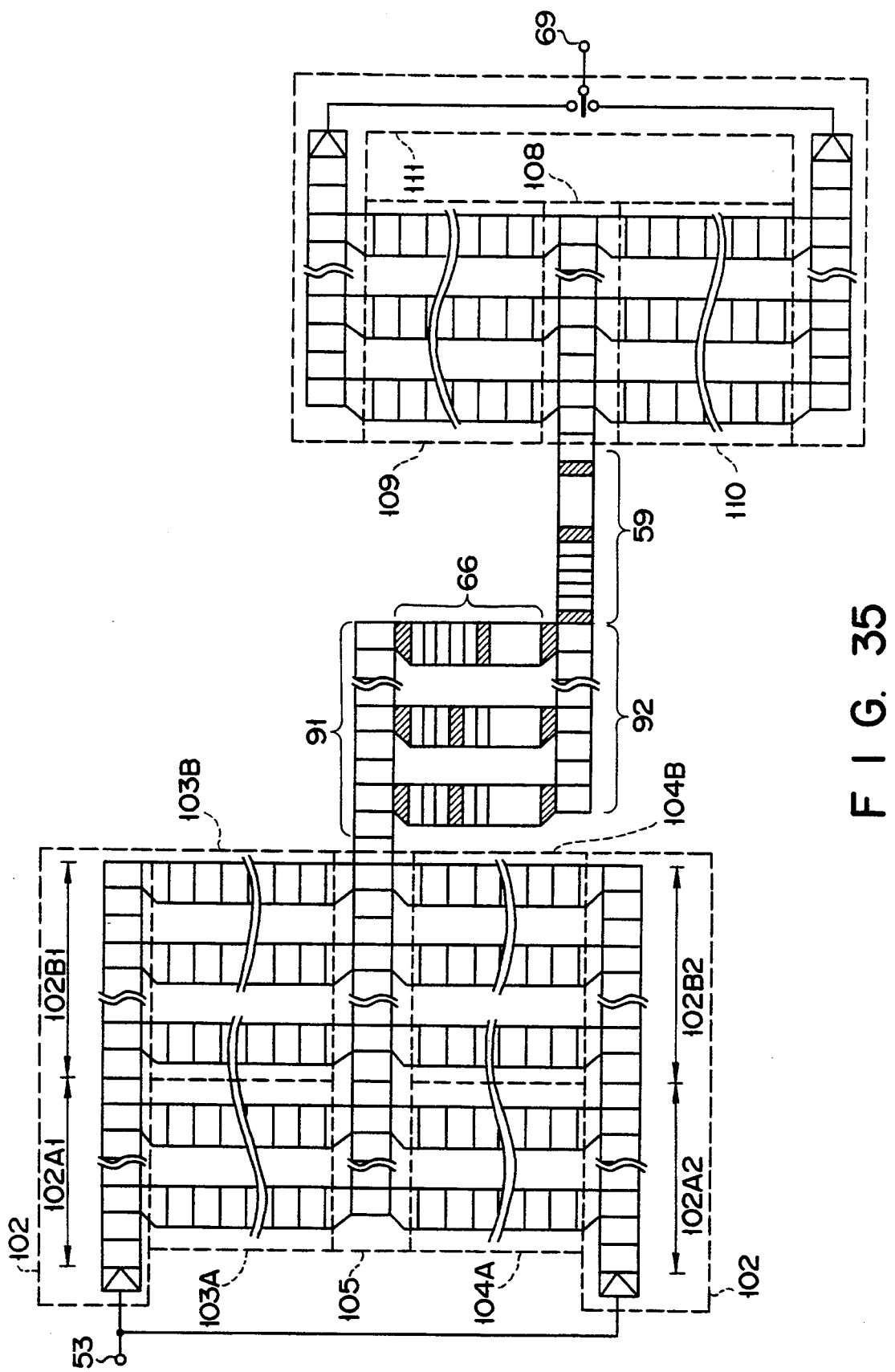

FIGS. 35 and 36 schematically show other two signal-converting devices according to the invention, each comprising an interlace-to-noninterlace converter, a noninterlace-to-interlace converter, an image-enlarging unit, and an image-reducing unit. In these figures, the same numerals designate the same components as those illustrated in FIGS. 27, 28, 33A, 33B, 34A and 34B.

The signal-converting device shown in FIGS. 35 will be described first.

As is evident from FIG. 35, the interlaced signals supplied to an input terminal 53 are input to a field-switching circuit 102. The circuit 102 divides the signals into two groups, the first group forming an odd-numbered field image, and the second group forming an even-numbered field image. The field-switching circuit 102 comprises two voltage-applying units connected to the input terminal 53, and a plurality of horizontal buffers connected to the voltage-applying units. Of the horizontal buffers, the horizontal buffers 102A1 and 102B1 are coupled in cascade to each other and connected to the inputs of the field memories 103A and 103B, and the horizontal buffers 102A2 and 102B2 are coupled in cascade to each other and are connected to the inputs of the field memories 104A and 104B. The signal-converting device shown in FIGS. 35 further comprises a line-switching circuit 105 connected to the outputs of the field memories 103A, 103B, 104A and 104B. The line-switching circuit 105 has two cascade-connected horizontal buffers.

The embodiment of FIG. 35 has two interlace converters. Two converters are required because it is necessary to adjust the timing of transferring signal charges in the vertical direction in the scheme explained with reference to FIGS. 27 and 28 in order to enlarge or reduce the input image. More specifically, while the non-interlaced signals output by the field memories 103A and 104A are being processed such that the image they represent is enlarged or reduced, non-interlaced signals are written into the field memories 103B and 104B. Also, while the non-interlaced signals output by the field memories 103B and 104B are being processed such that the image they represent is enlarged or reduced, non-interlaced signals are written into the field memories 103A and 104A.

The signals output by a line-switching circuit 105 are input to a horizontal buffer 91. The buffer 91 outputs signals, in units of scanning lines, to a vertical operation unit 66. The vertical operation unit 66 processes the input signals, such that the image represented by these signals is either expanded or contracted in the vertical direction. The signals output by the unit 66 are supplied to a horizontal operation unit 59 through a horizontal buffer 92. The horizontal operation unit 59 processes the signals, such that the image represented by these signals is expanded or contracted in the horizontal direction, and outputs non-interlaced signals.

The non-interlaced signals output by the horizontal operation unit 59 are input to a line-switching circuit 108. The circuit 108 comprises a horizontal buffer. It distributes the pixel signals representing the odd-numbered scanning lines of the frame image to a first field memory 109, and the pixel signals representing the even-numbered scanning lines of the frame image to a second field memory 110. The signals output by both field memories 109 and 110 are supplied to a field-switching circuit 111. The circuit 111 outputs the signals of the first field image to an output terminal 69, and then those of the second field image to the output terminal 69. The field-switching circuit 111 comprises a horizontal buffer connected to the output of the first field memory 109, a horizontal buffer connected to the output of the second field memory 110, and a switch for selecting some of the signals output from these horizontal buffers, for the first field image, and the remaining ones of the signals, for the second field image.

The signal-converting device shown in FIGS. 36 will now be described. As is evident from FIG. 36, the interlaced signals supplied to an input terminal 53 are input to a field-switching circuit 102. The circuit 102 comprises two horizontal buffers 102A1 and 102A2 connected in cascade. Two field memories 103A and 103B are connected to the horizontal buffer 102A1, and two field memories 104A and 104B are coupled to the horizontal buffer 102A2. Two field memories are provided for either horizontal buffer, in order to adjust the timing of converting signals, frame by frame.

To obtain non-interlaced signals for the first frame, from the first field-image signals and the second field-image signals, use is made of, for example, the horizontal buffer 102A1 and the field memories 103A and 103B. To obtain interlaced signals for the second frame, from the third field-image signals and the fourth field-image signals, use is made of the horizontal buffer 102A2, to which the signals output by the buffer 102A2 are supplied, and the field memories 104A and 104B.

The signals output by the field memories 103A, 103B, 104A and 104B are input to a line-switching circuit 105. The circuit 105 comprises two horizontal buffers connected in cascade. The first horizontal buffer is connected to the field memories 103A and 103B, and the second horizontal buffer is connected to the field memories 104A and 104B.

To read out the signals forming the first frame, the signals in the field memory 103A and the signals in the field memory 103B are read out alternately in units of scanning lines, and are supplied to a vertical operation unit 66. To read the signals forming the second frame, the signals in the field memory 104A and the signals in the field memory 104B are read out, alternately in units of scanning lines, and are supplied to a vertical operation unit 66. The unit 66 processes the input signals such that the image represented by these signals is expanded or contracted in the vertical direction. The signals output by the unit 66 are input to a horizontal operation unit 59. The unit 59 processes the signals such that the image represented by these signals is either expanded or contracted in the horizontal direction. The horizontal operation unit 59 outputs non-interlaced signals. The non-interlaced signals are input to a line-switching circuit 108.

The line-switching circuit 108 has a storage capacity large enough to store non-interlaced signals representing at least one scanning line. To convert these non-interlaced signals to interlaced signals, the circuit 108 distributes the pixel signals representing the odd-numbered scanning lines of the frame image to a first field memory 109, and the pixel signals showing the even-numbered scanning lines of the frame image to a second field memory 110. The signals stored in the field memories 109 and 110 are input to the field-switching circuit 111. The circuit 111 outputs the signals of the first field image to an output terminal 112, and then those of the second field image to the output terminal 112. All signals supplied to the output terminal 112 are interlaced signals which represent the image, either enlarged or reduced.

In some cases, it is required that non-interlaced signals which represent the image, enlarged or reduced, be supplied to the output terminal 112. To meet this requirement, the non-interlaced signals are transferred from the line-switching circuit 108 to a horizontal buffer 108A, and then from the buffer 108A to the output terminal 112.

Addition of Superimposing Means

The present invention can be applied to video movie cameras which can superimpose one image upon another. A signal-converting device designed for use in video movie cameras capable of superimposing an image on another will now be described.

It is often demanded that an enlarged or reduced image be superimposed on another larger image, thus forming a composite image. According to the invention, there can be easily provided a signal-converting device which has superimposing means for supplying drive signals to a CCD at specific timing to combine the signals representing one image with those representing another image, thereby forming a composite image.

Figure 37:
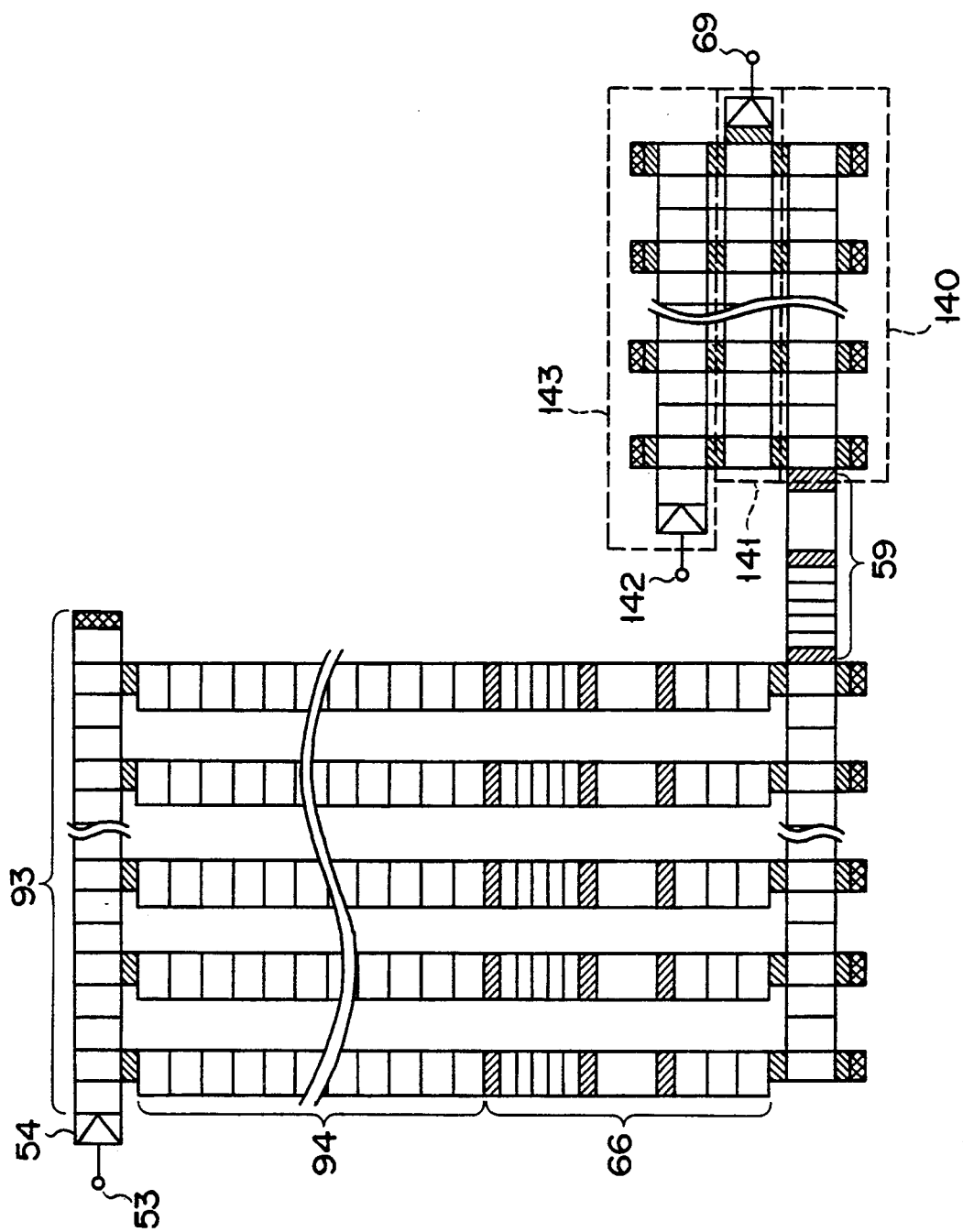
FIG. 37 schematically illustrates a signal-converting device capable of performing superimposing.

FIG. 37 schematically illustrates a signal-converting device having superimposing means. Various methods of generating CCD-driving signals are known in the art. One of them is the so-called "picture-in-picture (PIP) method." The PIP method is totally equivalent to a method of superimposing one image on another. It can therefore be applied to the signal-converting device of the present invention.

As is shown in FIG. 37, the signal-converting device comprises an input terminal 53, a charge-injecting unit 54, a horizontal operation unit 59, a vertical operation unit 66, an output terminal 69, a horizontal buffer 93, a frame buffer 94, and a horizontal buffer 95—all identical to those illustrated in FIG. 29. The device further comprises a horizontal buffer 140, a selection buffer 141, an input terminal 142, and a horizontal buffer 143.

The signals, which have been output by the horizontal operation unit 59 and represent the image enlarged or reduced, are supplied to the horizontal buffer 140. The selection buffer 141 supplies either the signals output by the horizontal buffer 140 or the signals output by the horizontal buffer 143, in units of scanning lines, to the output terminal 69. When a superimpose signal is supplied from the input terminal 142 to the horizontal buffer 143, the selection buffer 141 selects the signals output by the horizontal buffer 143, which represent a small image to be superimposed on the image represented by the signals output by the horizontal buffer 140. As a result of this, the small image is superimposed on the image represented by the signals output from the buffer 140. Alternatively, the image, either enlarged or reduced, which is represented by the signals output from the buffer 140, can be superimposed on the image represented by the signals supplied to the input terminal 142. In either case, drive signals are supplied to the electrodes of the selection buffers 141 which receives and transfers the signal charges supplied from the horizontal buffer 140 or 143, at the timing defined by the programs stored in a ROM (not shown).

Though not shown in FIG. 37, the signal-converting device further comprises a detector which detects the time difference between the scanning period of the signals input to the horizontal buffer 140 and that of the signals input to the horizontal buffer 143. The detector outputs timing signals representing the time difference. The drive signals are generated in synchronism with the timing signals.

TV-System Conversion

As is generally known, various television systems are employed all over the world. Consequently, it is often impossible for us to enjoy seeing a program broadcast by a television station in a foreign country. For instance, the CCIR-M system is used in Japan, in which system 30 frames are transmitted and received every second, each frame consisting of 525 scanning lines. On the other hand, the CCIR-G system is adopted in most European countries, in which system 24 frames are transmitted and received every second, each frame consisting of 625 scanning lines. In order to convert the signals of one TV system to those of another TV system, various digital-signal processing techniques have been utilized.

The present invention can provide a relatively small signal-converting device able to convert the signals of one TV system to signals of another TV system. This device will be described, with reference to FIGS. 38, 39, 40, 41A and 41B.

FIG. 38 is a diagram explaining the gist of the technique of converting the signals of the CCIR-G system to the signals of the CCIR-M system. FIG. 38 is a block diagram showing the device for converting the CCIR-G signals to CCIR-M signals. This signal-converting device can be provided by combining the embodiments described above.

In FIG. 38, G1, G2, ... G5 and G1' are frame signals of the CCIR-G system. Five frame signals of the CCIR-G system are received every 0.2 seconds. These five CCIR G frame signals need to be converted to six CCIR-M frame signals M1 to M6 during the period of 0.2 seconds. In other words, to enable people to enjoy a CCIR-G TV program on a CCIR-M TV receiver, the signal-converting device converts five frames G1 to G5 to six frames M1 to M6 every 0.2 seconds. More specifically, the CCIR-G frame signals G1 to G5 are stored in a buffer. Then, the signal M1 is generated from the signal G1, the signal M2 from the signals G1 and G2, the signal M3 from the signals G2 and G3, the signal M4 from the signals G3 and G4, the signal M5 from the signals G4 and G5, and the signals M6 from the signal G5. The signal-converting device shown in FIG. 39 generates six CCIR-M frame signals M1 to M6 from five CCIR-G frame signals G1 to G5 every 0.2 seconds, as will be explained with reference to FIG. 39.

As is illustrated in FIG. 39, CCIR-G field signals are input to an input terminal 151. These CCIR-G field signals, which are interlaced signals, are supplied to a interlace-to-noninterlace converter 152. The converter 152 converts the interlaced signals to non-interlaced signals which form at least five frame signals G1 to G5 (FIG. 38). These non-interlaced signals are supplied to a frame memory 153, whereby the five frame signals G1 to G5 are stored in the frame memory 153. The five frame signals G1 to G5 are input to a frame converter 154. The frame converter 154 converts the CCIR-G frame signals G1 to G5 to CCIR-M frame signals M1 to M6 in the method explained with reference to FIGS. 7A to 7E. The CCIR-M frame signals M1 to M6, thus obtained, have not undergone scanning-line conversion, and are input to a scanning-line converter 155. The converter 155 converts the CCIR-G scanning lines to CCIR-M scanning lines. The output frame signals are non-interlaced, and are converted to interlaced signals by means of a noninterlace-to-interlace converter 156. The interlaced frame signals M1 to M6 are output from an output terminal 157.

Figure 40:
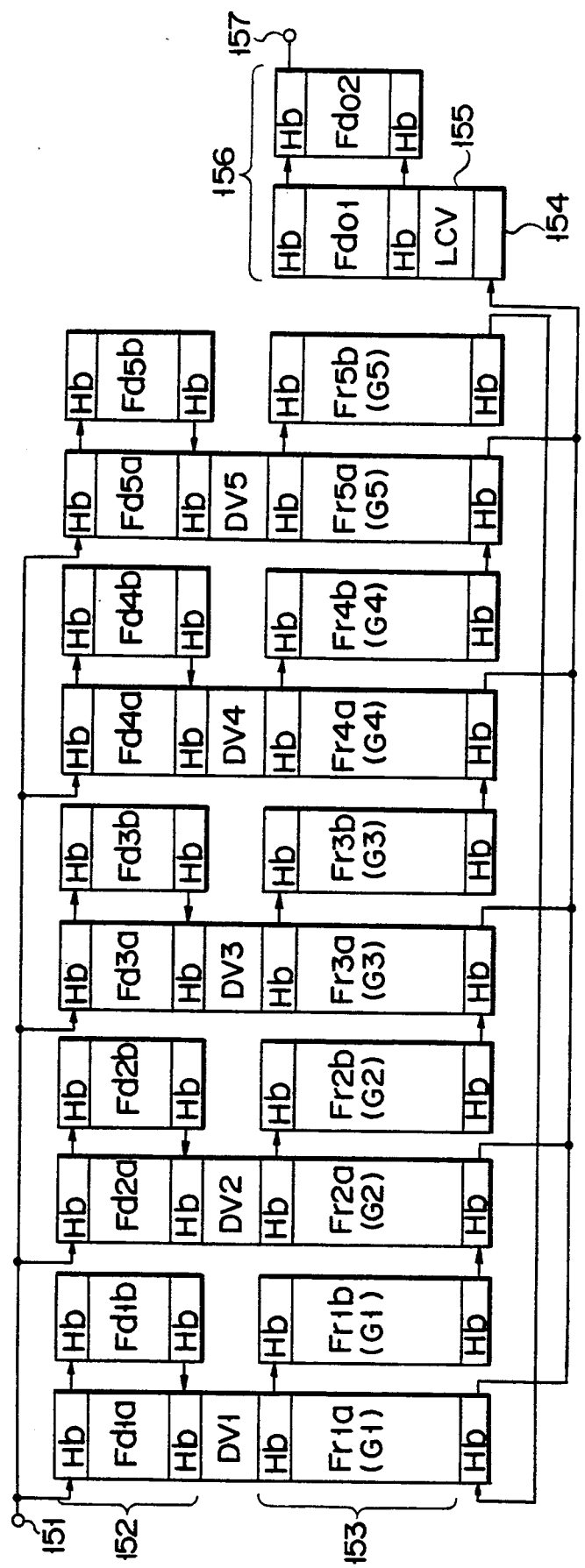
FIG. 40 is a block diagram illustrating the system of FIG. 39 in greater detail.

FIG. 40 is a block diagram illustrating the device of FIG. 39 in greater detail. In FIG. 40, the same numerals denote the same components as those shown in FIG. 39. In this figure, Hb designates horizontal buffers; Fd1a, Fd1b, Fd2a, Fd2b, ... Fd5a and Fd5b are CCD field memories; Fr1a, Fr1b, Fr2a, Fr2b, ... Fr5a and Fr5b are CCD frame memories; and Dv1 to Dv5 are dividers.

The signal output by each pair of field memories (e.g., Fd1a and Fd1b) is input to the divider (e.g., Dv1) connected to the output of one (i.e., Fd1a) of the paired field memories. The divider converts the signal to a frame signal (e.g., the frame signal G1), which is stored in the pair of frame memories (e.g., Fr1a and Fr1b), one of which is connected to the output of the divider. The signals output by the frame memories Fr1a, Fr2a, Fr3a, Fr4a, and Fr5a are supplied to the frame converter 154. The converter 154, which comprises a horizontal buffer and a gain-calculating unit, processes the frame signals G1 to G5 in units of scanning lines, thereby converting the frame signals G1 to G5 to six frame signals M1 to M6. The frame signals M1 to M6 are input to the scanning-line converter 155. The converter 155 divides the energy of the line signals forming the frame signals M1 to M6 and adds the resultant energy components, in the scheme specifically illustrated in FIGS. 7A to 7E, thereby generating new scanning-line signals.

Figures 41A, 41B:
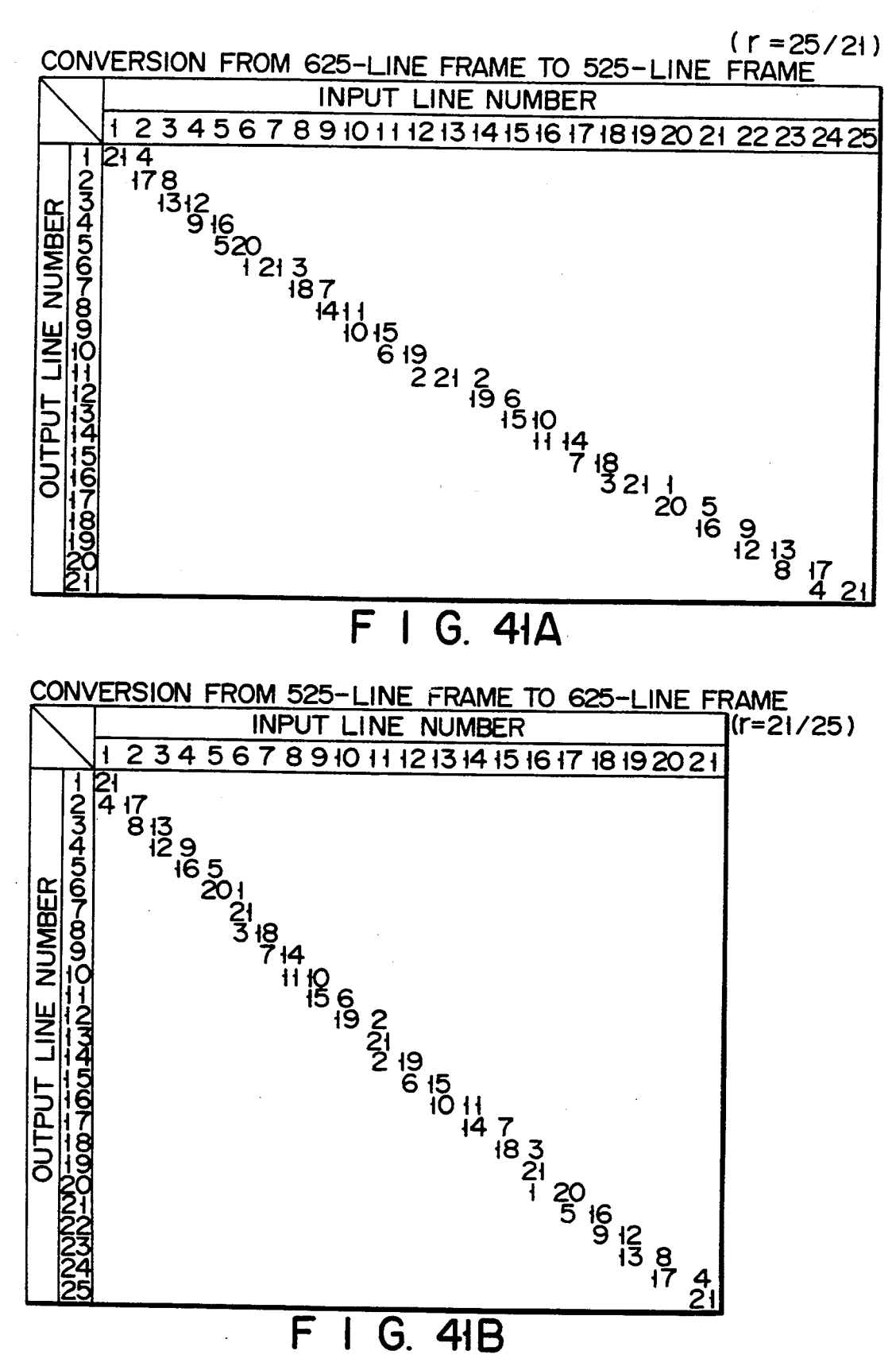

FIGS. 41A and 41B are tables showing the relation between the division coefficients used in the converter 155 and the scanning-line signals output by the converter 155. Plotted on the horizontal axis are the numbers of the scanning line input, and plotted on the vertical axis are the numbers of the scanning lines output.

FIG. 41A shows the division coefficients applied to convert a video signal representing a 625-line frame image to a video signal showing a 525-line frame image. The input line No. 1 has a division coefficient of 21/21 and will be used as part of the output line No. 1. That part of the input line No. 2, which will be used as the remaining part of the output line No. 1, has a division coefficient of 4/21, and the remaining part of the input line No. 2, which will be used as part of the output line No. 2, has a division coefficient of 17/21. Namely, the output line No. 1 is a combination of the input line No. 1 and the first 4/21 part of the input line No. 2.

The input line No. 3 is divided into two parts, i.e., a 8/21 part and a 13/21 part. The 8/21 part is combined with the 17/21 part of the input line No. 2, thus forming the output line No. 2. Then, the input line No. 4 is divided into two parts, i.e., a 12/21 part and a 8/21 part. The 12/21 part is combined with the 13/21 part of the input line No. 3, thus forming the output line No. 3. Further, in a similar manner, any other input line is divided into two parts, and the first part is combined with the second part of the preceding input line, thereby forming an output line.

FIG. 41B shows the division coefficients applied to convert a video signal representing a 525-line frame image to a video signal showing a 625-line frame image.

As has been described in the beginning of the present specification, another object of the invention is to provide a signal-converting device which can be used in home-use video movie cameras, which needs so many addition components and can be manufactured at relatively low cost, and which is small and light.

It is true that all embodiments of the invention, described above, can be made very small by virtue of the advanced semiconductor technology. However, they are devices separate from the other devices built in a video movie camera, such as the CCD image sensor.

According to the present invention, there is also provided a signal-converting device which is formed on the same semiconductor substrate as a CCD image sensor (i.e., a component indispensable to a video movie camera), and is smaller than the devices according to the embodiments described above.

As is known in the art, a CCD image sensor for use in home-use video movie cameras has an imaging device which has an imaging surfaces, a matrix of photoelectric elements, and a CCD. The photoelectric elements converts the optical image formed on the imaging surface into pixel signals. The CCD reads the pixel signals to the signal-processing circuit connected to the output of the CCD image sensor. According to the invention, a signal-converting device is incorporated in the CCD of the CCD image sensor, for electronically zooming the input image at a desired magnification.

Generally, while charge signals are converted into electric signals, various noise signals are added to the resultant electric signals. Hence, the less times the charge signals are converted to electric signals, the better. In the present embodiment, the charge signals are processed by the signal-converting device, before they are converted to electric signals, thereby eliminating one step of converting charge signals to electric signals.

Some other signal-converting devices according to the invention, which are designed for use in CCD image sensors, will be described with reference to FIGS. 42 to 45.

Monochrome TV System

Figure 42:
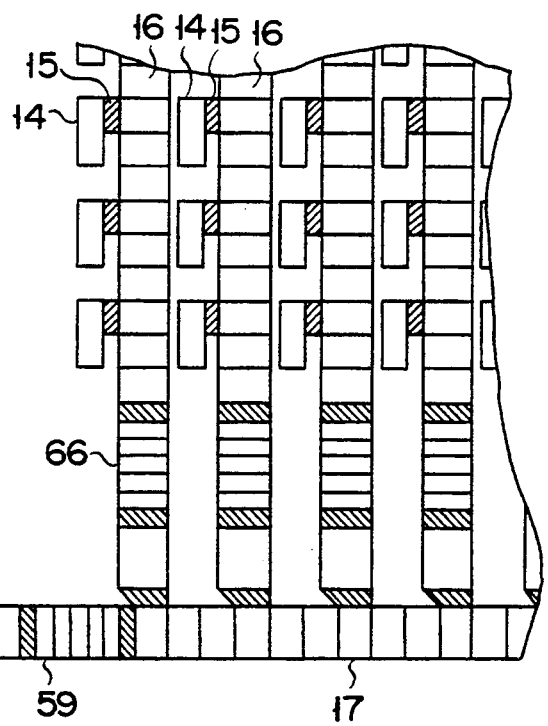

FIG. 42 is a schematic plan view showing a CCD image sensor having a signal-converting device of the present invention. The CCD image sensor is of the so-called "inter-line transfer (IT) type," and is identical to the CCD image sensor illustrated in FIG. 3. As is shown in FIG. 42, the IT type CCD image sensor has an imaging surface, photodiodes 14, transfer gates 15, vertical transfer CCDs 16, a horizontal transfer CCD 17, a voltage converter 18, an output terminal 19, a horizontal operation unit 59, and a vertical operation unit 66. The photodiodes 14 are arranged on the imaging surface in rows and columns. The transfer gates 15 are arranged on the imaging surface, also in rows and columns, and are connected to the photodiodes 14, respectively. The vertical transfer CCDs 16 extend parallel to the columns of transfer gates 16. Each CCD 16 is connected to the transfer gate 16 of the corresponding column. The vertical operation unit 66 is connected between the horizontal transfer CCD 17 and the outputs of the vertical CCDs 16. The horizontal operation unit 59 is connected to the output of the horizontal transfer CCD 17. The voltage converter 18 is connected between the output of the unit 59 and the output terminal 19.

The vertical operation unit 66 is of the type identical to those illustrated in FIGS. 19, 28, 30, 36, and 37. It processes the pixel signals transferred from the transfer gates 15 through the vertical transfer CCDs 16, such that the image represented by these pixel signals is expanded or contracted in the vertical direction. The signals output by the unit 66 are supplied to the horizontal transfer CCD 17. The signals output from the buffer 17 are supplied to the horizontal operation unit 59. The unit 59 processes the input signals, such that the image represented by these signals is expanded or contracted in the horizontal direction. The signals representing the image, thus enlarged or reduced, are input to the voltage converter 18. The converter 18 converts the signals to voltage signals. The voltage signals are output through the output terminal 19.

With the CCD image sensor of FIG. 42 it is possible to achieve interlace scanning, merely by changing the way of reading the signal charges from the photodiodes 14. In order to perform electronic zooming, however, it is necessary to drive the signal-converting device at specific timing and to use drains in order to discharge part of each signal charge as an unnecessary charge.

Figure 43:
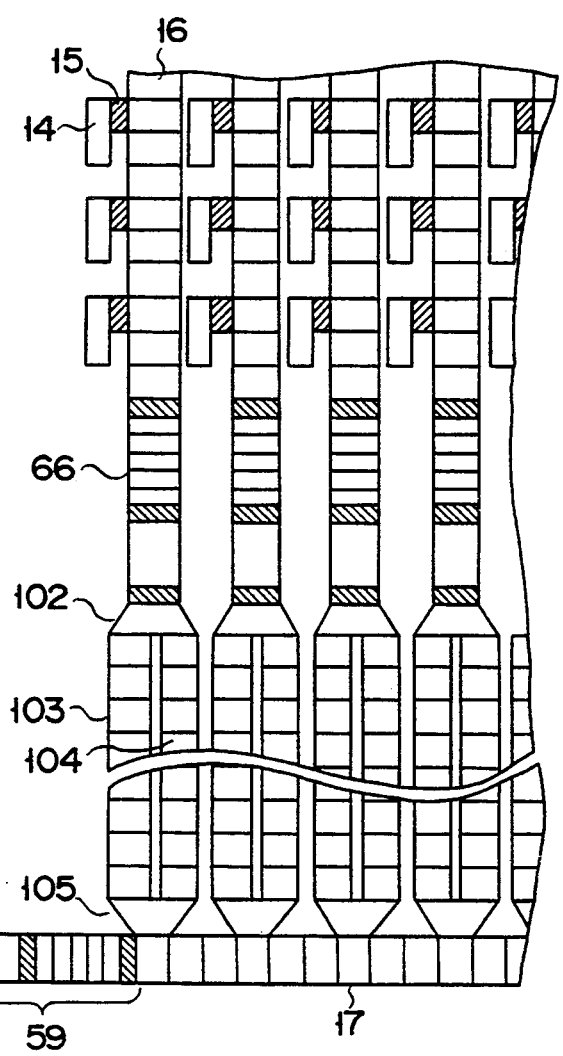

FIG. 43 is a schematic plan view showing a CCD image sensor having a signal-converting device of the present invention. This CCD image sensor is of the so-called "frame inter-line transfer (FIT) type," and has a frame buffer. This sensor can perform interlace scanning even in the case where pixel signals are processed to achieve electronic zooming.

As is evident from FIG. 43, the CCD image sensor comprises a field-switching circuit 102, two field memories 103 and 104, and a line-switching circuit 105—all identical to those illustrated in FIG. 34. The CCD image sensor further comprises photodiodes 14, transfer gates 15, vertical transfer CCDs 16, a vertical operation unit 66, a horizontal buffer 17, a horizontal operation unit 59, a voltage converter 18, and an output terminal 19.

In operation, the signal charges accumulated in photodiodes 14 are simultaneously transferred during the vertical scanning period to vertical CCDs 16 through transfer gates 16. The vertical operation unit 66 processes the signals output by the CCDs 16, such that the image represented by these signals is expanded or contracted in the vertical direction. The field-switching circuit 105 is coupled to the output of the vertical operation unit 66, and the field memories 103 and 104 are connected in parallel to the circuit 105. Hence, the field memory 103 stores the charge signals for the first field of a frame, whereas the field memory 104 stores the charge signals for the second field of the frame. The line-switching circuit 105 connects the outputs of the field memories 103 and 104 to the horizontal transfer CCD 17. The signals output by the CCD 17 are input to the horizontal operation unit 59. The unit 59 processes the input signals, such that the image represented by these signals is expanded or contracted in the horizontal direction. The signals output by the unit 59 are converted into voltage signals by means of the voltage converter 18. The voltage signals, thus obtained, are output through the output terminal 19.

Both CCD image sensors shown in FIGS. 42 and 43, either comprising a signal-converting device of the invention, are designed for use in monochrome TV cameras. Needless to say, the CCD image sensors can be incorporated, without any modification whatever, into three-plate color TV cameras.

Single-Plate Color TV Camera

Today it is absolutely required that home-use video movie cameras be color TV cameras. As a matter of face, however, a three-plate color movie camera having spectroscopic prism is far from practical, in view of its size, its weight, and its manufacturing cost.

FIG. 44 illustrates a color CCD image sensor of single-plate type which has color filters arranged in vertical lines and a signal-converting device according to the present invention.

The signal-outputting system used in the color CCD image sensor is the so-called "stripe structure system" for outputting three color signals. To be more precise, this color CCD image sensor has three filters, i.e., a red (R) filter, a green (G) filter, and a blue (B) filter. Nevertheless, it does not matter at all if other complementary color filters are used.

As is shown in FIG. 44, the color CCD image sensor comprises an imaging surface, photodiodes 14 arranged on the imaging surface in rows and columns, and color filters R, G and B located in front of the photodiodes 14, respectively. The color CCD image sensor further comprises a plurality of vertical transfer CCDs 16, a vertical operation unit 66 connected to the outputs of the CCDs 16, and a field-switching circuit 102 coupled to the output of the unit 66. The circuit 102 distributes the pixel signals forming a first field image to a field memory 103, and the pixel signals forming a second field image to a field memory 104. The signals output by the field memories 103 and 104 are supplied to a line-switching circuit 105. The circuit 105 outputs the signals of the first field image and those of the second field image, alternately in units of scanning lines, to horizontal buffers 17R, 17G and 17B. The signals output by these horizontal buffers 17R, 17G and 17B are input to horizontal operation units 59R, 59G and 59B, respectively. The unit 59R processes the signals output from the buffer 17R, such that the red image represented by these signals is expanded or contracted in the horizontal direction. Similarly, the unit 59G processes the signals output from the buffer 17G, such that the green image represented by these signals is expanded or contracted in the horizontal direction; and unit 59B processes the signals output from the buffer 17B, such that the blue image represented by these signals is expanded or contracted in the horizontal direction. The signals output by the units 59R, 59G and 59B are input to voltage converters 18R, 18G and 18B, respectively. The voltage converter 18R converts the signals output by the unit 59R to voltage signals, which are output through an output terminal 19R. The voltage converter 18R converts the signals output by the unit 59G to voltage signals, which are output through an output terminal 19G. The voltage converter 18B converts the signals output by the unit 59B to voltage signals, which are output through an output terminal 19B.

FIG. 45 is illustrates a color CCD image sensor of single-plate type, which has color filters arranged such that those of each color are arranged in a vertical line and staggered to those of any other color. Indeed, the pixel signals output by the photodiodes 14 covered by the filters of one color must be synchronized the pixel signals output by the photodiodes covered by the filters of any other color. However, this color CCD image sensor can generate signals representing an image whose resolution is twice as high as the image obtained by the color CCD image sensor illustrated in FIG. 44.

As can be understood from FIG. 44, the color CCD image sensor has twice as many green filters as red filters or blue filters. Hence, the signals output by a horizontal operation unit 59G have greater magnitudes than those output by a horizontal operation unit 59R or 59B. This difference in magnitude does not matter, since a voltage converter 18G converts each signal output from the unit 59G into a voltage which is exactly half the voltage of the corresponding signal output from the unit 59R or 59B.

The color CCD image sensor is of the IT type, but can easily be modified into a FIT type, which operates basically in the same way as the IT type. Of the signals transferred to the vertical CCDs 16, R signals and B signals are distributed by a selection circuit (not shown), to the vertical operation unit 66 via the corresponding vertical buffers, respectively. The G signals transferred by the vertical CCDs 16 are input to the vertical operation unit 66 through the corresponding vertical buffers. The R signals, the G signals, and the B signals—all output by the vertical operation unit 66—are input via separators to horizontal operation units 59R, 59G and 59B, respectively. The units 59R, 59G, and 59B processes the R signals, the G signals, and the B signals. The signals output by the units 59R, 59G, and 59B are input to voltage converters 18R, 18G, and 18B, which convert the input signals to voltage signals. The voltage signals output by the converter 18R are output through an output terminal 19R. The voltage signals output by the converter 18G are output through an output terminal 19G. The voltage signals output by the converter 18B are output through an output terminal 19B.

According to the first aspect of the present invention, there is provided a signal-converting device which can convert input signals representing an original image, to new signals representing an enlarged or reduced image. Since the new signals have waveforms similar to those of the input signals, even if the image is enlarged or reduced at a non-integral magnification, the image represented by the new signals is not distorted. Further, since the device has means for compensating for those signals components lost during the conversion, the image enlarged or reduced is similar to the original image. Hence, the signal-converting device is suitable for use in home-use video apparatuses.

According to the second aspect of the present invention, there is provided a signal-converting device which is integrally formed with CCD memories, and hence has neither an A/D converter nor a D/A converter, and which can be made small at relatively low cost.

Further, according to the third aspect of the invention, there is provided a signal-converting device which is incorporated in a CCD image sensor, and which can help to miniaturize home-use video apparatuses having the CCD image sensor.

Moreover, any signal-converting device according to the present invention can convert input signals to new signals having waveforms similar to those of the input signals. Hence, it can be used to process video signals in various ways, thereby to achieve special image effects, such as forming composite images.

What is claimed is:

1. An analog video signal converting device comprising:
   a plurality of input CCD transfer lines having substantially the same structure, said input CCD transfer lines being arranged in parallel with one another on a semiconductor substrate and having transfer stages on which transfer electrodes of substantially the same size are formed, said plurality of input CCD transfer lines being supplied with charges representative of a video signal,
   a plurality of operation CCD transfer lines having substantially the same structure, said operation CCD transfer lines being arranged in parallel with one another on the semiconductor substrate and being connected in series to said plurality of input CCD transfer lines, respectively,
   each of said plurality of operation CCD transfer lines including an input stage, a plurality of dividing stages formed contiguous with the input stage, a separating stage formed contiguous with the plurality of dividing stages, and a mixing stage formed contiguous with the separating stage,
   said dividing stages, said separating stage, and said mixing stage being serially arranged to transfer the charges in one direction,
   said plurality of dividing stages having a plurality of small electrodes which are smaller than the transfer electrodes,
   said separating stage having a separating electrode separating a charge, and
   said mixing stage having a mixing electrode whose size is equal to that of each of the transfer electrodes;
   a plurality of output CCD transfer lines having substantially the same structure, said plurality of output CCD transfer lines being arranged in parallel with one another on the semiconductor substrate and being connected in series to said plurality of operation CCD transfer lines, respectively, and including transfer stages on which transfer electrodes of substantially the same size which are as large as the transfer electrodes of said plurality of input CCD transfer lines are formed;
   drive voltage applying means for applying operation drive voltages in a different sequence from that of drive voltages supplied to the transfer electrodes of said plurality of input CCD transfer lines and said plurality of output CCD transfer lines, said operation drive voltages being applied to the small electrodes of said plurality of operation CCD transfer lines, the separating electrodes, and the mixing electrode;
   a first CCD horizontal buffer supplying charges representing horizontal lines of video information, said CCD horizontal buffer being connected to output sections of said plurality of input CCD transfer lines; and
   a second CCD horizontal buffer receiving charges representing horizontal lines of video information from said plurality of output CCD transfer lines, said second CCD horizontal buffer being connected to output sections of said plurality of output CCD transfer lines.

2. The analog video signal converting device of claim 1, further comprising:
   an operation unit whose structure is substantially the same as that of one of said plurality of operation CCD transfer lines, said operation unit being formed at one of the input sections of the CCD horizontal buffer.

3. The analog video signal converting device of claim 1, wherein said plurality of input CCD transfer lines constitute a frame buffer of video information.

4. The analog video signal converting device according to claim 1, further comprising:
   an operation unit whose structure is substantially the same as that of one of said plurality of operation CCD transfer lines, said operation unit being formed at one of the output sections of said plurality of output CCD transfer lines so as to be continuous with the output sections of the CCD horizontal buffer.

* * * * *